US008063800B2

(12) United States Patent
Schuessler

(10) Patent No.: US 8,063,800 B2
(45) Date of Patent: Nov. 22, 2011

(54) EFFICIENT ENCODING AND DECODING OF MIXED DATA STRINGS IN RFID TAGS AND OTHER MEDIA

(75) Inventor: Frederick Schuessler, Baiting Hollow, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

(21) Appl. No.: 12/740,522

(22) PCT Filed: Oct. 20, 2008

(86) PCT No.: PCT/US2008/080484
§ 371 (c)(1),
(2), (4) Date: Apr. 29, 2010

(87) PCT Pub. No.: WO2009/058600
PCT Pub. Date: May 7, 2009

(65) Prior Publication Data
US 2010/0302078 A1 Dec. 2, 2010

Related U.S. Application Data

(60) Provisional application No. 60/985,180, filed on Nov. 2, 2007, provisional application No. 60/985,593, filed on Nov. 5, 2007.

(51) Int. Cl.
*H03M 7/00* (2006.01)
(52) U.S. Cl. .................... 341/90; 708/683; 348/E5.008; 380/59; 713/179
(58) Field of Classification Search .............. 341/50–95; 380/51–59; 283/72, 73; 708/700, 683; 375/240; 348/E5.008, E7.06, E5.006; 713/176–193
See application file for complete search history.

(56) References Cited

U.S. PATENT DOCUMENTS

| 5,058,144 | A | 10/1991 | Fiala | |
|---|---|---|---|---|
| 6,832,315 | B1 | 12/2004 | Waltham | |
| 6,968,057 | B2 | 11/2005 | Rhoads | |
| 7,089,420 | B1 | 8/2006 | Durst | |
| 7,143,290 | B1 | 11/2006 | Ginter | |
| 7,646,319 | B2 * | 1/2010 | Pang et al. | 341/76 |
| 7,663,513 | B2 * | 2/2010 | Pang et al. | 341/67 |
| 7,671,766 | B2 * | 3/2010 | Pang et al. | 341/50 |
| 7,696,907 | B2 * | 4/2010 | Pang et al. | 341/76 |
| 7,813,380 | B2 * | 10/2010 | Oh et al. | 341/56 |

OTHER PUBLICATIONS

PCT International Search Report Dated Jan. 12, 2009.

\* cited by examiner

*Primary Examiner* — Lam T Mai
(74) *Attorney, Agent, or Firm* — Terri S. Hughes

(57) ABSTRACT

An encoding method comprises generating a character map of an alphanumeric character string, identifying runs of like character type symbols in sequential positions, and removing the runs of character type symbols from the character map. The center for the center infix run is determined, and the characters of each character type are encoded into binary encoded substrings. A decoding method comprises parsing the one or more run fields in the alphanumeric header to determine a number of characters of each type of a plurality of character types represented in the binary encoded string, generating a character map having a string of character type symbols representing the binary encoded string, including determining a reduced character map, centering the character type symbols for a center infix run about the center of the reduced character map, completing a final character map, and decoding each binary encoded string.

18 Claims, 27 Drawing Sheets

EXAMPLE PDF417 BARCODE
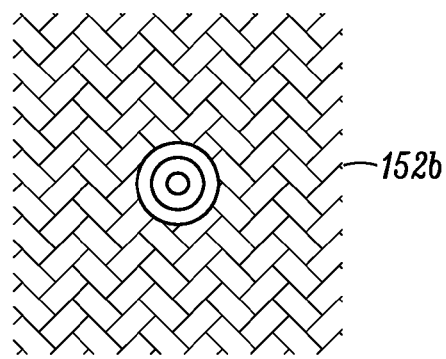
EXAMPLE MAXICODE
EXAMPLE LINEAR BARCODE
*FIG. 3B*

TABLE 1: BASE TABLE OF GS1 APPLICATION IDENTIFIER ID VALUES

| ID VAL | AI OR FUNC | DATA TITLE OR EXPLANATION | FORMAT | ID BITS AND/OR ID DIGITS | FIXED-LENGTH NUMERIC | AUX ID VLEN BITS | VLEN RANGE |
|---|---|---|---|---|---|---|---|
| 0 | N/A | RFA | | | | | |
| 1 | 00 | SSCC | n2+n18 | | 18 | | |
| 2 | 01 | GTIN | n2+n14 | | 14 | | |
| 3 | 02+37 | CONTENT + COUNT | n2+n14+n..8 | | 14 | 3 | 1..8 |
| 4 | 10 | BATCH/ LOT | n2+an..20 | | | | |
| 5 | MULTI | MISC DATES: AIs 11,13,15,8008 | SEE TABLE 2 | | | | |
| 6 | 17 | USE BY/ EXPIRY | n2+n6 | | CUST:DATE | | |
| 7 | MULTI | AUX ID: AIs 20,240,241,242, 250,251,8005,8006 | SEE TABLE 3 | | | | |
| 8 | 21 | SERIAL | n2+an..20 | | | | |
| 9 | 22 | QTY/ DATE/ BATCH | n2+an..29 | | | | |
| 10 | 253 | DOC. ID | n3+n13+n..17 | | 13 | 5 | 0..17 |
| 11 | 30 | VAR. COUNT | n2+n..8 | | | 3 | 1..8 |
| 12 | 3nnn | VARIABLE TRADE ITEM MEASURES | SEE TABLE 4 | | | | |
| 13 | 3nnn | LOGISTICS MEASURES | SEE TABLE 5 | | | | |
| 14 | 39nn | PAYABLE: 390n..393n | SEE TAB 6 | | | | |
| 15 | 400 | ORDER NUMBER | n3+an..30 | | | | |
| 16 | 401 | CONSIGNMENT | n3+an..30 | | | | |
| 17 | 402 | SHIPMENT NO. | n2+n17 | | | 4 | 2..17 |
| 18 | 403 | ROUTE | n3+an..30 | | | | |
| 19 | MULT 410 411 412 413 | QUALIFIED GLNs: 00 SHIP TO LOC 01 BILL TO, 10 PURCH FROM 11 SHIP FOR LOC | n3+n13 | 2 BITS AS SHOWN | 13 | | |
| 20 | 414+ 254 | LOC NO + OPTIONAL EXTENSION | n3+n13 | 1 BIT: '0' IF NO EXT, ELSE '1' | 13 | | |
| 21 | 415+ 12+ 8020 | PAY TO + DUE DATE + REF NO | n3+n13 + n6 +an..25 | 3 BITS, 1 FOR EACH EI (000 INVALID) | 13 + CUST:DATE | | |

TABLE 1(CONTINUED): BASE TABLE OF AI ID VALUES

| ID VAL | AI OR FUNC | DATA TITLE OR EXPLANATION | FORMAT | ID BITS AND/OR ID DIGITS | FIXED-LENGTH NUMERIC | AUX ID VLEN BITS | VLEN RANGE |
|---|---|---|---|---|---|---|---|
| 22 | 420 / 421 | SHIP TO POST (0:420; 1:421) | 0:n3+an..20 / 1:n3+n3+an..9 | 1 BIT | | | |
| 23 | 422 | ORIGIN | n3+n3 | | 3 | | |
| 24 | MULT / 423 / 424 / 425 / 426 | PROCESS COUNTRY 00: INITIAL 01: PROCESS 10: DISASS'Y 11: FULL PROCESS | AS FOLLOWS: n3+n3+n..12 n3+n3 n3+n3 n3+n3 | 2 BITS AS SHOWN TO LEFT | 3 3 3 3 | 4 | 0..12 |
| 25 | 7001 | NSN | n4+n13 | | 13 | | |
| 26 | 7002 | MEAT CUT | n4+an..30 | | | | |
| 27 | 703(S)*** | PROCESSOR | n4+n3+an..27 | 1 DIGIT | 3 | | |
| 28 | 8001 | DIMENSIONS | n4+n14 | | 14 | | |
| 29 | 8002 | CMT NO | n4+an..20 | | | | |
| 30 | 8003 | GRAI | n4+n14+an..16 | | 14 | | |
| 31 | 8004 | GIAI | n4+an..30 | | | | |
| 32 | 8007 | IBAN | n4+an..30 | | | | |
| 33 | 8018 | GSRN | n4+n18 | | 18 | | |
| 34 | 810n | COUPONS | n4+VARIOUS | DIGIT | | 3 | 2..9 |
| 35 | 90-99 | INTERNAL | n2+an..30 | 1 DIGIT | | | |
| 36 | 17/10 | FOR DETAILS, SEE SEPARATE TABLE ENTRIES FOR AI 17 AND AI 10 | | | | | |
| 37 | NON GS1 | SEE TABLE 7 | | 4 BITS | | | |
| 38 | RFA | | | | | | |
| 39 | RFA | | | | | | |
| 40 | RFA | | | | | | |
| 41 | RFA | | | | | | |
| 42 | RFA | | | | | | |
| 43 | RFA | | | | | | |
| 44 | RFA | | | | | | |

TABLE 2: SECONDARY TABLE OF AI "MISCELLANEOUS DATES" (FOR BASE ID 5)

| ID BITS VAL | AI | DATA TITLE | FORMAT | ADD'L ID BITS AND/OR ID DIGITS | FIXED-LENGTH NUMERIC | VLEN BITS | VLEN RANGE |
|---|---|---|---|---|---|---|---|
| 0 | 11 | PROD DATE | n4+n6 | | CUST:DATE | | |
| 1 | 8008 | PROD TIME | n4+n8+n..4 | | 8 | 3 | 0..4 |
| 2 | 13 | PACK DATE | n2+n6 | | CUST:DATE | | |
| 3 | 15 | BEST BEFORE OR SELL BY | n2+n6 | | CUST:DATE | | |

*820*

TABLE 3: SECONDARY TABLE OF AI "AUX ID" VALUES (FOR BASE ID 7)

| ID BITS VAL | AI | DATA TITLE | FORMAT | ADD'L ID BITS AND/OR ID DIGITS | FIXED-LENGTH NUMERIC | VLEN BITS | VLEN RANGE |
|---|---|---|---|---|---|---|---|
| 0 | 20 | VARIANT | n2+n2 | | 2 | | |
| 1 | 240 | ADDITIONAL ID | n3+an..30 | | | | |
| 2 | 241 | CUST. PART NO | n3+an..30 | | | | |
| 3 | 242 | VARIATION NUMBER | n2+n..6 | | | 3 | 1..6 |
| 4 | 250 | SECONDARY SERIAL | n3+an..30 | | | | |
| 5 | 251 | REF. TO SOURCE | n3+an..30 | | | | |
| 6 | 8005 | PRICE/UNIT | n4+n6 | | 6 | | |
| 7 | 8006 | GCTIN | n4+n14+n2+n2 | | 18 | | |

TABLE 4: SECONDARY TABLE OF VARIABLE TRADE ITEM MEASURES (FOR BASE ID 12)

| FIRST 4 ID BITS | AI | DATA TITLE | FORMAT | ADD'L ID BITS | FIXED-LENGTH NUMERIC | VLEN BITS | VLEN RANGE |
|---|---|---|---|---|---|---|---|
| 0 | 310n* | NET WEIGHT (KG) | n4+n6 | 1 DIGIT | 6 | | |
| 1 | 311n | LENGTH (m) | n4+n6 | 1 DIGIT | 6 | | |
| 2 | 312n | WIDTH (m) | n4+n6 | 1 DIGIT | 6 | | |
| 3 | 313n | HEIGHT (m) | n4+n6 | 1 DIGIT | 6 | | |
| 4 | 314n | AREA (m2) | n4+n6 | 1 DIGIT | 6 | | |
| 5 | 315n 316n | NET VOLUME (l) (OR m3 IF 316n) | n4+n6 | 1 BIT + 1 DIGIT | 6 | | |
| 6 | 320n | NET WEIGHT (lb) | n4+n6 | 1 DIGIT | 6 | | |
| 7 | 321n 322n 323n | LENGTH () [2 AUX BITS FOR 1, 2, OR 3] | n4+n6 | 2 BITS AND 1 DIGIT | 6 | | |
| 8 | 324n 325n 326n | WIDTH () [2 AUX BITS FOR 4, 5, OR 6] | n4+n6 | 2 BITS AND 1 DIGIT | 6 | | |
| 9 | 327n 328n 329n | HEIGHT () [2 AUX BITS FOR 7, 8, OR 9] | n4+n6 | 2 BITS AND 1 DIGIT | 6 | | |
| 10 | 337n | KG PER m² | n4+n6 | 1 DIGIT | 6 | | |
| 11 | 350n 351n 352n | AREA () [2 AUX BITS FOR 0, 1, OR 2] | n4+n6 | 2 BITS AND 1 DIGIT | 6 | | |
| 12 | 356n | NET WEIGHT (t) | n4+n6 | 1 DIGIT | 6 | | |
| 13 | 357n | NET VOLUME oz | n4+n6 | 1 DIGIT | 6 | | |
| 14 | 360n 361n | NET VOLUME liq [ONE AUX BIT FOR 0 OR 1] | n4+n6 | 1 BIT AND 1 DIGIT | 6 | | |
| 15 | 364n 365n 366n | NET VOLUME cu [2 AUX BITS FOR 4, 5, OR 6] | n4+n6 | 2 | 6 | | |

TABLE 5: SECONDARY TABLE OF LOGISTICS MEASURES (FOR BASE ID 13)

| FIRST 4 ID BITS | AI | DATA TITLE | FORMAT | ADD'L AUX ID INFO | FIXED-LENGTH NUMERIC | VLEN BITS | VLEN RANGE |
|---|---|---|---|---|---|---|---|
| 0 | 330n | GROSS WEIGHT (KG) | n4+n6 | 1 DIGIT | 6 | | |
| 1 | 331n | LENGTH (m), LOG | n4+n6 | 1 DIGIT | 6 | | |
| 2 | 332n | WIDTH (m), LOG | n4+n6 | 1 DIGIT | 6 | | |
| 3 | 333n | HEIGHT (m), LOG | n4+n6 | 1 DIGIT | 6 | | |
| 4 | 334n | AREA (m2), LOG | n4+n6 | 1 DIGIT | 6 | | |
| 5 | 335n 336n | VOLUME (l), LOG (OR m3 IF 336n) | n4+n6 | 1 BIT + 1 DIGIT | 6 | | |
| 6 | 340n | GROSS WEIGHT | n4+n6 | 1 DIGIT | 6 | | |
| 7 | 341n 342n 343n | LENGTH () [2 AUX BITS $3^{RD}$ DIG OR 1,2, OR 3] | n4+n6 | 2 BITS AND 1 DIGIT | 6 | | |
| 8 | 344n 345n 346n | WIDTH () [2 AUX BITS FOR 4,5, OR 6] | n4+n6 | 2 BITS AND 1 DIGIT | 6 | | |
| 9 | 347n 348n 349n | HEIGHT () [2 AUX BITS FOR 7,8, OR 9] | n4+n6 | 2 BITS AND 1 DIGIT | 6 | | |
| 10 | 353n 354n 355n | AREA (), LOG [2 AUX BITS FOR 3/4/5] | n4+n6 | 2 BITS AND 1 DIGIT | 6 | | |
| 11 | 362n 363n | NET VOL LOG, liq [1 AUX BIT FOR 2/3] | n4+n6 | 1 BIT + 1 DIGIT | 6 | | |
| 12 | 367n 368n 369n | VOLUME LOG, cu [2 AUX BITS FOR 7,8, OR 9] | n4+n6 | 2 | 6 | | |
| 13 | MULTI | COMBINATIONS OF LENGTH, WIDTH, AND/OR HEIGHT[1] | SEE NOTE BELOW | | | | |
| 14 | MULTI | COMBINATIONS OF L+W+H, METRIC | SEE NOTE BELOW | | | | |
| 15 | RFU | | | | | | |

NOTE 1: AFTER INITIAL 4 ID BITS, 2 BITS FOLLOW, 00..11 INDICATE L+W, L+H, W+H, OR L+W+H

*FIG. 8E*

TABLE 6: SECONDARY TABLE OF AMOUNTS PAYABLE (FOR BASE ID 17)

| ID BITS VAL | AI | DATA TITLE | FORMAT | ADD'L ID BITS AND/OR ID DIGITS | FIXED-LENGTH NUMERIC | VLEN BITS | VLEN RANGE |
|---|---|---|---|---|---|---|---|
| 4 | 390(n) | AMOUNT | n4+n..15 | 1 DIGIT | | 4 | 0..15 |
| 5 | 391(n) | AMOUNT | n4+n3+n..15 | 1 DIGIT | 3 | 4 | 0..15 |
| 6 | 392(n) | PRICE | n4+n..15 | 1 DIGIT | | 4 | 0..15 |
| 7 | 393(n) | PRICE | n4+n3+n..15 | 1 DIGIT | 3 | 4 | 0..15 |

_860_

TABLE 7: SECONDARY TABLE OF NON-GS1 IDENTIFIERS (FOR BASE ID 37)

| ID BITS VAL | DATA SYSTEM NAME | DATA FORMAT 15961 | DATA FORMAT 15434 | ID STRING | ID STRING FORMAT | ADD'L ID BITS AND/OR ID DIGITS | FIXED-LENGTH NUMERIC | VLEN BITS | VLEN RANGE |
|---|---|---|---|---|---|---|---|---|---|
| 0 | D.I.s | 10 | 5 | P+V+IT | DI (A,nA, nnA, nnnA) | 1 DIGIT | | | |
| 1 | D.I.s | 10 | 5 | 25S | DI | 1 DIGIT | | | |
| 2 | TEIs | TBD | 12 | "MFR" + SER/ UCN | TEI (AAAsp) | 1 BIT: 0= "SER" 1= "SER" | | | |
| 3 | | | | | | | | | |
| 4 | | | | | | | | | |
| 5 | | | | | | | | | |
| 6 | | | | | | | | | |
| 7 | | | | | | | | | |
| 8 | | | | | | | | | |
| 9 | | | | | | | | | |
| 10 | | | | | | | | | |
| 11 | | | | | | | | | |
| 12 | | | | | | | | | |
| 13 | | | | | | | | | |
| 14 | TEXT | N/A | 7 | N/A | N/A | | | | |
| 15 | BINARY | N/A | 9 | N/A | N/A | | | | |

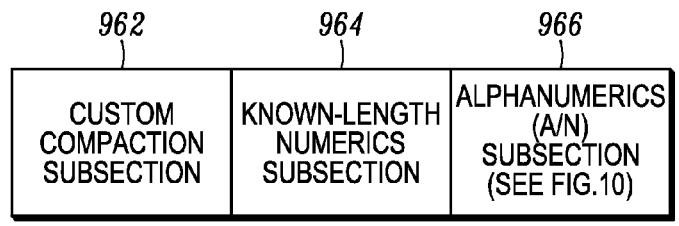

FIG. 9

TABLE B-1: BASE 30 CHARACTER SET

| VALUE | BASIC SET | | SHIFT 1 SET | | SHIFT 2 SET | | SHIFT 3 SET | |
|---|---|---|---|---|---|---|---|---|
| | CHAR | DECIMAL | CHAR | DECIMAL | CHAR | DECIMAL | CHAR | DECIMAL |
| 0 | SPACE | 32 | NUL | 0 | ! | 33 | ' | 96 |
| 1 | A | 65 | SOH | 1 | " | 34 | a | 97 |
| 2 | B | 66 | STX | 2 | # | 35 | b | 98 |
| 3 | C | 67 | ETX | 3 | $ | 36 | c | 99 |
| 4 | D | 68 | EOT | 4 | % | 37 | d | 100 |
| 5 | E | 69 | ENQ | 5 | & | 38 | e | 101 |
| 6 | F | 70 | ACK | 6 | ' | 39 | f | 102 |
| 7 | G | 71 | BEL | 7 | ( | 40 | g | 103 |
| 8 | H | 72 | BS | 8 | ) | 41 | h | 104 |
| 9 | I | 73 | HT | 9 | * | 42 | i | 105 |
| 10 | J | 74 | LF | 10 | + | 43 | j | 106 |
| 11 | K | 75 | VT | 11 | , | 44 | k | 107 |
| 12 | L | 76 | FF | 12 | - | 45 | l | 108 |
| 13 | M | 77 | CR | 13 | . | 46 | m | 109 |
| 14 | N | 78 | SO | 14 | / | 47 | n | 110 |
| 15 | O | 79 | SI | 15 | : | 58 | o | 111 |
| 16 | P | 80 | DLE | 16 | ; | 59 | p | 112 |
| 17 | Q | 81 | DC1 | 17 | < | 60 | q | 113 |
| 18 | R | 82 | DC2 | 18 | = | 61 | r | 114 |
| 19 | S | 83 | DC3 | 19 | > | 62 | s | 115 |
| 20 | T | 84 | DC4 | 20 | ? | 63 | t | 116 |
| 21 | U | 85 | NAK | 21 | @ | 64 | u | 117 |
| 22 | V | 86 | SYN | 22 | [ | 91 | v | 118 |
| 23 | W | 87 | ETB | 23 | \ | 92 | w | 119 |
| 24 | X | 88 | CAN | 24 | ] | 93 | x | 120 |
| 25 | Y | 89 | EM | 25 | ^ | 94 | y | 121 |
| 26 | Z | 90 | SUB | 26 | _ | 95 | z | 122 |
| 27 | SHIFT 1 | N/A | ESC | 27 | RS | 30 | { | 123 |
| 28 | SHIFT 2 | N/A | FS | 28 | US | 31 | | | 124 |
| 29 | SHIFT 3 | N/A | GS | 29 | ~ | 126 | } | 125 |

TABLE B-2: BASE 13 CHARACTER SET

| VALUE | BASIC SET | | SHIFT 1 SET | | SHIFT 2 SET | | SHIFT 3 SET | |
|---|---|---|---|---|---|---|---|---|
| | CHAR | DECIMAL | CHAR | DECIMAL | CHAR | DECIMAL | CHAR | DECIMAL |
| 0 | 0 | 48 | A | 65 | N | 78 | SPACE | 32 |
| 1 | 1 | 49 | B | 66 | O | 79 | $ | 36 |
| 2 | 2 | 50 | C | 67 | P | 80 | % | 37 |
| 3 | 3 | 51 | D | 68 | Q | 81 | & | 38 |
| 4 | 4 | 52 | E | 69 | R | 82 | * | 42 |
| 5 | 5 | 53 | F | 70 | S | 83 | + | 43 |
| 6 | 6 | 54 | G | 71 | T | 84 | , | 44 |
| 7 | 7 | 55 | H | 72 | U | 85 | - | 45 |
| 8 | 8 | 56 | I | 73 | V | 86 | . | 46 |
| 9 | 9 | 57 | J | 74 | W | 87 | / | 47 |
| 10 | SHIFT 1 | N/A | K | 75 | X | 88 | ? | 63 |
| 11 | SHIFT 2 | N/A | L | 76 | Y | 89 | _ | 95 |
| 12 | SHIFT 3 | N/A | M | 77 | Z | 90 | <GS> | 29 |

CHART B-1: REQUIRED NUMBER OF BITS FOR A GIVEN NUMBER OF BASE 'N' VALUES

/* BASE10 ENCODING ACCEPTS UP TO 60 INPUT VALUES PER GROUP: */ STATIC CONST UNSIGNED CHAR BITSFORNUMBASE10[ ] = {
/* 0 - 9 */     0,   4,   7,  10,  14,  17,  20,  24,  27,  30,
/* 10 - 19 */  34,  37,  40,  44,  47,  50,  54,  57,  60,  64,
/* 20 - 29 */  67,  70,  74,  77,  80,  84,  87,  90,  94,  97,
/* 30 - 39 */ 100, 103, 107, 110, 113, 117, 120, 123, 127, 130,
/* 40 - 49 */ 133, 137, 140, 143, 147, 150, 153, 157, 160, 163,
/* 50 - 59 */ 167, 170, 173, 177, 180, 183, 187, 190, 193, 196,
/* 60 - 60 */ 200  };

/* BASE13 ENCODING ACCEPTS UP TO 54 INPUT VALUES PER GROUP: */ STATIC CONST UNSIGNED CHAR BITSFORNUMBASE13[ ] = {
/* 0 - 9 */     0,   4,   8,  12,  15,  19,  23,  26,  30,  34,
/* 10 - 19 */  38,  41,  45,  49,  52,  56,  60,  63,  67,  71,
/* 20 - 29 */  75,  78,  82,  86,  89,  93,  97, 100, 104, 108,
/* 30 - 39 */ 112, 115, 119, 123, 126, 130, 134, 137, 141, 145,
/* 40 - 49 */ 149, 152, 156, 160, 163, 167, 171, 174, 178, 182,
/* 50 - 54 */ 186, 189, 193, 197, 200  };

/* BASE30 ENCODING ACCEPTS UP TO 39 INPUT VALUES PER GROUP: */ STATIC CONST UNSIGNED CHAR BITSFORNUMBASE30[ ] = {
/* 0 - 9 */     0,   5,  10,  15,  20,  25,  30,  35,  40,  45,
/* 10 - 19 */  50,  54,  59,  64,  69,  74,  79,  84,  89,  94,
/* 20 - 29 */  99, 104, 108, 113, 118, 123, 128, 133, 138, 143,
/* 30 - 39 */ 148, 153, 158, 162, 167, 172, 177, 182, 187, 192  };

/* BASE40 ENCODING ACCEPTS UP TO 37 INPUT VALUES PER GROUP: */ STATIC CONST UNSIGNED CHAR BITSFORNUMBASE40[ ] = {
/* 0 - 9 */     0,   6,  11,  16,  22,  27,  32,  38,  43,  48,
/* 10 - 19 */  54,  59,  64,  70,  75,  80,  86,  91,  96, 102,
/* 20 - 29 */ 107, 112, 118, 123, 128, 134, 139, 144, 150, 155,
/* 30 - 37 */ 160, 165, 171, 176, 181, 187, 192, 197  };

/* BASE74 ENCODING ACCEPTS UP TO 32 INPUT VALUES PER GROUP: */ STATIC CONST UNSIGNED CHAR BITSFORNUMBASE74[ ] = {
/* 0 - 9 */     0,   7,  13,  19,  25,  32,  38,  44,  50,  56,
/* 10 - 19 */  63,  69,  75,  81,  87,  94, 100, 106, 112, 118,
/* 20 - 29 */ 125, 131, 137, 143, 150, 156, 162, 168, 174, 181,
/* 30 - 32 */ 187, 193, 199  };

/* BASE84 ENCODING ACCEPTS UP TO 31 INPUT VALUES PER GROUP: */ STATIC CONST UNSIGNED CHAR BITSFORNUMBASE84[ ] = {
/* 0 - 9 */     0,   7,  13,  20,  26,  32,  39,  45,  52,  58,
/* 10 - 19 */  64,  71,  77,  84,  90,  96, 103, 109, 116, 122,
/* 20 - 29 */ 128, 135, 141, 148, 154, 160, 167, 173, 179, 186,
/* 30 - 31 */ 192, 199  };

/* BASE118 ENCODING ACCEPTS UP TO 29 INPUT VALUES PER GROUP: */ STATIC CONST UNSIGNED CHAR BITSFORNUMBASE118[ ] = {
/* 0 - 9 */     0,   7,  14,  21,  28,  35,  42,  49,  56,  62,
/* 10 - 19 */  69,  76,  83,  90,  97, 104, 111, 118, 124, 131,
/* 20 - 29 */ 138, 145, 152, 159, 166, 173, 179, 186, 193, 200  };

TABLE A-1: TABLE OF DEFINED ID VALUE SIZES

| ID SIZE BIT PATTERN | MAXIMUM NUMBER OF TABLE ENTRIES | NUMBER OF BITS PER SINGLE OF TRAILING ID VALUE, AND HOW ENCODED | NUMBER OF BITS PER PAIR OF ID VALUES, AND HOW ENCODED |
|---|---|---|---|
| 000 | UP TO 16 | 4, AS 1 BASE 16 VALUE | 8, AS 2 BASE 16 VALUES |
| 001 | UP TO 22 | 5, AS 1 BASE 22 VALUE | 9, AS 2 BASE 22 VALUES |
| 010 | UP TO 32 | 5, AS 1 BASE 32 VALUE | 10, AS 2 BASE 32 VALUES |
| 011 | UP TO 45 | 6, AS 1 BASE 45 VALUE | 11, AS 2 BASE 45 VALUES |
| 100 | UP TO 64 | 6, AS 1 BASE 64 VALUE | 12, AS 2 BASE 64 VALUES |
| 101 | UP TO 90 | 7, AS 1 BASE 90 VALUE | 13, AS 2 BASE 90 VALUES |
| 110 | UP TO 128 | 7, AS 1 BASE 128 VALUE | 14, AS 2 BASE 128 VALUES |
| 1110 | UP TO 256 | 8, AS 1 BASE 256 VALUE | 16, AS 2 BASE 256 VALUES |
| 1111bb | UP TO $2^n$ ENTRIES, WHERE "bb" DENOTES 'n' IN THE RANGE OF 9..12 | n, AS 1 BASE $2^n$ VALUE | 2n, AS 2 BASE $2^n$ VALUES |

TABLE A-2: ID ENCODING METHODS

| METHOD | BIT PATTERN | SUMMARY |
|---|---|---|
| A/N | 00 | CAN ENCODE ANY PRINTABLE-ASCII ID STRINGS |
| ALPHA | 01 | ENCODES FIXED AND VARIABLE-LENGTH ALPHA ID STRINGS (E.G., TEIs) |
| NUMALPHA | 10 | ENCODES 0, 1, 2 OR 3-DIGIT ID STRINGS TERMINATING WITH A LETTER (E.G., DIs) |
| VARNUMERIC | 11 | ENCODES VARIABLE-LENGTH ALL-NUMERIC ID STRINGS (SUCH AS GS1 APPLICATION IDENTIFIERS) |

EFFICIENT ENCODING AND DECODING OF MIXED DATA STRINGS IN RFID TAGS AND OTHER MEDIA

CROSS REFERENCE TO RELATED APPLICATIONS

This application is a National Stage filing under 35 USC §371 of co-pending Patent Cooperation Treaty international application having Serial No. PCT/US08/80484 (the "PCT international application") filed on Oct. 20, 2008, having Publication No. WO2009/058600. This application claims priority to the PCT international application, which is assigned to Symbol Technologies, Inc.

This application claims benefit of U.S. Provisional Application No. 60/985,180, entitled "Systems And Methods For Efficient Encoding And Decoding Of Mixed Data Strings In RFID Tags And Other Media," filed Nov. 2, 2007, and U.S. Provisional Application No. 60/985,593, entitled "Systems And Methods For Efficient Encoding And Decoding Of Mixed Data Strings In RFID Tags And Other Media," filed Nov. 5, 2007, both of which are incorporated by reference herein in their entireties.

FIELD OF THE INVENTION

The invention relates generally to encoding and decoding of data, and in particular, the encoding and decoding of user in RFID tags and optical media.

BACKGROUND OF THE INVENTION 1.0 Radio Frequency Identification (RFID) Tags

Radio frequency identification (RFID) tags are electronic devices that may be affixed to items whose presence is to be detected and/or monitored. A variety of tag classes have been defined by national and international standards bodies (e.g., EPCGlobal and ISO). The tag classes include Class 0, Class 1, and Class 1 Generation 2 ("Gen 2"). The presence of an RFID tag, and therefore the presence of the item to which the tag is affixed, may be checked and monitored wirelessly by devices known as "readers." Readers typically have one or more antennas transmitting radio frequency signals to which tags respond. Because the reader "interrogates" RFID tags, and receives signals back from the tags in response to the interrogation, the reader is sometimes termed as "reader interrogator" or simply "interrogator."

With the maturation of RFID technology, efficient communication between tags and interrogators has become a key enabler in supply chain management, especially in manufacturing, shipping, and retail industries, as well as in building security installations, healthcare facilities, libraries, airports, warehouses etc.

In addition, tags include limited amounts of memory for encoding user data. Existing standard data formats (e.g., as specified by ISO/IEC 15961 and 15962) do not offer good compaction efficiency, nor do they offer fast random access to a desired data element. In addition, Gen 2 standards limit the data systems which can be used to label data items. This limits the ability of users of Gen 2 tags to encode data items. Some users may desire to use GS1 Application Identifiers (AIs), whereas others may want to use Data Identifiers (DIs), and others may want to intermix the two. Furthermore, the Gen 2 air interface protocol does not provide a good mechanism for accessing a variable amount of memory, without requiring multiple operations of the same tag. In current Gen 2 implementations, the only options are (1) read the entire memory bank, which may entail reading a very large number of useless '0' bits thus slowing down the process for reading a population of tags, or (2) read a selected number of memory words. The problem with alternative (2) is that if too many words are requested, the tag returns an error code with no indication of how many words were actually available.

2.0 Optical Media

Optical media such as bar codes are machine readable representations of information, often dark ink on a light background that creates high and low reflectance which can be converted to a digital format. Barcodes may represent or encode data by the widths and spacings of printed parallel lines, patterns of dots, concentric circles, and text codes hidden within images. Barcodes are often read by optical scanners called barcode readers or scanned from an image by special software.

Barcodes are widely used to implement Auto ID Data Capture (AIDC) systems that improve the speed and accuracy of computer data entry. Barcodes are typically extremely accurate and inexpensive. However, the amount and type of data that can be encoded in a bar code is limited.

The drive to encode more information in combination with the space requirements of simple barcodes led to the development advanced bar codes such as stacked barcodes and 2D barcodes. For example, matrix codes, a type of 2D barcode, do not consist of bars but rather a grid of square cells. Stacked barcodes are a compromise between true 2D barcodes and linear codes (also known as 1D barcodes), and are formed by taking a traditional linear symbology and placing it in an envelope that allows multiple rows.

3.0 Optimizing Data Encodation

Many media, such as high capacity optical media (such as 2D bar codes) and RFID tags (such as EPCglobal Gen 2 tags), share a need for optimizing the encodation of the data sets typically used in AIDC applications.

For example, existing standard RFID formats (e.g., ISO/EIC 15961 and 15962) and barcode encodation methods (e.g., Data Matrix, ISO/IEC 16022) do not offer good compaction efficiency or fast random access to a desired data element. In optical-media applications, available "real estate" for the optical mark is usually the motivating factor for improving encoding efficiency. In the case of RFID applications, on the other hand, there are two prime motivators: the need to fit the data within a fixed and limited amount of Read/Write memory on a particular tag, and the need to minimize the number of data bits that must be transferred over the relatively-slow air interface.

A particularly-important metric for evaluating encoding schemes for AIDC applications is the worst-case number of bits needed to encode data fitting specific application rules and typical usage. For example, two of the most common AIDC data sets are a GS1 Lot Number (Application Identifier 10) and a GS1 Serial Number (A.I. 21). Both of these are defined to use up to 20 Alphanumeric characters from the 82-member character set defined in ISO/IEC 646. However, in actual use, most applications define their Lot and Serial Numbers to contain only digits and capital letters. Therefore, optimized AIDC encoding methods need to address both the absolute worst case (a 20-character data string using full ISO/IEC character set), and the typical worst case (a 20-character string using only digits and capital letters).

Until recently, the available encodation schemes were far from optimal for real-world AIDC data, especially for the typical worst case scenario. To address this need to minimize the number of encoded bits, a multi-base encodation scheme was developed. For example, see the detailed discussion of Packed Objects in U.S. Pat. No. 6,196,466, filed Jun. 9, 1999, entitled "Data Compression Method Using Multiple Base Number Systems" (hereinafter the '466 patent); U.S. patent application Ser. No. 11/806,050, filed May 29, 2007, entitled "Data Format for Efficient Encoding and Access of Multiple Data Items in RFID Tags" (hereinafter the '050 application); and U.S. patent application Ser. No. 11/806,053, filed May 29, 2007, entitled "Data Format for Efficient Encoding and Access of Multiple Data Items in RFID Tags" (hereinafter the '053 application), each of which are incorporated by reference herein in its entirety.

To further address the need to minimize the number of bits to be transmitted over an interface, multi-base encodation within an overall encoding format and structure can be used to provide many encodation efficiencies for known-numeric data (such as for GS1's A.I. 00) and additional transmission efficiencies. Examples of these techniques are described in the '050 and the '053 applications.

Packed Objects are one of the techniques to improve the efficiency of encoding, transmission and decoding. Packed Objects, as described in the above references, allow a receiving system to examine only the initial bits of a set of encoded data items to determine whether a data set of interest is present instead of reading all the bits in search of the data item. Thus, when reading large numbers of tags (some without the data item of interest) in search of a data item, the average number of transmitted bits is reduced.

The encoding efficiency of a AlphaNumeric (A/N) section of a Packed Object, based on multi-base encoding is provides significant improvements over traditional AIDC encoding methods for their worst-case scenario, which is a random mix of letters and numbers. These traditional methods classify input characters into a number of subsets (such as for digits and for uppercase letters), where these subsets need to include numerous "switches" and "latches" to alternate subsets, which reduces encoding efficiency in two ways. First, these non-data switches and latches increase the number of members needed in each subset (which increases the number of information bits needed to represent the data characters of the sub, thus reduces the encoding efficiency of the subset). Second, these traditional switches and latches require the same number of encoded bits as do the data characters of the starting subset, thus, for example, it costs five bits to latch out of a five-bit subset (for letters) to a four-bit subset (for digits), and another four bits to latch back from digits to letters.

Further, traditional AIDC methods define one or more sets of fixed-size output patterns, which in the case of optical media, use an integral number of bars and spaces, or in the case of bitstream-encoded media such as RFID tags, use an integral number of bits for each defined output character or defined grouping of two or three output characters. Since each output pattern, character, or group represents a non-integral number of abstract information bits, efficiency is reduced by integral representations of the data. For example, each digit of a set of decimal (base 10) digits represents 3.3219 (ln 10/ln 2) bits of information. When conveying decimal digits in a four-bit output grouping, for example, only 83 percent efficiency is achieved.

Multi-base encoding is not restricted to integral numbers of output bits, and does not rely on encoding switches and latches in order to mix digits and letters. Therefore the worst-case encoding efficiency of multi-base encoding is superior to traditional AIDC methods.

"Code 5" encoding is currently an active proposal in the AIDC community. It defines output character sets of 4, 5, 6, 7, and 8 bits, plus predefined output groupings such as 3 digits in 10 bits, and each set contains numerous switches and latches to the other Code 5 set.

Because of the high cost of traditional switches and latches, the most efficient way to encode mixed letters and digits in Code 5 (such as the data string "A12B34C56") is to use Code 5's six-bit code set for the entire string. Including four bits of overhead to latch into the six-bit code set, plus six bits to individually represent each of the nine data characters, this string requires a total of 58 bits to encode in Code 5 (averaging 6.44 bits per character). In contrast, the A/N encoding used in the Packed Objects specification requires only 48 bits (averaging 5.33 bits per character): four bits of overhead to define the particular characteristics of this instance of multi-base encoding, a 9 bit character map (e.g., "100100100") where each '1' or '0' indicates the positions of an individual letter or digit (respectively) within the data string, 20 bits to encode the six digits of the string (converted to a single base 256 value), and 15 bits to encode the three uppercase letters of the string (converted to a single base 256 value).

In general, the worst-case mixes of digits and uppercase letters in Code 5 all require an incremental cost (i.e., the average cost to encode another character) of 6.0 bits per character, excluding start-up overhead, which becomes less significant for longer source messages. Using multi-base encoding, the worst case mixes of digits and uppercase letters require only 5.11 bits per character, excluding start-up overhead.

Worst-case metrics are of particular importance to users because they answer the question of whether a user's data sets will always fit in the available storage (e.g., in a bar code format or the RFID memory). The metrics for average encodation efficiency are also of interest. Accepted industry statistics for the distributions of alphanumeric string contents (the typical mix and sequence of letters and digits) do not exist, however, so one currently cannot predict true "average" performance of an AIDC encodation method in the field.

For some particular mixes and sequences of messages, pure multi-base encoding may be less efficient than traditional methods, unless the multi-base encoding is augmented with additional techniques. An all-numeric message will have an incremental cost of 4.32 bits per character under multi-base encoding versus four bits for a method that can latch to a four-bit character set. For example, the Packed Objects structure allows many important data fields known in advance to be all-numeric to be encoded without a character map, thus achieving an incremental cost of only 3.32 bits per character—the optimal encoding for digits according to information theory.

Also, the header structure for the A/N section in a Packed Objects allows optional definition of a Prefix, Suffix, or Infix, in which the character map can be omitted for long substrings of characters from the same numeric base. Instead of encoding that portion of the character map, that portion (of all '0's or all '1's) is run-length encoded. Note that unlike traditional run-length encoding schemes, which provide a compacted representation of a string of identical data characters, or classes of data bit patterns, the run length in a Packed Object provides a compacted representation of the character map, not of the data content. Also, the Prefix/Suffix/Infix mechanism is different from and superior to traditional latching and shifting mechanisms.

Latches and shifts need to be a defined part of the current character set in order to be invoked from that set. Consequently, the shift/latch facility adds to the size of each character set, and therefore reduces the encoding efficiency of every character set in the scheme, even if never invoked for a given data set. In contrast, the Prefix/Infix/Suffix mechanism is defined outside of the character sets and is not encoded as part of any character set, and thus has no negative incremental efficiency penalty unless invoked.

Although such additional techniques do provide significant additional encoding efficiencies, the Prefix/Infix/Suffix mechanism used in Packed Objects is somewhat limited in the percentage of data mixes in which it is most useful. For example, if the first four characters of a data string include both letters and digits, then a Prefix cannot be used. As another example, the Infix mechanism includes a pointer to the starting position of the Infix within the data stream, which costs several additional overhead bits. Thus, the Infix mechanism is most beneficial when the data has particularly long runs of the same base. Finally, because Prefix/Infix/Suffix must contain either only digits or only non-digits, many data strings cannot use the Prefix and/or Suffix at all (because the string starts and/or ends with mixed characters), and the length of the allowable Prefix, Suffix, or Infix rarely constitutes a significant percentage of a large message due to the odds that at least one character would occur that would interrupt the single-base run.

Thus, what is needed is a system and method for encoding A/N and other mixed data strings when data strings contain substrings that are primarily, but not exclusively, from a single character class. Further, what is needed is an enhanced Prefix/Infix/Suffix mechanism to better handle mixed data sets and longer data sets. Moreover, what is needed are new methods and systems to flexibly mix ID tables of different sizes for different data systems in Packed Objects to help maintain backward compatibility.

BRIEF SUMMARY OF THE INVENTION

An encoding method comprises generating a character map of an alphanumeric character string, identifying runs of like character type symbols in sequential positions, and removing the runs of character type symbols from the character map. The center for the center infix run is determined, and the characters of each character type are encoded into binary encoded substrings. A decoding method comprises parsing the one or more run fields in the alphanumeric header to determine a number of characters of each type of a plurality of character types represented in the binary encoded string, generating a character map having a string of character type symbols representing the binary encoded string, including determining a reduced character map, centering the character type symbols for a center infix run about the center of the reduced character map, completing a final character map, and decoding each binary encoded string.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 3B shows exemplary barcodes.

FIGS. 8A-8F depicts a series of example ID tables according to embodiments of the present invention.

FIG. 9 depicts an exemplary data section according to embodiments of the present invention.

FIG. 11 illustrates an example Base 30 character set according to embodiments of the present invention.

FIG. 12 illustrates an example Base 13 character set according to embodiments of the present invention.

FIG. 13 depicts the number of bits required to encode various Base 10, Base 13, Base 30, Base 40, Base 74, Base 84, and Base 118 characters according to embodiments of the present invention.

FIG. 14A depicts an example table of defined ID Value sizes according to embodiments of the present invention.

FIG. 14B depicts an example table of ID encoding methods according to embodiments of the present invention.

Figure 1A:
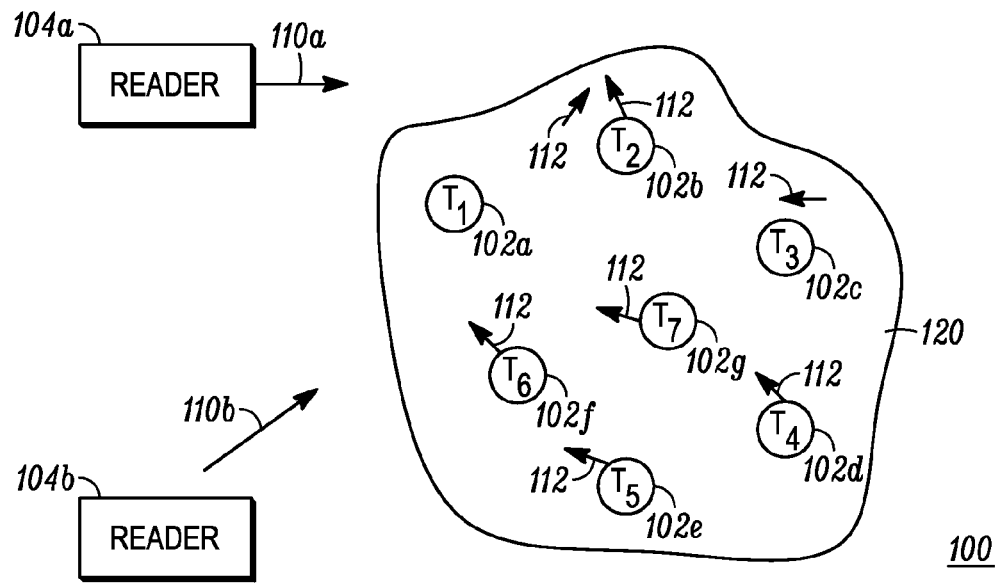
FIG. 1A shows an example environment where RFID readers communicate with an exemplary population of RFID tags.

The present invention will now be described with reference to the accompanying drawings. In the drawings, like reference numbers may indicate identical or similar elements. Additionally, the left-most digit(s) of a reference number may identify the drawing in which the reference number first appears.

DETAILED DESCRIPTION OF THE INVENTION 1.0 Exemplary Operating Environments

The methods and systems described herein are applicable multiple media, including optical (e.g., barcode) and RFID implementations. For brevity, the examples herein concentrate on RFID applications.

Before describing embodiments of the present invention in detail, it is helpful to describe example barcode and RFID communications environments in which the invention may be implemented. FIG. 1A illustrates an environment 100 where RFID tag readers 104 (also referred to as "interrogators")

communicate with an exemplary population 120 of RFID tags 102. As shown in FIG. 1A, the population 120 of tags includes seven tags 102a-102g. A population 120 may include any number of tags 102.

Environment 100 includes any number of one or more readers 104. For example, environment 100 includes a first reader 104a and a second reader 104b. Readers 104a and/or 104b may be requested by an external application to address the population of tags 120. Alternatively, reader 104a and/or reader 104b may have internal logic that initiates communication, or may have a trigger mechanism that an operator of a reader 104 uses to initiate communication. Readers 104a and 104b may also communicate with each other in a reader network.

As shown in FIG. 1A, reader 104a transmits an interrogation signal 110a having a carrier frequency to the population of tags 120. Reader 104b transmits an interrogation signal 110b having a carrier frequency to the population of tags 120. Readers 104a and 104b typically operate in one or more of the frequency bands allotted for this type of RF communication. For example, frequency bands of 902-928 MHz and 2400-2483.5 MHz have been defined for certain RFID applications by the Federal Communication Commission (FCC).

Various types of tags 102 may be present in tag population 120 that transmit one or more response signals 112 to an interrogating reader 104, including by alternatively reflecting and absorbing portions of signal 110 according to a time-based pattern or frequency. This technique for alternatively absorbing and reflecting signal 110 is referred to herein as backscatter modulation. Readers 104a and 104b receive and obtain data from response signals 112, such as an identification number of the responding tag 102. In the embodiments described herein, a reader may be capable of communicating with tags 102 according to any suitable communication protocol, including Class 0, Class 1, EPC Gen 2, other binary traversal protocols and slotted aloha protocols, any other protocols mentioned elsewhere herein, and future communication protocols. Additionally, tag population 120 may include one or more tags having the Packed Object format described herein and/or one or more tags not using the Packed Object format (e.g., standard ISO tags).

Figure 1B:
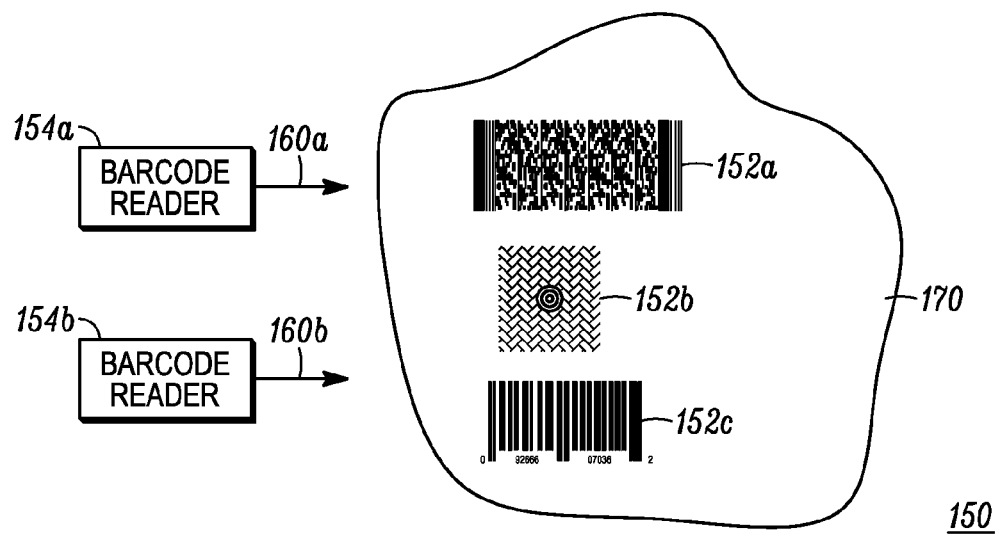
FIG. 1B shows an example environment where barcode readers read an exemplary population of barcodes.

FIG. 1B illustrates an environment 150 where 1 or more barcode readers 154 read a population of barcodes 170. An exemplary barcode reader uses internal or external light 160, which reflects off of the barcode, and scans the barcode. Barcode readers are well known in the art. Barcode reader 154 is configured to read optically readable symbols. In embodiments, barcode reader 154 may include any type of barcode scanner front end, including a light source (e.g., photodiode), a laser scanner, a charge coupled device (CCD) reader, and/or a 2D symbol imaging scanner (e.g., a video camera). Barcode reader 154 may further include processing logic for decoding received symbol information.

Figure 2A:
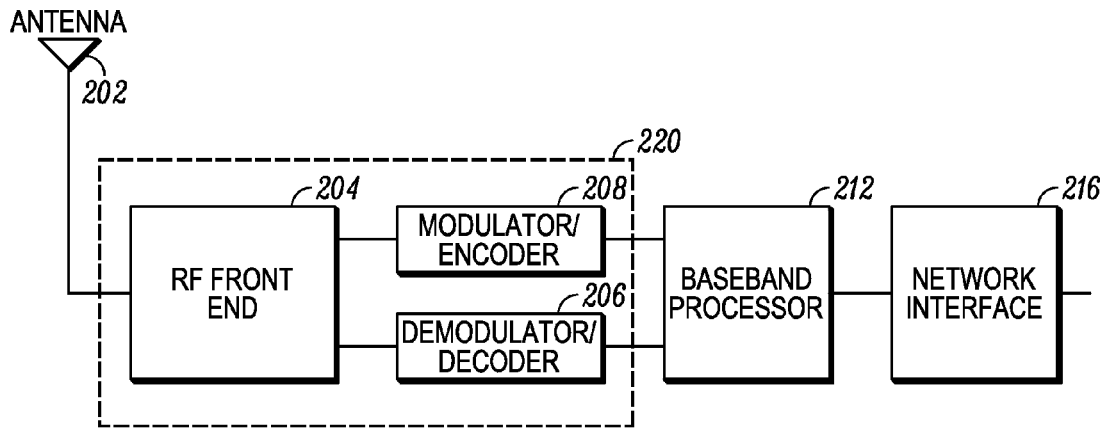
FIG. 2A shows a block diagram of receiver and transmitter portions of an RFID reader.

FIG. 2A shows a block diagram of an example RFID reader 104. Reader 104 includes one or more antennas 202, a receiver and transmitter portion 220 (also referred to as transceiver 220), a baseband processor 212, and a network interface 216. These components of reader 104 may include software, hardware, and/or firmware, or any combination thereof, for performing their functions.

Baseband processor 212 and network interface 216 are optionally present in reader 104. Baseband processor 212 may be present in reader 104, or may be located remote from reader 104. For example, in an embodiment, network interface 216 may be present in reader 104, to communicate between transceiver portion 220 and a remote server that includes baseband processor 212. When baseband processor 212 is present in reader 104, network interface 216 may be optionally present to communicate between baseband processor 212 and a remote server. In another embodiment, network interface 216 is not present in reader 104.

In an embodiment, reader 104 includes network interface 216 to interface reader 104 with a communications network. As shown in FIG. 2A, baseband processor 212 and network interface 216 communicate with each other via a communication link 222. Network interface 216 is used to provide an interrogation request to transceiver portion 220 (optionally through baseband processor 212), which may be received from a remote server coupled to communications network. Baseband processor 212 optionally processes the data of interrogation request prior to being sent to transceiver portion 220. Transceiver 220 transmits the interrogation request via antenna 202.

Reader 104 has at least one antenna 202 for communicating with tags 102 and/or other readers 104. Antenna(s) 202 may be any type of reader antenna known to persons skilled in the relevant art(s), including a vertical, dipole, loop, Yagi-Uda, slot, or patch antenna type.

Transceiver 220 receives a tag response via antenna 202. Transceiver 220 outputs a decoded data signal generated from the tag response. Network interface 216 is used to transmit the decoded data signal received from transceiver portion 220 (optionally through baseband processor 212) to a remote server coupled to the communications network. Baseband processor 212 optionally processes the data of the decoded data signal prior to being sent over the communications network.

In embodiments, network interface 216 enables a wired and/or wireless connection with a communications network. For example, network interface 216 may enable a wireless local area network (WLAN) link (including a IEEE 802.11 WLAN standard link), a BLUETOOTH link, and/or other types of wireless communication links. A communications network may be a local area network (LAN), a wide area network (WAN) (e.g., the Internet), and/or a personal area network (PAN).

In embodiments, a variety of mechanisms may be used to initiate an interrogation request by reader 104. For example, an interrogation request may be initiated by a remote computer system/server that communicates with reader 104 over a communications network. Alternatively, reader 104 may include a finger-trigger mechanism, a keyboard, a graphical user interface (GUI), and/or a voice activated mechanism with which a user of reader 104 may interact to initiate an interrogation by reader 104.

In the example of FIG. 2A, transceiver portion 220 includes a RF front-end 204, a demodulator/decoder 206, and a modulator/encoder 208. These components of transceiver 220 may include software, hardware, and/or firmware, or any combination thereof, for performing their functions. Example description of these components is provided as follows.

Modulator/encoder 208 receives an interrogation request, and is coupled to an input of RF front-end 204. Modulator/encoder 208 encodes the interrogation request into a signal format, such as one of pulse-interval encoding (PIE), FM0, or Miller encoding formats, modulates the encoded signal, and outputs the modulated encoded interrogation signal to RF front-end 204.

RF front-end 204 may include one or more antenna matching elements, amplifiers, filters, an echo-cancellation unit, a down-converter, and/or an up-converter. RF front-end 204 receives a modulated encoded interrogation signal from modulator/encoder 208, up-converts (if necessary) the interrogation signal, and transmits the interrogation signal to antenna 202 to be radiated. Furthermore, RF front-end 204 receives a tag response signal through antenna 202 and down-converts (if necessary) the response signal to a frequency range amenable to further signal processing.

Demodulator/decoder 206 is coupled to an output of RF front-end 204, receiving a modulated tag response signal from RF front-end 204. In an EPC Gen 2 protocol environment, for example, the received modulated tag response signal may have been modulated according to amplitude shift keying (ASK) or phase shift keying (PSK) modulation techniques. Demodulator/decoder 206 demodulates the tag response signal. For example, the tag response signal may include backscattered data formatted according to FM0 or Miller encoding formats in an EPC Gen 2 embodiment. Demodulator/decoder 206 outputs the decoded data signal.

The configuration of transceiver 220 shown in FIG. 2A is provided for purposes of illustration, and is not intended to be limiting. Transceiver 220 may be configured in numerous ways to modulate, transmit, receive, and demodulate RFID communication signals, as would be known to persons skilled in the relevant art(s).

Figure 2B:
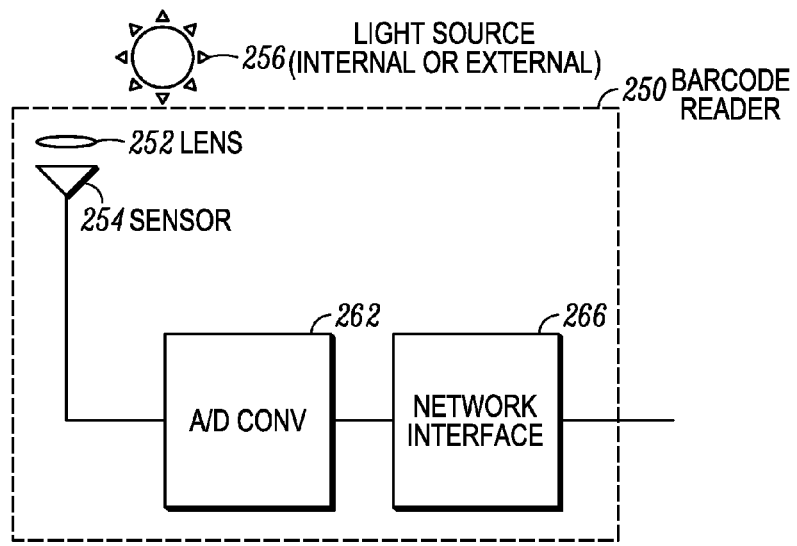
FIG. 2B shows a block diagram of an exemplary barcode reader.

Similarly, FIG. 2B shows a block diagram of an exemplary barcode reader 250. Barcode readers are well known in the art. Barcode reader 250 may be of any type. Barcode reader 250 may include an internal or external light source 256 of any type (e.g., photodiode) or may use ambient light. Barcode reader lens 252 focuses light reflected off of a barcode. Light sensor 254 of any type (e.g., a charge coupled device, video camera, etc.) detects the pattern of the barcode. A/D converter 262 converts an analog signal from sensor 254 to digital. Network interface 266 enables communications with a communications network.

Figure 3A:
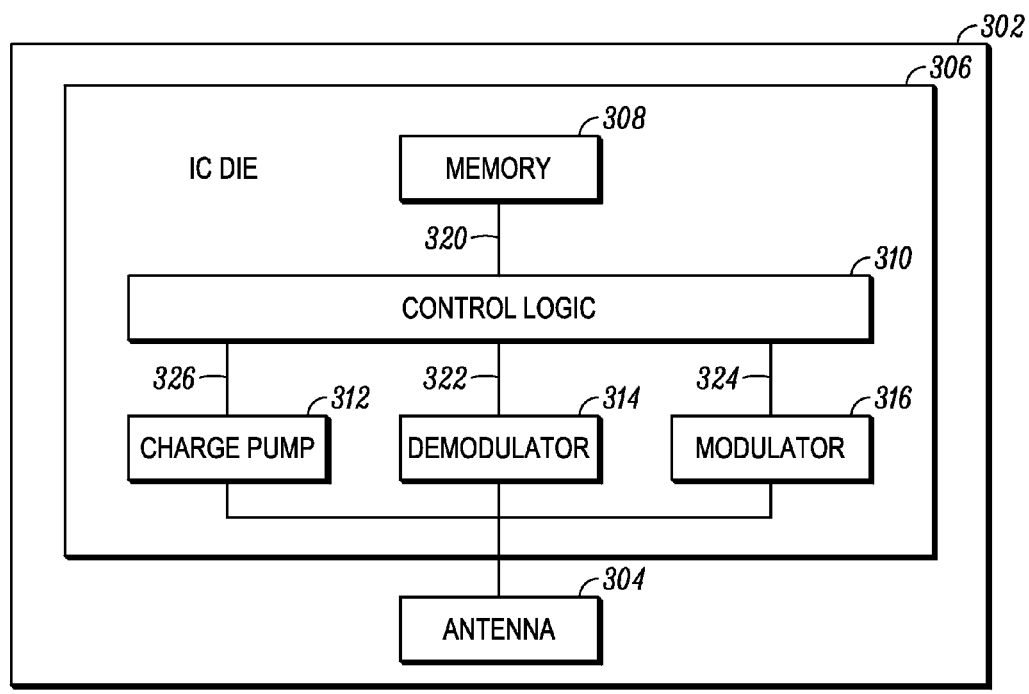
FIG. 3A shows a block diagram of an exemplary radio frequency identification (RFID) tag.

FIG. 3A shows a plan view of an example radio frequency identification (RFID) tag 102. Tag 102 includes a substrate 302, an antenna 304, and an integrated circuit (IC) 306. Antenna 304 is formed on a surface of substrate 302. Antenna 304 may include any number of one, two, or more separate antennas of any suitable antenna type, including dipole, loop, slot, or patch antenna type. IC 306 includes one or more integrated circuit chips/dies, and can include other electronic circuitry. IC 306 is attached to substrate 302, and is coupled to antenna 304. IC 306 may be attached to substrate 302 in a recessed and/or non-recessed location.

IC 306 controls operation of tag 102, and transmits signals to, and receives signals from RFID readers using antenna 304. In the example of FIG. 3A, IC 306 includes memory 308, control logic 310, charge pump 312, demodulator 314, and modulator 316. An input of charge pump 312, an input of demodulator 314, and an output of modulator 316 are coupled to antenna 304 by antenna signal 328.

Demodulator 314 is coupled to antenna 304 by antenna signal 328. Demodulator 314 demodulates a radio frequency communication signal (e.g., interrogation signal 110) on antenna signal 328 received from a reader by antenna 304. Control logic 310 receives demodulated data of the radio frequency communication signal from demodulator 314 on input signal 322. Control logic 310 controls the operation of RFID tag 102, based on internal logic, the information received from demodulator 314, and the contents of memory 308. For example, control logic 310 accesses memory 308 via a bus 320 to determine whether tag 102 is to transmit a logical "1" or a logical "0" (of identification number 318) in response to a reader interrogation. Control logic 310 outputs data to be transmitted to a reader (e.g., response signal 112) onto an output signal 324. Control logic 310 may include software, firmware, and/or hardware, or any combination thereof. For example, control logic 310 may include digital circuitry, such as logic gates, and may be configured as a state machine in an embodiment.

Modulator 316 is coupled to antenna 304 by antenna signal 328, and receives output signal 324 from control logic 310. Modulator 316 modulates data of output signal 324 (e.g., one or more bits of identification number 318) onto a radio frequency signal (e.g., a carrier signal transmitted by reader 104) received via antenna 304. The modulated radio frequency signal is response signal 112, which is received by reader 104. In an embodiment, modulator 316 includes a switch, such as a single pole, single throw (SPST) switch. The switch changes the return loss of antenna 304. The return loss may be changed in any of a variety of ways. For example, the RF voltage at antenna 304 when the switch is in an "on" state may be set lower than the RF voltage at antenna 304 when the switch is in an "off" state by a predetermined percentage (e.g., 30 percent). This may be accomplished by any of a variety of methods known to persons skilled in the relevant art(s).

Charge pump 312 (or other type of power generation module) is coupled to antenna 304 by antenna signal 328. Charge pump 312 receives a radio frequency communication signal (e.g., a carrier signal transmitted by reader 104) from antenna 304, and generates a direct current (DC) voltage level that is output on tag power signal 326. Tag power signal 326 is used to power circuits of IC die 306, including control logic 320.

Charge pump 312 rectifies the radio frequency communication signal of antenna signal 328 to create a voltage level. Furthermore, charge pump 312 increases the created voltage level to a level sufficient to power circuits of IC die 306. Charge pump 312 may also include a regulator to stabilize the voltage of tag power signal 326. Charge pump 312 may be configured in any suitable way known to persons skilled in the relevant art(s). For description of an example charge pump applicable to tag 102, refer to U.S. Pat. No. 6,734,797, titled "Identification Tag Utilizing Charge Pumps for Voltage Supply Generation and Data Recovery," which is incorporated by reference herein in its entirety. Alternative circuits for generating power in a tag, as would be known to persons skilled in the relevant art(s), may be present. Further description of charge pump 312 is provided below.

It will be recognized by persons skilled in the relevant art(s) that tag 102 may include any number of modulators, demodulators, charge pumps, and antennas. Tag 102 may additionally include further elements, including an impedance matching network and/or other circuitry. Furthermore, although tag 102 is shown in FIG. 3A as a passive tag, tag 102 may alternatively be an active tag (e.g., powered by battery) or a passive/active tag.

FIG. 3B shows several example types of barcodes encoding various amounts and types of data. The example barcodes shown are a 2D PDF417 barcode 152a, a Maxicode 152b, and a linear barcode 152c. PDF417 is a stacked linear bar code format used in a variety of applications, primarily transport, identification cards, and inventory management. PDF stands for Portable Data File. The PDF417 format was developed by Symbol Technologies. Maxicode is a public domain, machine readable symbol system originally created and used by United Parcel Service. It is generally used for tracking and managing the shipment of packages. Maxicode is a 1 inch square having a bullseye in the middle surrounded by a pattern of hexagonal dots. A linear or 1D barcode stores information in the widths and spacings of the printed parallel lines.

For ease of discussion, embodiments are described herein in the context of RFID. As would be appreciated by persons of skill in the art, aspects of the described embodiments are applicable to other types of identification technologies including barcodes and other forms of symbology.

Figure 4:
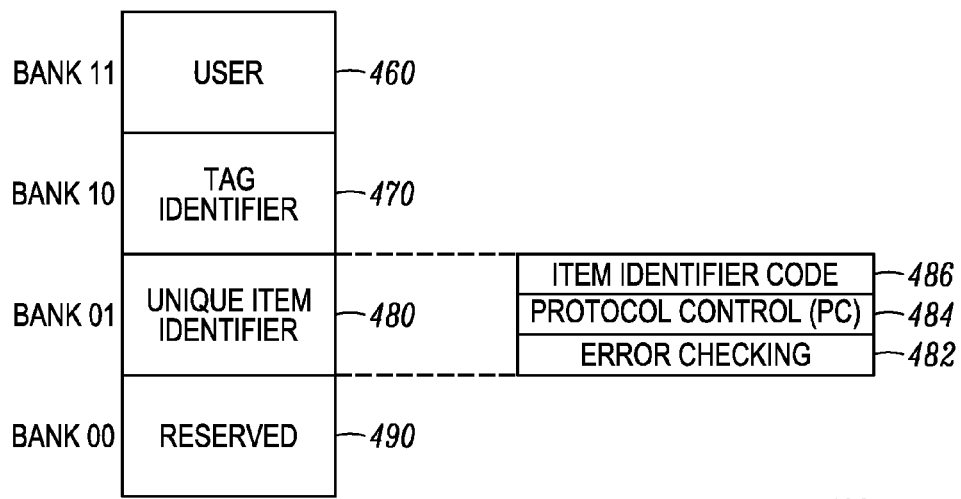
FIG. 4 depicts an exemplary logical memory map for a Gen-2 tag memory.

RFID tag memory 308 is typically a non-volatile memory, but can alternatively be a volatile memory, such as a DRAM. Memory 308 stores data, including an identification number 318. In a Gen-2 tag, tag memory 308 may be logically separated into four memory banks. FIG. 4 depicts an exemplary logical memory map 400 for a Gen-2 tag memory 308. Tag memory 308 includes a user memory bank 460 (bank 11), a tag identifier bank 470 (bank 10), a unique item identifier bank 480 (bank 01), and a reserved bank 490 (bank 00). Each bank may have any number of memory words. Additionally, the format of one or more memory banks may be established by an industry, governmental, standards, or other similar type of organization.

User memory bank 460 is configured for user-specific data storage. User memory bank 460 is described in further detail below. Tag identifier (TID) bank 470 is configured to store identification information for a tag. For example, TID bank 470 may store an allocation class identifier for the tag and information regarding the unique commands and/or optional features supported by the tag. Unique Item Identifier (UII) bank 480 is configured to store an error checking code 482 (e.g., a CRC-16), protocol control (PC) bits 484, and an item identifier code 486. In an embodiment, PC bits 484 include one or more application family identifier (AFI) bits (e.g., PC bit 17). Item identifier code 486 may identify the object to which the tag is attached. Reserved bank 490 is configured to store the kill and access passwords for a tag.

1.1 User Memory Bank

This section describes an exemplary format definition for a user memory bank 460 in RFID tags (e.g., in ISO 18000-6C tags). The format may be used when encoding user data according to specifications defined by another standards organization (such as EPCglobal). The exemplary format is designed to maintain basic backward compatibility with tags formatted according to a specific standard(s) (e.g., ISO/IEC 15962-formatted tags), but offers increased encoding efficiency. The user memory format and associated encoding and decoding methods described herein are extensible to memories of any size, but bit efficiency may be optimized for memories under 1K bits. Regardless of available memory sizes, air-interface Write and Read times need to be minimized. It is assumed that encoding or decoding time using today's CPUs will be insignificant compared to air-interface time. According to one embodiment of the invention, a solution can utilize a fairly complex encoding and decoding algorithm if it minimizes the number of encoded bits for a given data set that need to be transferred over the air interface.

Figure 5:
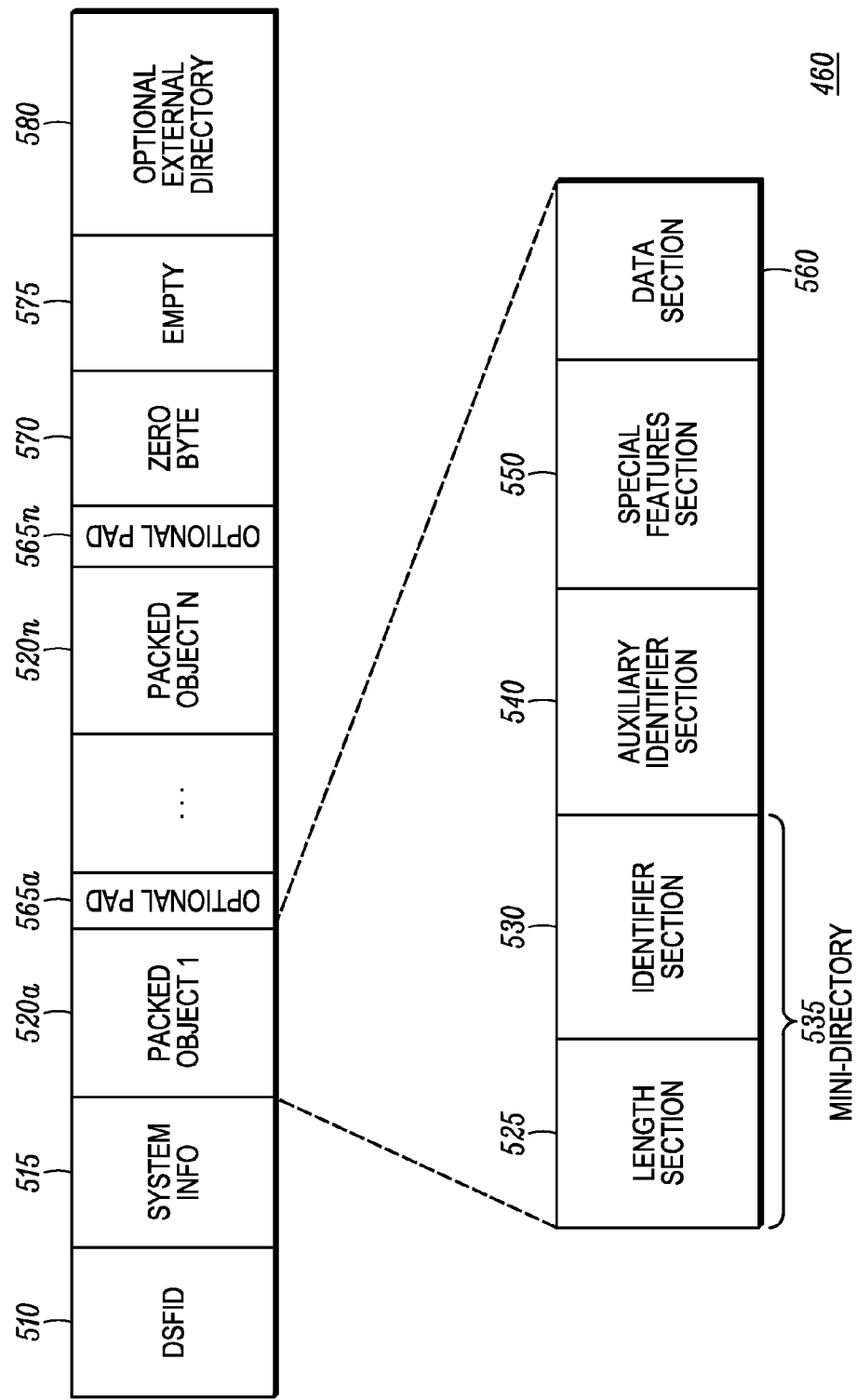
FIG. 5 depicts an example high-level format for a user memory bank of an RFID tag, according to embodiments of the invention.

FIG. 5 depicts a high-level format for user memory bank 460 of an RFID Packed Object tag, according to embodiments of the invention. User memory bank 460 includes an optional data storage format identifier (DSFID) 510, a system information field 515, one or more Packed Objects 520a-n, an optional zero byte 570, an optional empty field 575, and an optional external directory 580. Optional pads 565a-n may be included between any two Packed Objects 520 or after the last packet object 520n and zero byte 570. Optional pads 565 are used for aligning various parts of user memory bank 500. Optional pads 565 are signaled by using an otherwise-invalid pattern in the initial bits (e.g., initial 6 bits) of what would be the second or subsequent Packed Object 520. For example, a value of 100100BB may be encoded in optional pads 565a to align the next Packed Object 520b. Such alignment can be useful for many purposes, including simpler access using word-aligned reads, better ability to apply passwords or otherwise control access to complete Packed Objects 520a-n, and more efficient indexing and random access to Packed Objects 520a-n via use of an optional external directory 580. A high level discussion of DSFID 510 and Packed Objects 520a-n is provided below. For a more detailed discussion on DSFID 510 and Packed Objects in general, see the '466 patent, the '050 application, and the '053 application which have been incorporated by reference in their entireties.

User memory bank 460 may include an optional zero byte 570 in embodiments which do not include a parser capable of parsing the packet object format described herein. In these embodiments, a zero-value is encoded in zero byte 570. Although depicted after the last Packed Object 520n in FIG. 5, the zero byte may alternatively precede the first Packed Object 520a. The zero-valued zero-byte looks like a terminating Precursor to these parsers (e.g., a standard ISO parser).

User memory bank 460 may also include a system information section 515. System information section 515 may include hardware or system information about the tag and/or sensor information if the tag has an associated sensor.

User memory bank 460 may also include a variable number of empty bytes 575 followed by an optional external directory 580. Although depicted as following empty bytes 575, external directory 580 may be located at the front of user memory bank 460 or at the end of the series of Packed Objects 520. Optional external directory is described in further detail below. Note that one or more bytes may be included following the DSFID 510. For example, these bytes may be reserved for a specific current use or marked for future use.

Note that Packed Object tags can be intermixed in a tag population with non-Packed Object tags. This highlights the backward compatibility feature of the user memory bank format described herein. Therefore, Packed Object tags, if unformatted, begin with a first byte of zero. If formatted, Packed Object tags include the necessary set of information to indicate their configuration (i.e., Packed Object) to a reader.

The Prefix/Infix/Suffix mechanisms previously used in Packed Objects is somewhat limited in the percentage of data mixes in which it is most useful. For example, if the first four characters of a data string include both letters and digits, then the old prefix cannot be used. As another example, the old infix mechanism includes a pointer to the starting position of the infix within the data stream, which costs several additional overhead bits; thus, the old infix was most beneficial to particularly long runs of data from the same base. Finally, because the old prefix, infix, and suffix fields must contain either only digits or only non-digits, many data strings cannot use the prefix and/or suffix at all (because of strings starting and/or ends with mixed characters), and the length of the allowable prefix, suffix, or infix rarely constitutes a significant percentage of a large message due to the odds that at least one character would occur that would interrupt the single-base run.

For some data sets, the performance of systems using Packed Objects can be improved by defining additional non-character-mapped encoding options at the start of the A/N section. For example, a larger A/N header could define more options, such as an option to encode an entire A/N section in Base 28 (if only letters, spaces, and FNC1's need to be encoded) or Base 37 (if only letters, numbers, and FNC1's need to be encoded), etc.

Adding more options in this way adds overhead to every encoded message, and these additional options by their targeted nature are useful only on a subset of all possible data messages. For instance, an extra set that includes both digits and numbers might avoid the overhead of a character map, but is inherently less efficient than dual-base encoding, unless the source string uniformly contains many more letters than digits.

However, additional encoding methods can be used within a given message in conjunction with a character map, rather than as an alternative to a character map. In this way, a better efficiency is available to the broadest number of message mixes.

Thus, what is needed is a system and method for encoding A/N and other mixed data strings, where one or more substrings of the data string form a sequence that is primarily (but not exclusively) from a single character class (such as digits or uppercase letters). Also, a system and method for defining a string prefix, suffix, or infix, in a way as to increase the percentage of mixed data sets that would benefit from their use, and to increase the maximum length of the data sets that would significantly benefit from their use is needed. Moreover, a system and method for defining an Infix substring, in order to eliminate the need to encode the position of the Infix substring within the string is needed.

What is also needed are systems and methods to increase the degree to which a Packed Object may flexibly mix defined ID tables of different sizes and representing different data systems, and for maintaining backward compatibility with deployed decoding systems as new tables are defined.

1.1.1 Data Storage Format Identifier (DSFID)

DSFID 510 includes information related to the organization and encoding of data in user memory bank 460. An example data system that may be utilized in a Packed Object 520 is application identifiers (AIs). AIs are a finite set of identifiers used to connect physical and logical things to information about them. Each AI includes a two or more digit prefix used to identify the context of the data (e.g., serial shipping container code, global trade item number, etc.). AIs are typically assigned and maintained by a national or international standards setting or trade organization (such as GS1). Another data system that may be utilized is data identifiers (DIs) (also referred to as "FACT data identifiers"). A DI may be a single alphanumeric character or an alphanumeric character prefixed by one or more numeric characters. DIs are also typically assigned and maintained by a national or international standards setting or trade organization (such as ANSI). As would be appreciated by persons of skill in the art, data systems other that AI and DI could be used in the present invention.

Various embodiments of the present invention may use different DSFID 510 formats. For example, an embodiment may use a DSFID 510 format which favors AIs, allowing DIs to be encoded at a lower efficiency. In another exemplary embodiment, a DSFID 510 can be used which favors DIs, allowing AIs to be encoded at a lower efficiency. In a further example, an embodiment may use a DSFID 510 in which all AIs and DIs use the same compaction and general structure. In another embodiment, the DSFID 510 may also be used to signal the presence of additional information in user memory.

1.1.2 Packed Objects

As illustrated in FIG. 5, an exemplary Packed Object includes a length section 525, an identifier section 530, an optional auxiliary identifier (Aux ID) section 540, an optional special features section 550, and a data section 560. In an embodiment, the sections of packet object 520 are bit-aligned (that is, no pad bits between sections are required). One or more sections of a packet object 520 may have a variable number of bytes.

Length section 525 indicates the overall length of the packet and indicates how many identifier values (e.g., AIs) are encoded in the packet. Identifier (ID) section 530 includes a listing of one or more IDs. The ID section 530 and the optional length section 525, if present, may be referred to as "mini-directory" 535. Aux ID section 540, when present, encodes additional bits that are defined for some classes of IDs. These bits aid data compression but do not contribute to defining the ID. Data section 560 represents the concatenated and compressed data from the AIs and other IDs.

Figure 6:
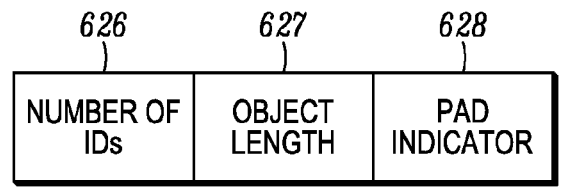
FIG. 6 depicts an exemplary length section according to embodiments of the present invention.

FIG. 6 depicts an exemplary length section 525, according to embodiments of the present invention. Length section 525 includes two length vectors (number of IDs field 626 and object length field 627) and a flag (pad indicator 628).

Figure 7:
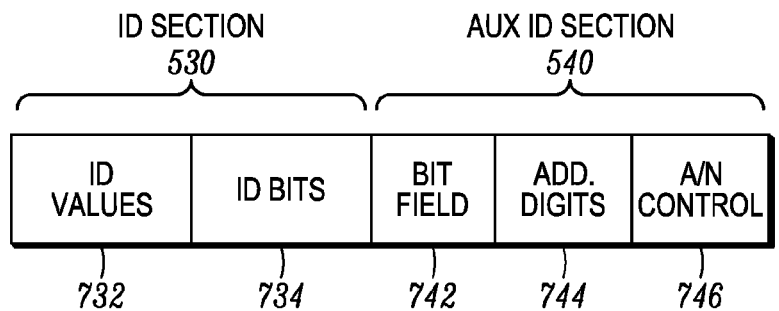
FIG. 7 depicts an exemplary ID section and an exemplary Aux ID section according to embodiments of the present invention.

FIG. 7 depicts an exemplary ID Section 530 and an exemplary Auxiliary ID section 540, according to embodiments of the present invention. ID section 530 includes an ID values subsection 732, and an ID bits subsection 734. Auxiliary ID section 540 includes a bit field portion 742, an additional digit portion 744, and an optional A/N control portion 746.

FIG. 9 depicts an exemplary data section 560, which contains the compacted contents of each identifier data string (e.g., AI or DI data strings). Depending on the characteristics of the encoded IDs and data strings, data section 560 may include up to three subsections. In an embodiment, data section 560 may include a custom-compaction subsection 962, a known-length-numerics subsection 964, and an alphanumerics (A/N) subsection 966. In an embodiment, A/N subsection 966, if present, encodes any identifier data strings that were not already encoded in either custom-compaction section 962 or known-length-numerics subsections 964. For additional detail on these sections, see the '053 and '050 applications. The A/N subsection 966 is further described in detail below.

2.0 Defining Identifiers as ID Table Values

2.1 Introduction

FIGS. 8A-8F depicts a series of example ID tables, according to embodiments of the present invention. The following discussion is in regard to the development and definition of ID tables (sometimes called ID header tables).

Packed Objects include ID values 732 and ID bits 734 and/or Aux ID section 540, the values of which are determined from tables such as those in FIGS. 8A-8F. These ID Tables, customized for each data system (such as GS1/ECPglobal Application Identifiers, or FACT Data Identifiers), may be registered with a registration authority, such as the registration authority denoted by ISO/IEC 15961-2.

An ID Table includes at least single Primary Base Table (see, e.g., FIGS. 8A, 8B), and may include one more Alternate Base Tables and/or Secondary Tables (see, e.g., FIGS. 8C-8F) that are referenced by one or more entries in the Primary Base Table. Several mechanisms are identical whether appearing in a Base Table or a Secondary Table.

The following descriptions assume a matrix representation (rows and columns) of each defined Base or Secondary table, however as would be appreciated by persons of skill in the art, other representations (such as XML) may also be used.

2.2 Compatibility Mechanisms

ID Tables provide several mechanisms for various degrees of backward compatibility. At one extreme, the responsible entity can register a new table and new data format, fully optimized for the application. However, already-deployed decoding systems will be unable to process data items utilizing the new table, unless and until they are upgraded with the new table. In this scenario, additional ID tables need to be added to deployed decoding systems, however, the software algorithms that process Packed Objects do not need to be revised when new tables are registered. Thus, when a new table is registered, the registering organization may reserve a "roll-out" period during which identifiers of the new table can instead be encoded using one of the less-efficient but fully-compatible mechanisms described below.

Mechanisms described below provide alternatives to registering a new data format and new table (which requires a table upgrade to all receiving systems). While these mechanisms provide less-optimized encoding, no upgrades to receiving systems are required to maintain sufficient ability to parse Packed Objects.

In the first mechanism, registered tables may contain Reserved for Future Assignment (RFA) entries. Thus, registered tables can be revised in the future to assign an identifier to an RFA entry without disrupting the installed base of receiving systems, albeit with some restrictions as defined elsewhere herein. RFA entries are described in detail below.

Registered tables may also contain generic "Verbatim ID Encoding" entries, which are more flexible than RFA entries and can represent many identifiers. However, Verbatim entries may incur more encoding overhead than basic RFA entries. Verbatim encoding is described in detail below.

An additional alternative allows a registration to revise the definition of Reserved for Future Use (RFU) entries. Depending upon the characteristics of the revision, deployed systems may require a table upgrade to properly process Packed Objects containing originally-RFU entries (i.e., an ID Value is now populating the original RFU table entry). Thus, when a new RFU definition is registered, the registering organization may reserve a "roll-out" period during which the new ID value (now populating the original RFU table entry) is not be used in open systems, unless "quarantined" within a separate Packed Object. RFU entries are described in detail below.

Finally, as a flexible alternative to registering a new table, an ID Table may, upon its initial registration, contain a single entry defined as a "Version Control" entry, which if utilized in a Packed Object is the first identifier listed in that object. Version encoding is described in detail below.

The definition of ID Tables also provides several mechanisms for various degrees of "lateral compatibility" with non-default data systems. These are described elsewhere herein and in the incorporated references.

2.3 ID Section Mechanisms

Every ID Table defines all of the ID Values used in its Base Table. One or more Base Table entries may also be defined so as to invoke ID Bits 734 and/or Aux ID section 540 when used in a Packed Object. The supported set of ID Section mechanisms are defined in the following subsections.

Each ID Value represents a Table Index. Most fundamentally, a data system's registered ID Table must define not only the data system identifier(s) represented by each row of the table, but also must specify the number of bits needed to encode a table index (i.e., an ID Value) to represent those identifiers in a Packed Object. Since current and future data system ID Tables will vary in unpredictable ways in terms of their numbers of table entries, there is a need to pre-define an ID Value size mechanism that allows for future extensibility to accommodate new tables, while minimizing decoder complexity and minimizing the need to upgrade decoding software (other than the addition of new tables). Therefore, regardless of the exact number of Base Table entries defined, each Base Table definition utilizes one of the predefined sizes for ID Value encodings, such as those defined in defined ID Value sizes table 1410 shown in FIG. 14A.

The identifiers in an initial registration of the current default data system being used for the Packed Object have a known size. Therefore, the ID Size bit patterns shown in the first column of FIG. 14A are not encoded in a Packed Object if all of its ID values represent identifiers in the initial registration of the current default data system. These ID Size bits are only encoded immediately following a latch to a new (non-default) index size or data format within a Packed Object. Such latching mechanisms are described below.

Various optional latching mechanisms described herein may change the current Packed Object's ID Size. In such cases, a set of ID Size bits (e.g., as defined in ID Value sizes table 1410) are encoded in the ID Bits section, at a point in that section corresponding to the relative appearance of the latching mechanism within the list of ID Values. Since subsequent ID values may therefore be encoded using a different number of bits per ID Value, encoding systems using such a latch may use the following exemplary encoding procedure. Decoding systems, detecting the presence of such a latch, may use the following exemplary decoding procedure.

Figure 17A:
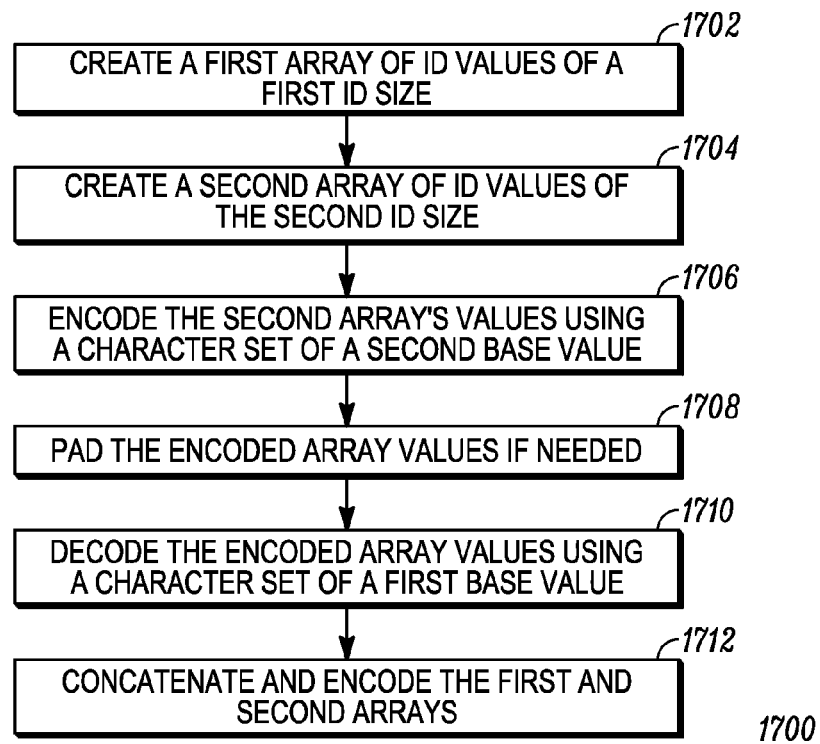
FIGS. 17A-17B show flowcharts illustrating an exemplary methods for encoding and decoding different sized identifier values according to embodiments of the invention.

FIG. 17A shows flowchart 1700, illustrating an example encoding procedure according to embodiments of the invention. For example, ID Size may be changed from Default base D to New base N.

In step 1702, a first array of ID values of a first ID size is created. For example, the first ID values are of a size corresponding to a base D representation. This first base D value array includes at least all of the ID values up to and including the ID Value that invokes a change in ID Size. In a further embodiment, the sequences of ID Bits and Aux ID Bits invoked by each value in the array are created in this step.

In step 1704, a second array of ID values of the second ID size (e.g., corresponding to base N) is created. For example, in this step a base N value array of ID values is created. This includes the one or more values that are to be encoded using the second ID Size. In an embodiment, sequences of ID Bits and Aux ID Bits invoked by each value in the array are appended in parallel.

In step 1706, the second array's ID values are encoded using a character set corresponding to the second base value (e.g., N). For example, the second array's ID values are encoded using a character set corresponding to an N base character set. In this example, the base N ID value array may be encoded into a Base N bit array using base N encoding per Table ID Value sizes table 1410.

In step 1708, the encoded array from step 1706 is padded if needed. Zero or more trailing '0' pad bits are added to the end of the Base N bit array of step 1706 array from step 1708 as needed to form a proper length Base D value array with a valid number of source bits for a character set (e.g., per ID Value sizes table 1410).

In step 1710, the encoded and optionally padded array from steps 1706 and 1708 is decoded using a character set of a first base value (e.g., D). For example, the optionally padded Base N bit array is decoded as if it were a Base D bit array, to create a second Base D value array.

In step 1712, the first and second arrays are concatenated and encoded. For example, the first Base D array from step 1702 and the second Base D value array of step 1710 are concatenated in that order. Next the concatenated array is encoded into a single Base D bit array. In an embodiment, this single bit array may be used as a Packed Object's list of ID Values. If the Packed Object includes an encoded Number of IDs in a Packed Object, it should indicate the number of Base D values in the concatenated array, not the original number of Base D values plus the original number of Base N values. A person of skill in the art would recognize that the above steps (including this step) may be repeated as necessary to encode more than one change in ID size.

Figure 17B:
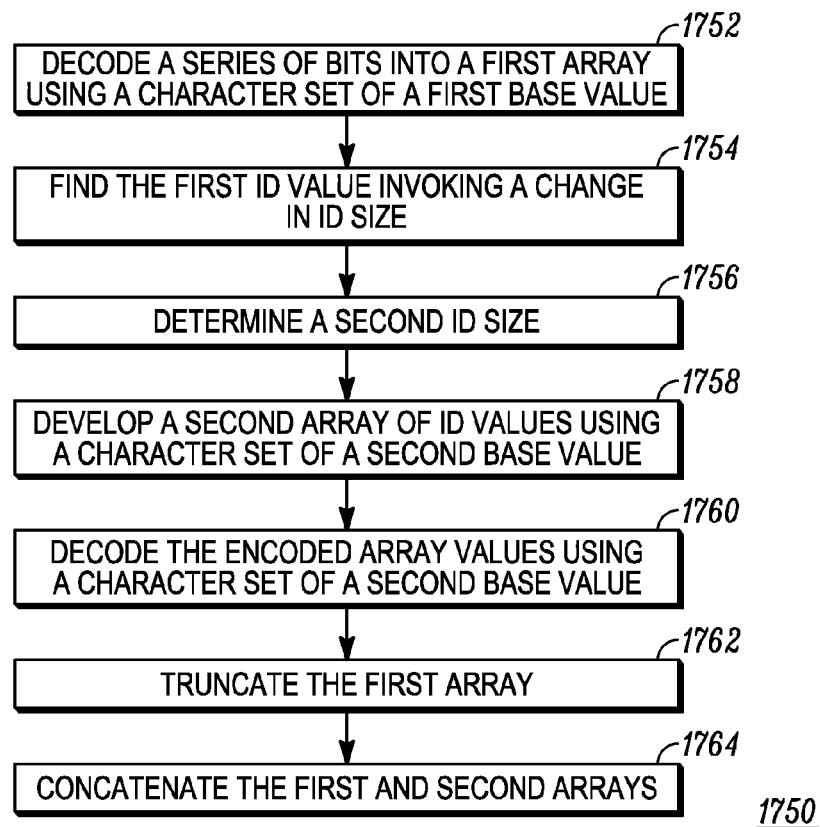

FIG. 17B shows flowchart 1750, illustrating an example decoding procedure for changing ID Size according to embodiments of the invention. For example, the ID Size may change from Default base D to New base N.

In step 1752, a series of bits are decoded into a first array. In an embodiment, the series of bits were included in the ID values section of a Packed Object. In an embodiment, the number of bits decoded is indicated by the length of the ID. When decoding, a character set of the first base value used when encoding (e.g., base D according to the above encoding procedure) is used to decode. For example, an ID Size for a base D per ID Value sizes table 1410 may be used to determine the size of the series of bits to be decoded and to create a first Base D value array.

In step 1754, a first ID value invoking a change in ID size is found. For example, the ID value is a value that invokes a change in size according to an ID table.

In step 1756, the second ID size is determined. The second ID size will correspond to the ID value invoking the ID size. In a further embodiment, corresponding Aux ID bits may be fetched to determine the new ID Size. For example, the new ID size corresponds to Base N.

In step 1758, a second array of ID values is developed using a character set of the second base value. In an exemplary embodiment, the trailing Base D values (those subsequent to the value that invoked the size change) are re-encoded into a new Base D bit array. The first Base D value array is truncated to eliminate these trailing Base D values, which will be replaced by Base N values, as calculated in the next step. In another exemplary embodiment, the trailing Base D values are not re-encoded because decoding stopped in previous steps when the ID value invoking the size change was encountered).

In step 1760, the remaining encoded array values (e.g., the trailing Base D values from step 1758) are decoded using a character set of a second base value (e.g. base N). For example, the new Base D bit array from step 1758 is decoded as if it were a Base N bit array to create a Base N value array.

In step 1762, any remaining zeros are truncated from the encoded array after the maximum integral number of second base (e.g., base N) values are decoded. Also, any trailing values of zero in the decoded value array (e.g, base N) are discarded. For example, discard any trailing bits that are left over after decoding the maximum integral number of Base N values from the bit array of step 1760. Also, any trailing Base N values of zero in the resulting Base N value array are discarded.

In step 1764, the first and second value arrays (e.g., base D followed by base N) are concatenated. A person of skill in the art would realize that the above steps may be repeated as necessary to decode more than one change in ID size. The resulting value arrays would then be concatenated in the correct order. In an embodiment, this forms the complete ID Values list for a Packed Object.

Note that the decoding procedure may place one limitation on encoding: if an encoded list of ID values includes a change of ID size, then an ID value of zero is not permitted at the end of the list.

2.3.1 ID Bits, to Reduce Size of the Table Index

Major data systems can contain up to several hundred defined identifiers, and thus a table that were to define each one separately would require a large table and therefore an inordinate number of bits to represent each table entry as a table index. Moreover, defining a separate index for each identifier (e.g., AI) would be counterproductive, in that it would reduce the efficiency of searching for classes of data items, wherein a supplier may freely choose one of several related identifiers, and a receiving system would have to search for each individually if not grouped in some way. An example, from the GS1 data system, are the set of Logistics Measures such as length and volume, where the same conceptual measurement can be represented in many different Application Identifiers, depending on both the measurement units and the fractional precision chosen by the supplier. Related measurements such as these can be grouped into a single Base Table entry, thus facilitating searching, and reducing the size of the table and therefore the number of bits required to represent each table Index Value in a Packed Object.

As a result of grouping related identifiers into a class, in some cases, an entry's index or ID Value, although quite suitable by itself for searches, may require additional information in order to fully define a specific identifier. This information may be provided by an ID Bits mechanism. Each entry (row) of each Base or Secondary ID Table has a ID Bits column, which may be blank or populated, depending on the characteristics of the entry. If populated, this column indicates the number of ID Bits invoked by that entry if present in a Packed Object; any such ID Bits are encoded within the ID Bits subsection of the ID Section of the Packed Object.

A common usage for ID Bits is to indicate an index into a Secondary Table of related identifiers which all use the same Base Table index. Often, the Secondary Table contains only two or four entries, all with the same Fixed/Variable data characteristics, and thus it is simpler to fully define the Secondary Table within the Base Table entry (with an in-place definition of which ID Bits patterns correspond to which identifier), rather than to construct and reference a separate Secondary Table. In other cases, however, the Secondary Table contains many entries, and is listed within the registration documents as a separate Secondary Table. It may be desired to encode a series of related data items that share the same Base ID Table index (for example, encoding two or more Logistics measures for an item, such as its Length and Volume). One way this may be supported is if the Base Table entry specifies a "Repeat" bit as the first of the ID Bits invoked by that entry (therefore, the Repeat bit would immediately precede the ID Bits that select an entry from the in-place or separate Secondary Table). If a Repeat bit is defined for an entry, then if the first encoded ID bit invoked by that entry (i.e., the first appearance of the Repeat bit) is set, then a second Repeat bit is encoded immediately after the other ID Bits defined for the entry, and this sequence repeats until a Repeat bit that is not set is encoded. For example, if the registered Base Table entry for the class (e.g., a single indication of ID Value 12-Variable Trade Item Measures) defines the leading ID Bit to be a "Repeat" bit either on an ID Values list or on an ID Map, one could invoke in succession a "net volume," a "height", and a "net weight" data item, by setting the "repeat" bit for the first two, then clearing it for the third. In this example, the set or cleared (e.g., '1' or '0') Repeat bit would be followed by the series of bits (e.g., four bits) indicating the volume, height, or weight measures as appropriate.

A second usage for the ID Bits mechanism is for the Base Table entry to indicate the encoding of one or more trailing ASCII characters that the receiving system must concatenate to the string of ID characters (if any) that are explicitly denoted by the Base Table entry. For example, the placement of the decimal point in the GS1 logistics measures is represented by a final digit of the AI, and within the registered ID Table, this grouping of inherently-related AI's uses ID Bits to represent that final AI digit.

2.3.2 Aux ID Information, to Increase Encoding Efficiency

Even after the identifier is fully defined, auxiliary ID information is in many cases defined by the ID table, in order to improve encoding efficiency. For many entries, namely those that correspond to fixed-length all-numeric data strings, the number of digits is indicated in the table (this number is never explicitly encoded in a Packed Object, but constitutes information that the receiving system looks up, based on the encoded ID Value, and uses to decode the data). For many other entries, namely those that correspond to variable-length all-numeric data strings, a number of "Vlen bits" bits needs to be encoded in the Aux ID section of a Packed Object that uses this entry; in this case, the number of Vlen bits (and the range of digit-lengths they indicate) is listed in the table. If a table entry corresponds to a data string that has both a fixed-length numeric portion and a variable-length numeric portion, then both the Fixed and the Vlen columns of that entry will be non-empty. Finally, entries may use a predefined Custom Compaction method (if so, this is listed under the Fixed Length column). In the case of the GS1 Base Table, as an example, all such entries are for encoding six-digit Date strings.

2.4 Verbatim Encoding of Identifiers

Although data element identifiers are normally encoded in Packed Objects as indices into a registered Base Table, additional methods are provided to handle special circumstances. Such circumstances include, but are not limited to, references to identifiers from other data systems without registered Base Tables, and newly-defined identifiers that are not yet represented in a registered Base Table. Thus, a mechanism is defined allowing a table to define one or more entries that support "verbatim" encoding of the ASCII strings representing data system identifiers that are not otherwise represented in the Base Table.

Identifiers in existing data systems vary in their characteristics (e.g., all-numeric, all-uppercase, or mixed alphanumeric), and many identifiers are variable-length (wherein the most commonly-used identifiers are typically assigned shorter ID strings). Since decoding systems need to be designed to support future verbatim encoding entries, a limited set of verbatim ID encoding methods is predefined, and future ID Tables may use one of these defined methods. Methods may be given identifying bit patterns, for example as illustrated in exemplary ID Encoding Methods Table 1420 in FIG. 14B. An identifying bit pattern may be required as an encoded ID Bits field, depending on the whether or not the table entry that calls for verbatim encoding specifies a single verbatim ID encoding method.

In an embodiment, Verbatim ID encoding methods use the same set of initial format bits in a known order indicating, for example, the selected encoding method as described above. These format bits may be defined as follows and exceptions may be made in the definition of a specific encoding method.

Method bits (e.g., two bits) may indicate the encoding method per ID Encoding Methods Table 1420. In an embodiment, the method bits may be omitted if a single encoding method is pre-specified in the registered table entry.

Number of verbatim IDs (nIDs) bits may indicate the number of IDs encoded in the verbatim string. In an embodiment, the nIDs bits field is two bits, where '00' to '11' represent one to four verbatim encoded IDs, respectively. This field may be omitted, for example, if either a fixed number or another number encoding mechanism is pre-specified in the registered table entry.

The format bits may further include a length indicator field. For example, a single ID length indicator bit (oneIDlen) may be cleared (e.g., '0') to indicate that each ID in the verbatim encoded string will be prefaced by a length indicator bit pattern to indicate its individual length and may be set (e.g., '1') to indicate that only the first ID in the string will be prefaced by a length indicator, which apply to all IDs in the string. This bit may be omitted, if either a fixed length or another length-encoding mechanism is pre-specified in the registered table entry A suffix present field may be further included. For example, a Suffix field of one bit may be set (e.g., '1') to indicate that the last encoded data character of the first identifier in the verbatim-encoding string is a Suffix that is added as a final character to the second and subsequent identifiers in the verbatim string. The Suffix bit may be omitted, if so specified in the registered table entry.

Some potential interactions between exemplary oneIDlen, Suffix, and length indicator bits for verbatim encoded string of identifiers can be summarized as follows:

Regardless of the value of the either the oneIDlen bit or the Suffix bit, the length indication preceding the first encoded identifier may include the encoded last character of that identifier.

If the oneIDlen bit is '0' but the Suffix bit is '1', then the length indicators of the second and subsequent identifiers may indicate only the number of characters actually encoded, and these length indicators do not include the additional suffix character that will be appended by the decoding process.

If the oneIDlen bit and the Suffix bit are both set to '1', then the second and subsequent identifiers may contain one fewer encoded characters than was indicated by the first identifier's length, because an additional suffix character will be appended by the decoding process.

Figure 18:
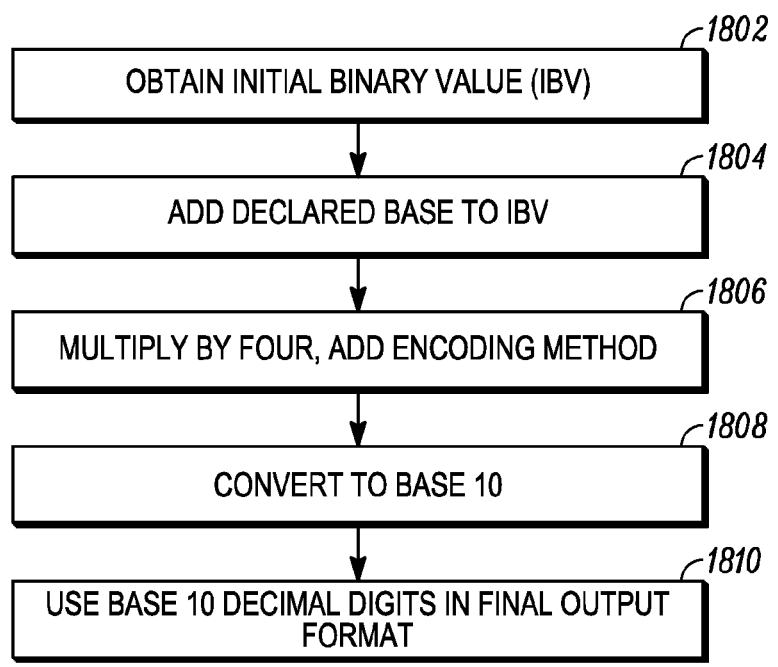
FIG. 18 shows a flowchart illustrating an exemplary verbatim encoding method.

The verbatim encoding method includes an process for deriving a unique ID Value from the ID string, that can be utilized for constructing Uniform Resource Names (URNs) and other output formats. The following example method is illustrated in FIG. 18 and may be used in embodiments of the invention—e.g., if a decoder is programmed to derive a unique ID Value from each encoded ID of the verbatim string.

In step 1802, a verbatim-encoded identifier's Initial Binary Value is obtained directly from its fully-decoded ASCII representation, excluding the leading length indicator digit if present, and excluding the Suffix character if the Suffix bit was set to '1'. The conversion method from the decoded ASCII representation to an Initial Binary Value is defined for each particular verbatim encoding method in the subsections below.

In step 1804, the value from step 1802 is added to a declared base of the data system's ID Values. For example, if the data system's ID size matches the entry labeled "011" in ID Value sizes table 1410, add 45 to the binary value.

In step 1806, the result of step 1804 is multiplied by four and the encoding method (e.g., in the range 0.3) is added.

In step 1808, the result of step 1806 is converted to base 10, e.g., from binary, and represented as the corresponding series of decimal digits.

In step 1810, the result of step 1808 may be used in the final formatted output. For example, the decimal digits of step 1808 may be used as the final component ("arc") of a URN.

Finally, note that when verbatim ID encoding is used to represent identifiers from a non-default data system, additional information (identifying the data system) may need to be encoded.

2.4.1 Verbatim ID Encoding, A/N Encodation

A/N ID encodation is a generic and flexible method defined for verbatim ID encoding, as it can encode identifiers containing any printable ASCII characters. Whenever an A/N Verbatim Encoding ID Value appears in a Packed Object, the following corresponding ID Bit fields may be encoded in the following order: (1) Format bits as specified above, except that the nIDs bits are not included, (2) a charMap length indicator (e.g., in EBV-6 form, since this will allow the decoder to determine the total length of the verbatim ID string, there is no need to encode the number of distinct IDs in the string), (3) one Bit to select between Base 30 or "Mixed non-numerics" (e.g., '0' or '1' respectively) for the non-numeric base. In an embodiment, if "Mixed non-numerics" is selected, then the non-numeric base is Base 118, (4) A variable-length character map bit pattern, whose length is specified by the charMap length indicator, and (5) one or two variable-length bit patterns representing the binary representations of the numeric and/or non-numeric ID characters indicated by the character map, using the same procedures as for A/N encoding within the data section of a Packed Object. Note that before encoding the identifiers, a leading digit is prefixed to each identifier, indicating the length (in characters) of the identifier (unless the oneIDlen bit is set, in which case only the first identifier of the set receives the added prefix).

In an embodiment, if a decoder is programmed to derive an ID value from the ASCII representation of an identifier, it derives the Initial Binary Value by treating the ASCII characters of the identifier as a series of Base 96 values (subtracting 32 from each character), and converting the result to a single binary value.

2.4.2 Verbatim ID Encoding, Alpha Encodation

Alpha encodation is a method defined for verbatim ID encoding of primarily-uppercase-based identifiers such as Text Element Identifiers (TEIs). In an embodiment, whenever an Alpha Verbatim Encoding ID Value appears in a Packed Object, the following corresponding ID Bit fields are encoded in the following order: (1) Format bits as specified above and (2) additional ID Bits directly representing each identifier as follows: (a) a two-bit "ID length pattern" representing the number of ASCII characters (one to four) in the identifier and (b) a binary value representing the base 30 to binary conversion of the ASCII characters, using the standard Base 30 character set for Packed Objects.

Note that if the oneIDlen format bit is set (e.g., to '1'), then all of the identifiers are of the same length and only the first identifier of the string is prefixed by the "ID length pattern" defined above.

If a decoder is programmed to derive an ID value from the ASCII representation of an identifier, it derives the Initial Binary Value by treating the ASCII characters of the identifier as a series of Base 96 values (subtracting 32 from each character), and converting the result to a single binary value. Base 96 (rather than a smaller base) is utilized, because Base 30 encodation supports shifts to characters other than uppercase letters.

2.4.3 Verbatim ID Encoding, numAlpha Encodation numAlpha encodation is a method defined for verbatim ID encoding of IDs consisting of zero to three digits, terminated by an uppercase letter, such as Data Identifiers. In an embodiment, when a Verbatim Encoding ID Value appears in a Packed Object, the following corresponding ID Bit fields are encoded in the following order: (1) Format bits as specified above and (2) additional ID Bits directly representing each identifier as follows: (a) a two-bit "ID length pattern" representing the number of leading digits (zero to three) preceding the uppercase Alpha character and (b) a binary number representing the leading digits in either 0, 4, 7, or 10 bits, as determined by the "ID length pattern", (c) a five-bit binary value representing the terminating uppercase letter, where binary values of 0..25 represent 'A' through 'Z'.

Note that if the oneIDlen Format bit is set to '1', then all of the identifiers are of the same length, and only the first identifier of the string is prefixed by the "ID length pattern" defined above.

If a decoder is programmed to derive an ID value from the ASCII representation of an identifier, it derives the Initial Binary Value by treating the ASCII characters of the identifier as a series of Base 36 values (subtracting 48 from each digit and subtracting 55 from the uppercase letter), and converting the result to a single binary value.

2.4.4 Verbatim ID Encoding, varNumeric Encodation varNumeric encodation is a method for verbatim ID encoding of variable-length, all numeric identifiers, such as GS1 Application Identifiers. varNumeric encodation may be applied to any all-numeric identification scheme of any length or range. The encodation method can preserve leading zeroes, if so desired for formatting reasons. However, the same numeric value, with and without leading zero or zeroes, does not represent two distinct identifiers within the system.

In an embodiment, whenever a varNumeric Verbatim Encoding ID Value appears in a Packed Object, the following corresponding ID Bit fields are encoded in the following order: (1) Format bits as specified above, (2) additional ID Bits directly representing each identifier as follows: (a) One-digit identifiers in the range "0" ... "9" are represented as the ID length pattern "110" followed by the identifier value represented as a four-bit binary number, (b) Two-digit identifiers in the range "00" ... 99" are represented as the 2-bit pattern "00" followed by the identifier value represented as a seven-bit binary number, (c) Three-digit identifiers in the range "000" ... "999" are represented as the 2-bit pattern "01" followed by the identifier value represented as a 10-bit binary number, (d) Four-digit identifiers in the range "0000" ... "9999" are represented as the 2-bit pattern "10" followed by the identifier value represented as a 14-bit binary number, (e) Five-digit identifiers in the range "00000" ... "99999" are represented as the pattern "111 110" (spaces added for clarity only) followed by the identifier value represented as a 17-bit binary number, and (f) Longer all-numeric identifier strings follow the pattern described above, using the previous set of range identifiers as a prefix to a repeat of the pattern sequence {110, 00, 01, 10, 111 110, ... }.

Note that if the oneIDlen Format bit is set to '1', then all of the identifiers are of the same length, and only the first identifier of the string is prefixed by the "ID length pattern" defined above If a decoder is programmed to derive an ID value from the ASCII representation of an identifier, it may derive the Initial Binary Value by treating the ASCII digits of the identifier as a series of Base 10 values (subtracting 0x30 from each digit), and converting the result to a single binary value.

2.5 The Base Table of ID Values

A data-system-specific Primary Base Table is defined as part of the registration of an ID Table—based Data Format for each specific application. For a given data system, a Base Table defines the most commonly-used identifiers (and combinations of identifiers) of the data system. The Base Table may also include non-data entries for various mechanisms (for example, table index values that "latch" into other Data Systems). Table definitions that utilize certain of these mechanisms, which require processing by the receiving system, are defined according to the rules presented in the following subsections.

A registration contains a single Primary Base Table, which is automatically set as the default table at the start of each Packed Object encoded within a data carrier that indicates this registration's Data Format as the default for the data carrier.

A registration of an ID Table-based Data Format may also contain one or more defined Alternate Base Tables, which are typically smaller than the Primary Base Table, and represent a subset of the data system's identifiers, suitable for a given vertical sector or application. A registration containing Alternate Base Tables may define an entry in its Primary Base Table denoting a latch to a specified Alternate table, but any such Alternate Base Tables are defined in the initial registration of the Data Format (new tables are not added by revision to the Data Format). The definition of a Primary Base Table entry that latches to an Alternate Base Table declares the Alternate Table's ID Size (but this need not be encoded), and declares a number of ID bits if necessary to denote the choice of Alternate Base Table (these ID Bits are encoded, if the number of Alternate tables is greater than one). If (as is typical) the latch initiates a change in ID Size, then the encoding and decoding procedures described elsewhere herein (for changing an ID size) are followed (except that the new ID size may be predefined in the registration and if so is not encoded).

Descriptions of various optional output representations of ID values are described elsewhere herein.

2.5.1 Encoding Table Version Control Information

As an alternative to requiring registration of a Data Format when a Base Table needs to be enlarged beyond its initially-registered entries, an ID Table may, upon its initial registration, contain a single entry defined as a "Version Control" entry, which if utilized in a Packed Object is the first identifier listed in that object. This Version Control entry will, at a minimum, define the initial bits of its ID Section to represent an Index Size entry (e.g., as defined in Table A-1 in FIG. 14A), and a single Aux ID "Compatibility Bit", each followed by whatever additional ID Bits and/or Aux ID bits meet the foreseen revision requirements. This mechanism allows a table revision to enlarge the size of its Base Table in order to add new entries. Specifically, the Version Control ID value itself, if used within a given Packed Object is encoded as the first ID Value in the Packed Object, and is encoded using the number of ID Value bits that were defined (for all entries) in the initial release of the table. Subsequent ID values in the Packed Object use the number of bits indicated by the encoded Index Size (which may or may not differ from the originally-registered size). Other than possibly increasing the number of bits per index, as just described, no modifications to initially-defined entries are permitted (other than through the RFA and RFU mechanisms previously defined), and in the revised table registration, all new entries are listed after the last of the original entries.

If maximum backward compatibility is desired, then the encoder may restrict the use of new table entries (those that were not originally registered) within a Packed Object, so that deployed decoders can still properly parse any data items that were defined in the initial registration. Specifically, the encoder may set the "Compatibility Bit" to '1' if the following two rules have been followed within the Packed Object: (1) all new entries within the Packed Object were encoded after any initially-registered entries, and (2) none of the new entries in the Packed Object invoke any ID Bits or Aux ID Bits.

These rules ensure that the data for all "new" entries will be encoded within the trailing A/N section of the Packed Object, following all of the data for any "original" entries. This result provides a decoding system with various options for processing a Packed Object with a "revised" table, such as: (a) parsing and utilizing all of the "originally-registered" data entries within the Packed Object, and discarding the data from the "new" entries; and (b) parsing and utilizing all of the "originally-registered" data entries within the Packed Object, and also parsing and utilizing the data from the "new" entries, each identified on output with the encoded "extended" ID value (or translated to a pseudo-identifier, if such a scheme is defined in the Version Control entry definition), and parsed using the separator characters encoded in the A/N data section (if a separator character is defined in the Version Control entry definition).

Regardless of the state of the Compatibility Bit, the Version Control entry, if encoded in a Packed Object, is conveyed in the decoded output preceding the subsequent data items in the Packed Object. For compatibility with all output formats, a pseudo-identifier may be listed in the originally registered Version Control entry for this purpose.

The revised registered Table definition includes a clear indication of the original ID Value Size; this automatically identifies which of the entries were present (perhaps as RFA or RFU entries) in the original registration. This information facilitates the following encoding option: if a given Packed Object contains only entries that were initially registered, the encoder may choose to utilize the original, rather than revised, ID Table. In this case, the encoder encodes the Object using the initially-registered ID Value Size, and does not encode a Version Control entry.

Note that a "minor" table revision, which only provides new definitions for RFA and/or RFU entries as describe elsewhere herein, may be utilized without encoding a Version Control entry.

2.5.2 Encoding in-System, in-Table ID Values

A data system's registered ID Table consists primarily of entries that define a compact representation of data items that are formally defined in the Packed Object's current default data system. The default data system is the system specified in the data carrier, prior to the appearance of the Packed Object (for instance, through use of a DSFID). A single entry may represent an often-used identifier (plus information about the associated data string's characteristics, in order to improve encoding efficiency). A single Base Table entry may also represent a common combination of two or more data items, or may represent a class of data items.

2.5.3 Reserved for Future Assignment (RFA) Table Entries

As a special case of In-System, In-Table identification, a Base Table may be registered that includes RFA entries (Reserved for Future Assignment), where no identifier was associated with that ID Value at the time of registration. If the entity maintaining the ID Table for a registered data format wishes to add new assignments of identifiers to RFA entries by revising the table (rather than registering a new table with a new data format identifier), it may do so, in a manner that provides complete backward compatibility, but with the following restrictions:

(1) Revised identifier assignments for originally-RFA entries should preferably denote single Identifiers, not combinations. If the revised assignment does denote a combination of identifiers, decoding systems unaware of the revision will treat the data item as if it were a single identifier (for example, these systems will not be able to parse the associated combination data into its components, prefaced by their individual identifiers, before transmission).

(2) A revised registration should not define any new or altered columns for ID Bits or Aux ID bits for any table entry that was originally listed as RFA.

Although changes to the ID Bits or Aux ID bits columns of a registered table's RFA entries are prohibited, it is permissible for the initial registration of an RFA entry to define values for these columns (with some inherent limitations, given that no identifier had yet been associated with the RFA entry).

In general, two conceptual approaches for the use of RFA entries may be supported. Note that there is no encoded flag to distinguish between these approaches. Instead, the selected approach is inherently determined by the types of information included or excluded from the table entry definition. The two alternative approaches favor either flexibility or efficiency are Basic RFA Entry and Enhanced RFA entry.

2.5.3.1 Basic RFA Entry

If an RFA entry was initially registered with no defined ID Bits or Aux ID bits, then deployed decoding systems may properly process what appear to it to be RFA ID Values, by assuming that all RFA entries use A/N encoding, and by assuming that these entries invoke no additional ID Bits or Aux ID Bits. This approach is simple to specify and to implement, and it is highly flexible in that it will allow any future data system identifier to be represented by a formerly-RFA entry. However, it has the limitation that a decoding system, unless it is updated with the revised table, will not have the information needed to translate the formerly-RFA ID value into certain output formats (such as the newly-assigned legacy ID string), and may therefore be limited to transmitting the formerly-RFA ID value and its data using the default method described elsewhere herein. To minimize the impact of this issue, a registering entity may optionally define, in the initial RFA table entry definition, a defined "legacy" pseudo-identifier in the column that normally contains an ASCII identifier. For example, GS1 could choose to define an RFA entry at table index 40 to include a pseudo-identifier of "89RFA40".

2.5.3.2 Enhanced RFA Entry

If an RFA entry was initially registered with predefined ID Bits or Aux ID bits, defined as described below, then deployed decoding systems may properly process what appear to be RFA ID Values, with the additional benefit that the new assignment's actual identifier is encoded, and its data can be more efficiently encoded, as follows: (a) The ID Bits column, if not left blank, defines encoded information sufficient for a decoding system to reconstruct a "Verbatim" identifier according to the verbatim encoding rules described elsewhere herein; and (b) Aux ID Bits may be included in the RFA entry definition, following standard Packed Object rules—however, if included, these fields will limit the future identifier assignment candidates to those whose data characteristics match the Aux ID information (such as being all-numeric, and of a certain length or length range).

The Enhanced RFA approach can provide deployed decoding systems with the information needed to translate the formerly-RFA ID value into any of the various output formats (such as legacy ID strings) described elsewhere herein, and it can provide enhanced encoding efficiency (by defining Aux ID bits). However, it adds some encoding overhead, compared to a Basic RFA entry, in order to encode the assigned verbatim identifier.

2.5.4 Reserved for Future Use (RFU) Table Entries

As a special case of In-System, In-Table identification, a Base Table may be registered that includes RFU entries (Reserved for Future Use), wherein neither identifier nor formatting information was associated with that ID Value at the time of registration. If the entity maintaining the ID Table for a registered data format wishes to provide new definitions of RFU entries by revising the table (rather than registering a new table with a new data format identifier), it may do so. However, since this revised entry may add ID Bits and/or Aux ID Bits beyond the originally registered definition, decoding systems that have not been upgraded for the revised table may not be able to properly the contents of a Packed Object containing a revised RFU entry.

In order to provide some potential for backward compatibility, each registered RFU entry defines, as its first and only ID Bit, a "Compatibility Bit." When a new definition for the RFU entry is registered, it continues to define the first ID Bit as a Compatibility Bit, but may add additional ID or Aux ID entries to the definition. If the new definition makes no changes at all to the ID or Aux ID sections, (compared to the original RFU registration), then an encoded appearance of the RFU entry may set this bit to '1', and decoding systems may process the encoded data item exactly as if it had been originally defined as a "Basic RFA" entry.

If instead, the characteristics of the revision are such that the "Compatibility Bit" must be set to '0' when the RFU entry is encoded, then deployed systems will require a table upgrade to fully process Packed Objects containing originally-RFU entries. When a decoding system encounters a Packed Object that encodes what appears to be an RFU entry with a "Compatibility Bit" set to '0', it either discards the entire Packed Object, or returns it in unprocessed (Binary) form.

Thus, it is recommended that when a new RFU definition is registered, the registering organization should reserve a "roll-out" period during which the formerly-RFU ID value may not be used in open systems, unless "quarantined" within a separate Packed Object, which may only contain one or more entries that were still RFU at the end of the most recent roll-out period (or at initial registration, if no roll-outs have yet occurred).

2.5.5 Verbatim Encoding of Off-Table (but in-System) ID Values

In order to reduce table size (and therefore ID Value size), a data system's registered ID Table may not directly represent every identifier defined in the data system. Thus, a mechanism is defined in this section, that allows a table to define one or more entries that support "verbatim" encoding of data system identifiers that are not otherwise represented in the Base Table (presumably those that are seldom used).

This same "verbatim" mechanism provides future extensibility as well. Data systems evolve over time, and new identifiers will likely be defined after the registration of the Base Table for a particular data system. At some point, the responsible entity may wish to register a new ID Table containing these new entries (which may or may not require a larger table index size). However, for some period of time (to allow for upgrades to deployed receiving systems), the registering entity may choose to prohibit the index-based encoding of newly-defined ID Table Values, and instead can require that for a transition period, newly-defined identifiers may be encoded using the "verbatim encoding" mechanism defined in the existing ID Table.

To support both of these scenarios, an ID Table may define one or more In-System "Verbatim ID" entries. The basic method for Verbatim ID Encoding is defined elsewhere herein. When used to encode one or more In-System identifiers, each such entry defines an ID Bits mechanism that explicitly encodes the new identifier, and may also define Aux ID information (or instead may rely on A/N encoding). Since current and future identifiers may follow any of several formats (all numeric, all Uppercase, digits followed by a number, etc), each "Verbatim ID" entry defines the appropriate ID encodation scheme. It is reasonable for an ID Table to define at least one Verbatim ID entry that implicitly follows the same encodation rules as the identifiers already defined within the data system, but an ID Table may also (or instead) define a Verbatim ID entry that follows a more generic rule (such as arbitrary Alphanumeric encoding, using the same rules as a Packed Object's A/N subsection).

2.5.6 Encoding Data Elements from Non-Default Data Systems

A data system's registered ID Table may include one or more entries that represent data elements defined in a data system other than the Default data system currently governing the interpretation of a Packed Object. There are numerous methods provided for this function, as described in the subsections below 2.5.6.1 Direct in-Table Reference A registration may define (typically in a secondary table) any number of non-default data system identifiers and/or combinations of such identifiers. Since the rules for processing these identifiers are fully defined when the table is initially registered, all compliant decoding systems will be able to fully process such identifiers. See also description of In-Table, Out-of-System identifiers elsewhere herein.

2.5.7 Verbatim Encoding of Out-of-System Identifiers

A registration may define one or more entries that indicate a latch (for the remainder of the Packed Object) to verbatim encoding of one or more identifiers from a specific non-default data system. Since the rules for processing these identifiers are fully defined when the table is initially registered, all compliant decoding systems will be able to fully process such identifiers and whatever rules were specified at time of registration (note however that such encoding rules are limited by the fact that a specific identifier was not assigned to this entry).

The mechanism for verbatim encoding of the ID is identical to that described elsewhere herein for verbatim encoding in the default data system, with an exception due to the fact that in this case, the verbatim encoding refers to a non-default data system. Therefore, unless the entry specifically named a single non-default data system when it was registered, additional ID Bits and Aux ID Bits are defined and encoded as follows.

Additional ID Bits represent information allowing the decoding system to construct the necessary output arcs (other than the final arc) which may be based on a specific standard such as ISO/IEC 15961. For example, an external reference to a Data Identifier may be defined as "{1 0 15961 10 mm}" or "urn:oid.1.0.15961.10.nnn" where nnn represents the final arc denoting a specific Data Identifier. Depending upon the breadth of the entry definition, a deterministic method may be specified for a representation of the varying arc or arcs ("10", or even of the arcs "1.0.15961.10"), plus an algorithm for deriving the final arc "nnn" from the verbatim encoding.

Additional Aux ID bits represent the ID encodation scheme for verbatim encoding of the final arc. In an embodiment, one of the schemes in an ID Encoding Method Table (e.g., Table 1420 illustrated in FIG. 14B) is used. These schemes include definition of the algorithm that decoding systems can use to construct a "derived ID value" which serves as the final output arc (the "nnn" described above) when that output format is utilized by the decoding system.

2.5.8 Direct Reference to an Out-of-System ID Table

A registration's Base Table may define one or more ID Values that indicate a latch for a portion of the current Packed Object to indices for a specific non-default data system's identifier table. In an embodiment, the external table is itself registered under the procedures of a specific standard such as ISO/IEC 15961-2.

For "lateral compatibility," the registering entity needs to consider the tradeoff between (a) utilizing all the features of the out-of-system table, at the expense of full compatibility, vs. (b) restricted use, which improves compatibility at the expense of encoding efficiency. These two approaches are represented via a "Usage Bit" which may be encoded as the first ID Bit invoked by the latching ID value. An exemplary Usage Bit may be defined as follows.

A usage bit having a first value (e.g., '0') indicates Full Use. Full Use encoding relies on all columns of the external table's entry, such as additional ID and Aux ID bits and/or fixed-length definitions, encoding additional bits (such as Vlen Bits) as called for in the table. Since the rules for processing these identifiers are defined in the out-of-system (external) ID table, decoding systems that are 'unaware' of the external ID table's definition details will be unable to parse a Packed Object that latches to such a table for full use.

A usage bit having a second value (e.g., '1') indicates Restricted Use. Restricted Use encoding can be fully processed by a decoding system, without access to the external table. Restricted Use encoding requires that that the encoder: (a) uses A/N encoding, regardless of the external table definition, (b) adds no encoded data for the ID or Aux ID sections, regardless of the external table definition, and (c) encodes (as leading Data characters) a decimal representation of any ID Bits called for by the external table. Such a representation may be optionally used by a decoding system as a final component or arc in an object identifier or URN. This representation may be constructed as follows: (i) the encoder treats the one or more ID Bit fields defined for that external entry as a single combined binary value; and (ii) that single binary value is encoded using the minimum number of decimal digits that preserves any leading '0' bits of the binary value, preceded by a digit indicating the number of "ID digits" thus encoded.

The definition of a latch to a non-default data system's identifier table may require additional ID Bits encoded following the Usage Bit, depending on which of the following formats are defined.

If the latch is to single data system, a Base Table definition indicates the latch is to a single specific data system and no additional encoded bits are required. The Base Table Entry definition includes: (a) information allowing the decoding system to construct the necessary identifier components such as arcs based on a specific standard such as ISO/IEC 15961. For example, an external reference to Data Identifiers may be defined as {1 0 15961 10}; and (b) information denoting the size of the new data system's ID Values, for example as shown in the exemplary ID Value sizes table 1410 of FIG. 14A.

If the external data system is explicitly encoded, a definition indicating that the choice of external data system is explicitly encoded and the entry definition includes: (a) an initial set of ID bits, indicating the bit size of the new table's ID values, for example as shown in the exemplary ID Value sizes table 1410 of FIG. 14B; and (b) definition of a fixed number of ID Bits conveying information (encoded after the ID Size Bits prescribed above) allowing the decoding system to construct the necessary intermediate identifier components such as the arc(s) below {1 0 15961} where the final arc is understood to be the ID value from the external table.

2.5.9 Proprietary/Closed System Data Elements

A data system's registered ID Table may include one or more entries that represent proprietary or otherwise closed-system data. This will enable one enterprise to encode for internal purposes with no expectation that the data will be usable in an open-system application. In an embodiment, two approaches to defining such a mechanism are permitted in a registered ID Table: Structured (which can include ID Bits for Enterprise and ID searching, and Aux ID bits for data format information) and Unstructured (which only contains a single Aux ID bit, to distinguish between A/N and 8-bit Binary data).

2.5.9.1 Unstructured Proprietary Data (UPD)

In an embodiment, a registered ID Table may define no more than one UPD entry. A UPD table entry defines a single Aux ID Bit, an "AN_or_Binary" flag. A Packed Object may contain more than one instance of a UPD unless a governing application specification prohibits duplicate IDs in a single Packed Object (or in a single data carrier).

If a "AN_or_Binary" flag has a first value (e.g., '0'), the flag indicates that the encoding of this data item follows the standard rules for A/N encoding. If not the last A/N data item in the Packed Object, then the source data ends with a separator character (as defined in the A/N Base that is chosen within the A/N Header), which is represented in the encoded A/N data.

If the "AN_or_Binary" flag has a second value (e.g., '1'), the flag is followed by a Binary Length indicator, e.g., in EBV-8 format. In this case, the data is encoded as the indicated number of 8-bit bytes (which need not be aligned on byte boundaries when encoded), in a Binary Data subsection of the Packed Object's Data Section (immediately preceding the A/N section if present).

2.5.9.2 Structured Proprietary Data (SPD)

In an embodiment, a registered ID Table may define zero or more SPD entries. An SPD table entry definition includes a fixed number of ID Bits and a fixed number of Aux ID bits.

Each defined SPD table entry defines a fixed number of ID Bits (zero is permissible). The ID Bits field can be useful, for example, during inventory operations within the enterprise that defined and encoded the SPD. If a non-zero number of ID Bits is defined, then this definition includes a leading ID bit serving as an Enterprise Indicator flag. If Enterprise Indicator Flag has a first value (e.g., '1'), then the initial encoded ID Bits represents an Enterprise Identifier, whose format is defined in the registered table. Typically, the uniqueness of the Enterprise Identifier will be assured by using the standard scheme already defined for the data system. This option supports the scenario where more than one supply chain participant may wish to encode SPD data on the same tag. If Enterprise Indicator flag has a second value (e.g., '0'), then no Enterprise Identifier is encoded. In either case, the remaining encoded ID bits are fixed in number, but the assignment of bit patterns to identifiers is the responsibility of the enterprise encoding the SPD. Note that an SPD that defines zero ID Bits is similar in structure to a UPD, except for the additional Aux ID options described immediately below.

Each defined SPD table entry defines a fixed number of Aux ID Bits. Zero is permissible, but only if the remainder of the entry's definition indicates known-length numeric-only data (fixed or variable). The SPD definition does not include a Format string, but may include combinations (in the following order only) of a Fixed Numeric substring, a Variable-length Numeric substring, and a Variable substring. If the registered definition includes either or both of the first two options, then these are encoded per standard Packed Objects rules for Known Length Numerics. If the registered definition includes the third option (for variable-length data not following Known Length Numeric encodation rules), then the definition of the Aux ID section includes an "AN_or_Binary" flag, as defined above for UPD entries. If present, this flag is encoded immediately after the Aux ID Vlen bits, if present.

2.6 Secondary ID Tables

In addition to the required Base Table of ID values, a registered ID Table definition may include one or more Secondary ID Tables. Each such Secondary Table is accessed by a reference contained in a Base ID table of the same registration. The sequential indices of a Secondary Table directly corresponds to the set of ID Bits patterns defined in the Base Table entry that references the Secondary Table. Said another way, the number of ID bits defined in the Base Table entry define the maximum number of entries in the corresponding Secondary Table.

Each Secondary Table entry contains whichever "columns" are needed to define its characteristics, including a Format string, Fixed-length and Variable-length Numeric columns, as examples. A Secondary Table entry may define additional ID Bits (beyond those that constituted its own table index, as were defined in the Base Table). If so, then these ID Bits are encoded immediately following the ID Bits that were called for by the Base Table entry.

2.6.1 In-Table, Out-of-System Identifiers

One noteworthy example of a Secondary Table is a table that supports efficient encoding of selected identifiers from one or more data systems other than the system represented by the Base Table. For example, an entry in the GS1 AI Base Table may indicate a secondary table containing a number of non-GS1 identifiers (such as DIs and TEIs) and/or combinations of such identifiers. Since the rules for processing these identifiers are fully defined when the table is initially registered, all compliant decoding systems will be able to fully process such identifiers. For the same reason, it is permissible for such entries to also specify additional ID or Aux ID information, such as instructions to utilize a fixed length or specific standard encoding method. Note that these registered secondary tables include information on how to identify the data system of each out-of-system data item in standard ways (such as listing the corresponding 15434 format number and/or DSFID data format value).

2.7 Output Representations of Base Table ID Values

Regardless of how a data item (i.e., identifier plus associated data) was encoded, the output format needs to be consistently defined for compatibility with a variety of receiving systems. Some of these systems expect data formatted in the "legacy" format of the data system while others may expect other formats. For example, some systems may expect a GS1 Expiry Date, AI 17, represented as "(17)" followed by six data digits representing a date. Other systems may expect the ID "17" and its data to be transmitted within an ISO/IEC 15434 "Format 06" envelope. Still others may expect to receive data as a URN string denoting an Object Identifier (OID) according to RFC3061 (see M. Mealling, "A URN Namespace of Object Identifiers," RFC3061, 4262 February 2001, http://www.ietf.org/rfc/rfc3061).

2.7.1 Using the Encoded ID Values without Translation

Regardless of how the ID was encoded within the Packed Object, every ID Value within a particular Packed Object may be represented in many ways. For example, an ID Value may be straightforwardly represented as an object identifier expressed as a URN according to a specific reference, such as RFC3061 with reference to ISO/IEC 15961. Such an expression of the ID Value may result in a numeric definition of the component or "arc" that represents the ID Table, followed by an arc that represents the ID Value, optionally followed by an additional qualifying arc for the cumulative value of any ID Bits that are invoked by use of that ID Value. In an embodiment, two or more distinct ID Bits fields may be concatenated into a single value and represented as a single arc.

As a hypothetical example, assume that an ID table has been registered under Data Format "99" denoting a base table for the "DataSys" data system, and that the third entry in the table (ID Value 2) invokes a set of ID Bits whose cumulative decimal value is "23." An example URN representation would be "urn:oid.1.0.15961.99.2.23."

If an identifier is encoded verbatim using the mechanism defined elsewhere herein (for example, because it is not otherwise defined in the ID Table), then for backward compatibility with receiving IS systems, a representation of that ID may use this URN representation which directly corresponds to the encoding. Thus, a "Verbatim ID" arc will be followed by an arc that corresponds to the verbatim representation of the new ID.

2.7.2 Expanding a Single ID Value to Multiple ID Values

Although the representation above can represent any Packed Object ID Value, a receiving system can optionally expand the representation of a single ID value that represents an ordered combination of multiple IDs to multiple ID values, each ID Value representing one of the constituent IDs of the combination, transmitted in sequence and according to the rules defined for each individual ID value of the combination. Under this option, the actual encoded ID Value is not itself transmitted.

This is a straightforward process with a special case to be handled. The special case occurs when a single ID value represents a combination of data system IDs, but where one or more of the constituent IDs do not have an assigned ID Value.

As a hypothetical example, assume that the "DataSys" table entry whose index is "3" is defined as a combination of commonly-associated IDs "ABC" and "DEF", where "ABC" has Table Value of 1, but where "DEF" does not have its own ID Table entry (presumably because "DEF" is either rarely or never encoded without "ABC"). If the receiving system wishes to support the transmission of individual ID values rather than the encoded combination's ID value, then it may use an algorithm that creates "Derived ID Values" from the registered ASCII string of an identifier (such as "DEF" in this example). The decoder may apply a Derived ID Value algorithm to defined ASCII strings for identifiers ("DEF" in this example) that were listed in the ID Table but were not encoded verbatim. The defined algorithm creates an ID value that is always greater than the largest value in the registered Base Table, which enables the decoding system to deterministically represent as ID values those DataSys IDs that do not have corresponding Base Table entries. In this hypothetical example, the decoder may calculate a Derived ID value for "DEF" of "1234." The "combination" ID Value of "3" can now be transmitted as two separate URNs of "urmoid.1.0.15961.99.1.XX" and "urmoid.1.0.15961.99.1234.YY" (where "XX" and "YY" represent a possible additional arc for any ID Bits that are defined for "ABC" and "DEF", respectively).

2.7.3 Translating ID Values to Alternate ISO/EIC 15961 Data Formats

A given identifier (such as "ABC" in the examples above) may have representations in multiple registered Data Formats. This can commonly occur under at least the following scenarios: (a) a particular Data System has registered more than one Base Table (for example, to provide smaller industry-specific tables); (b) a second Data System has found it useful to provide direct representation of this "out of system" identifier; or (c) a Data System has registered both a "verbatim" Data Format (not using ID Tables) and a second Data Format (representing the same set of identifiers, or a subset of them) based on the use of ID Tables.

If the entity registering an ID Table wishes to support such translations, then its Table definition must include explicit translation rules for that support.

2.7.4 Translating ID Values to "Legacy" Representations

A given data system identifier (such as "ABC" in the examples above) may well have representations in legacy output formats. For example, a given Application Identifier (AI) within the GS1 data system has traditionally been represented as a sequence of from two to four ASCII decimal digits. This AI sequence may be immediately followed by the associated data string (if encoded in a bar code) or may be followed by a non-printable ASCII character (if conveyed in an ISO/IEC 15434 format envelope).

The receiving system can optionally translate the Packed Object to these legacy formats, and the translation is usually straightforward (but may require explicit translation rules accompanying the ID Table registration). Note, however, if the entity registering an ID Table wishes to support translation to legacy formats, then it must ensure that every ID value has a corresponding legacy representation. For example, if the ID Table defines some ID Values denoting new identifiers that do not have a one-to-one correspondence to a legacy identifier, then the ID Table definition must either (a) provide a translation rule (for example, a GS1 table could state that ID Value "nn" can be translated to AI 99 or to a specified pseudo-identifier), or (B) explicitly state that receiving systems cannot perform legacy translation on a Packed Object if it contains this new identifier.

2.8 Encoding Tables

Various bases can be used for encoding data depending on the particular application or implementation. For example, a base 10 code may encode only the digits '0' through '9' as values 0 through 9, respectively ("Base 10"). An example base 30 defined by table 1100 (Table B-1) is shown in FIG. 11. This Base 30 encodation ("Base 30") encodes the capital letters and the space character in one Base 30 value, and encodes the remainder of the ASCII character set in two Base 30 values, except for the digits and the DEL character (ASCII value 127), which cannot be encoded using Base 30 encodation. Note that "space" is not part of the defined GS1 character set. Therefore, within GS1-defined data elements, value 0 from table 1100 (Table B-1) represents FNC1 (and is used to separate variable-length data items).

For situations where a high percentage of the input data's non-numeric characters would require pairs of Base 30 values, two alternative non-numeric bases, Base 74 and Base 118, are also defined.

The values in the Base 74 set correspond to the GS1 data set (a subset of ISO 646), with the digits eliminated, and with the addition of FNC1 and <space>, which are added so that Base 74 can also be used in non-GS1 applications.

The values in the Base 118 set correspond to seven-bit ASCII values and character assignments, except that characters '0' through '9' (ASCII values 48 through 57) are not supported. Therefore, the base 118 encoding subtracts 10 from the standard ASCII values for all ASCII characters whose standard value is greater than 57. Note that in GS1 data, FNC1 is represented by ASCII <GS>.

Finally, there are situations where compaction efficiency can be enhanced by run-length encoding of base indicators, rather than by character map bits, when a long run of characters can be classified into a single base. To facilitate that classification, additional "extension" bases are added for use in Prefix, Infix, and Suffix Runs (which are described in detail below).

In order to support run-length encoding of a primarily-numeric string with a few interspersed letters, Base 13 is defined, per table 1200 (Table B-2), shown in FIG. 12.

Two of these extension bases (Base 40 and Base 84)) are simply defined, in that they extend the corresponding non-numeric bases (Base 30 and Base 74, respectively) to also include the ten decimal digits. The additional entries, for characters '0' through '9', are added as the next ten sequential values (values 30 through 39 for Base 40, and values 74 through 83 for Base 84).

The extended version of Base 118 remains a base 118 set. However, within the "extended" version of that set, the Base 118 values that normally encode ASCII values 17 through 26

(corresponding to nonprintable ASCII characters 'DC1' through 'SUB') are redefined to represent the digits '0' through '9' respectively.

The number of bits required to encode various numbers of Base 10, Base 16, Base 30, Base 40, Base 74, Base 84, and Base 118 characters are shown in Chart 1300 (Chart B-1), shown in FIG. 13. In all cases, a limit is placed on the size of a single input group, selected so as to output a group no larger than 25 bytes.

3.0 Description of Example A/N Subsection

3.1 Summary of A/N Subsection

Although A/N subsections are described in the context of Packed Objects, an A/N subsection can be used within any data structure or memory type.

In an example Packed Object, an embodiment of an Alphanumeric (A/N) subsection encodes all of the Packed Object's data from any AI or DI data strings that were not already encoded in either the Custom-Compaction or Known-length-Numerics subsections. Embodiments of an A/N subsection can encode any mix of digits and non-digit ASCII characters, or eight-bit data. In an embodiment, the digit characters within this data may be encoded at an average efficiency of 4.322 bits per digit or better, depending on the character sequence. The non-digit characters may be independently encoded at an average efficiency that varies between 5.91 bits per character or better (all uppercase letters), to a worst-case limit of just under 8 bits per character (if mixed Full ASCII).

Compaction may be achieved by first concatenating the data characters into a single data string (including representations of trailing FNC1 characters or GS1 separators where needed), then classifying each of the data characters as either base 10 digits, base 30 non-numerics (primarily uppercase A-Z), and/or "Mixed non-numerics" (which includes both uppercase and lowercase alphas, and other ASCII characters). For example, see the character sets in tables 1100, 1200. In this initial classification, digits may be encoded using Base 10 and non-digits using either Base 30 or the larger "Mixed non-numerics" set. The first bit of the Alphanumeric subsection indicates the non-digit method (e.g., '0' for Base 30, and '1' for "Mixed non-numerics").

In an embodiment, two different "Mixed non-numerics" sets are defined. When an A/N subsection encodes GS1 data elements (AIs) exclusively, the "Mixed non-numerics" set contains 74 members, including only those ASCII characters specified for use by GS1 (including most punctuation characters, but excluding digits and non-printable characters) plus FNC1 and Space. When encoding an A/N subsection that includes non-AI data elements, an extra control bit may be encoded (immediately following the first A/N header bit described in the preceding paragraph), which selects between this Base 74 set and a Base 118 set (which includes FNC1 and all non-numeric ASCII characters). All characters from either of these "Mixed non-numerics" sets (except "Delete") are also accessible from Base 30 via the use of an extra "shift" value. Depending on the relative percentage of "native" Base 30 values vs. other values in the data string, one of those bases is selected as the more efficient choice for a non-numeric base.

Next, the precise sequence of numeric and non-numeric characters is recorded and encoded, using a variable-length bit pattern, called a "character map," where each '0' represents a digit and each '1' represents a non-numeric character (in the selected base). Note that, if Base 30 encoding was selected, each data character (other than uppercase letters and the space character) needs to be represented by a pair of base 30 values, and thus each such data character is represented by a pair of '1' bits in the character map.

Figure 10:
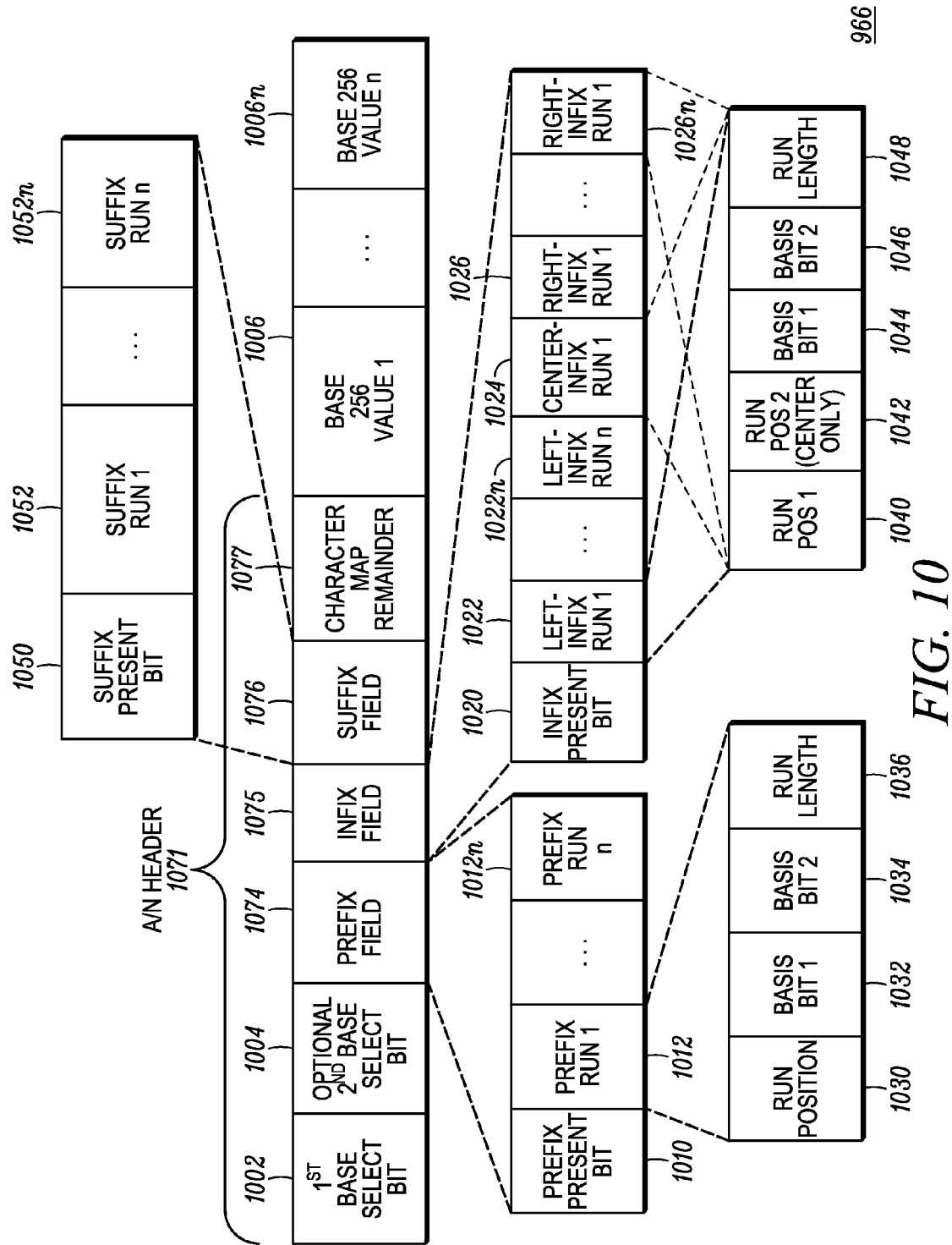
FIG. 10 depicts an exemplary A/N subsection according to embodiments of the present invention.

FIG. 10 depicts an exemplary A/N subsection 966, according to embodiments of the present invention. A/N subsection 966 when present includes an A/N header 1071 and one or more Base 256 values 1006. In an embodiment, A/N section 966 includes one to four Base 256 values 1006. In a further embodiment, A/N section 966 includes one Base 256 value 1006 converted from Base 10 and one Base 256 value 1006 converted from a non-numeric base, preceded by zero, one, or two Base 256 values 1006 for Extended bases, if called for by one or more Prefix, Infix, or Suffix Runs.

All fields referred to as "bit" or "bits" (e.g., A/N Header Bits 1071, first Base Select Bit 1002) may actually be stored in any convenient storage location or size. Just as a single "flag" stores only a "True" or "False" but may be implemented easily as a single bit or as a storage location of one or more bytes, a "bit" field may be implemented in a storage location of any size. In examples throughout this document, these "bit" and "bits" fields are described as a single bit or series bits, respectively, for clarity. The actual implementation, however, is not so limited. In some embodiments, "bit" and "bits" fields are implemented as an actual bit or series of bits for efficiency reasons. In other embodiments, a "bit" or "bits" field is implemented in storage locations of other sizes.

3.2 A/N Header 1071

An exemplary A/N Header 1071 may include a First Base Select Bit 1002, an optional Second Base Select Bit 1004, a Prefix Field 1074, an Infix Field 1075, a Suffix Field 1076, and a Character Map Remainder 1077.

First Base Select Field 1002 (e.g., one bit) indicates the choice between Base 30 or "Mixed non-numerics" for the non-numeric base.

Second Base Select Field 1004 (e.g., one bit) selects either Base 74 or Base 118 for the "Mixed non-numerics" base. This field is optional and may be omitted unless, for example, the A/N subsection contains non-AI data.

Prefix Field 1074 includes a prefix present bit 1010 plus zero or more prefix runs 1012. If prefix present bit 1010 has a first value (e.g., '0'), there is no further prefix 1074. If prefix present bit 1010 has a second value (e.g., '1'), then there are one or more prefix runs 1012. Prefix Field 1074 is described in detail below.

Infix Field 1075 includes a infix present bit 1020, a single center infix run 1024, and zero or more right infix runs 1026 and left infix runs 1022.

Suffix field 1076 includes a suffix present bit 1050 and zero or more suffix runs 1052. If suffix present bit 1050 has first value (e.g., '0'), there is no further suffix data. If suffix present bit 1052 has a second value (e.g., '1'), then there are one or more suffix runs 1052.

Character Map Remainder 1077 is a variable-length bit pattern (the remainder of a complete Character Map) representing the base of each of the data characters, if any, that were not accounted for by a Prefix 1074, Infix 1075, or Suffix 1076. Character Map Remainder 1077 is described in detail below.

3.3 Base 256 Values 1006a-1006n

"Base 256" is a misnomer in that the Base 256 values 1006 are binary. However, conversions may be viewed as conversions to a set number of bits. In an embodiment, the Base 256 values are conceptually converted to 8 bit bytes, thus the terminology of "Base 256" is applied to this binary data—even though there is no requirement for byte-wise encoding or storage. Base 256 Values 1006 represent numeric and non-numeric base 256 values and are described in detail below.

In an embodiment, if A/N section 966 is part of a Packed Object 520, the last (least-significant) bit of the final base 256 value 1006n is also the least significant bit of a Packed Object 520. If there are any remaining bit positions in the last byte to be filled with pad bits, then the most significant pad bit is be set to a first value (e.g., '1'), and any remaining less-significant pad bits is set to a second value (e.g., '0'). A decoder can determine the total number of non-pad bits in a Packed Object by examining the length section 525 of Packed Object 520. If the pad indicator bit 628 of that section is a certain value (e.g, '1'), by also examining the last byte of Packed Object 520.

Note that A/N subsection 966 ends with several variable-length bit fields—character map remainder 1077, followed by one or more base 256 sections 1006—but that the none of the lengths of these variable-length bit fields are explicitly encoded. As a result, the decoder must follow a specific procedure, using knowledge of the remaining number of data bits, in order to correctly parse A/N subsection 966, as described elsewhere herein.

3.4 Character Map Remainder 1077 Description

Character map remainder 1077 is a variable-length bit pattern. When prefix 1074, infix 1075, and/or suffix 1076 are present, character map remainder 1077 represents the base of each of the data characters, if any, that were not accounted for by prefix 1074, infix 1075, and/or suffix 1076

In general, each character in a data string is represented by one (or possible two) bits in character map 1077. Character map 1077 is a variable-length bit pattern where each '0' represents a digit and each '1' represents a non-numeric character (in the selected base). Note that, if Base 30 encoding was selected, each data character (other than uppercase letters and the space character) needs to be represented by a pair of base 30 values, and thus each such data character is represented by a pair of '1' bits in the character map. For example, data string "1A23B456c" would be represented by the character map "0100100011."

Prefix field 1074, infix field 1075, and suffix field 1076 provide a method for compressing a complete character map and perhaps leaving behind a character map remainder 1077. In an embodiment, run-length representations can be defined for specific characters from the same base. For example, where the data string includes runs of five or more character values from the same base, run-lengths can be represented in either the prefix field 1074, infix field 1075, or suffix field 1076 depending on its location within the data string. Thus, the prefix field 1074, infix field 1075, and suffix field 1076 can replace the first, central, and/or last bit pattern portions of a complete character map. As would be appreciated by persons of skill in the art, any length can be used as a run-length.

For improved efficiency in cases where the concatenated sequence of a complete character map includes runs of five or more character values from the same base, a provision is made for optional run-length representations of one or more Prefix, Infix or Suffix "Runs" (single-base character sequences), which can replace the first, central, and/or last portions respectively of the character map. A complete character map indicates the precise sequence of numeric and non-numeric characters in the data encoded in the A/N subsection.

3.5 Prefix, Infix, and Suffix Discussion

As described above, exemplary prefix 1074, infix 1075, suffix 1076 fields may have a number of runs. A run position mechanism provides two major benefits. First, it removes the length limitation described in the '050 and '053 limitations. The enhanced prefix, infix, or suffix can provide significant benefit to much larger source messages. Second, each new run of a prefix (or infix or suffix) can signify a different encoding base or character subset.

As an example, presume a message having 10 digits, followed by 8 letters, followed by 15 randomly mixed characters. The prefix representation can define a first prefix run of 10 digits immediately followed by a second prefix run of 8 letters for encoding efficiency.

In an embodiment, the definition of a prefix, infix, or suffix run allows each run to choose from one of four bases (i.e., quad-based encoding). In the case of a prefix, infix, or suffix, the overhead of indicating one of four bases is reduced an extra bit per run of up to twenty characters, for low overhead per character. Since the "mixed" portion of the message is encoded under a dual-base character map, no extra overhead is incurred in supporting two extra "extended" bases.

A large percentage of data sets can benefit from a prefix, infix, or suffix definition because of this capability for quad-base encoding of the prefix, infix, and suffix. Specific bases that support efficient encoding of substrings that are primarily (but not entirely) from a single character subset may include:

(1) For substrings consisting mostly of digits, a Base 13 "Extended Numeric" character set can be defined. An example set encodes the 10 decimal digits directly, and also encodes three shift values, so that (a) Shift1 followed by a second Base 13 value represents a letter from the set <A, B, . . . , M>; (b) Shift2 followed by a second Base 13 value represents a letter from the set <N, O, . . . , Z>; and (c) Shift3 followed by a second Base 13 value represents a Space or selected Punctuation character;

(2) For substrings consisting mostly of non-numeric characters, several (e.g. three) different "extended non-numeric" character sets can be defined. In an example with three character sets, each adds the decimal digits to a previously-defined non-numeric set. Base 40 encodes a full set of Base 30 values, and adds 10 values for the decimal digits. Base 84 similarly adds the decimal digits to the Base 74 character set by adding 10 more values. Extended Base 118 adds digit support to the Base 118 set, not by expanding the number of values, but instead by replacing ten nonprintable ASCII characters (very seldom used in AIDC applications) with the ten decimal digits.

3.5.1 Prefix Description

Optional Prefix 1074 includes a prefix present bit 1010 and zero or more prefix runs 1012. A prefix run 1012 consists of a run position bit 1030, a first basis bit 1032, a second basis bit 1034, and a three bit run length 1036.

Run position bit 1030 indicates whether more prefix runs follow. For example, a run position bit have a value of '0' may indicate that at least one more prefix run is encoded following the current one (representing another set of source characters to the right of the current set). Run position bit 1030 having a value of '1' then indicates that the current prefix run is the last (rightmost) prefix run of the A/N subsection.

First basis bit 1032 indicates a choice of numeric or non-numeric base, and the second basis bit 1034 indicates if the chosen base is extended to include characters from the "opposite" base. For example, a '00' might indicate a run-length-encoded sequence of base 10 values; then a '01' indicates a sequence that is primarily (but not entirely) digits, encoded in Base 13, a '10' would indicate a sequence a sequence of values from the non-numeric base that was selected earlier in the A/N header, and a '11' indicates a sequence of values primarily from that non-numeric base, but extended to include digit characters as well.

Run length 1036 indicates the current run length of same-base characters. In an embodiment, run length 1036 is a three bit field. Run length 1036 may be defined to assume a minimum useable run of same-base characters, for example, six. Thus a run length 1036 value of zero would imply a run length of six. In an embodiment, the length value is further divided by two. Thus the possible three-bit run length values of 0, 1, 2, . . . 7 indicate runs of 6, 8, 10, . . . 20 characters from the same base. Note that a trailing "odd" character at the end of a same-base sequence may be represented by adding a bit to the character map.

3.5.2 Suffix Description

An optional suffix 1074, if present, includes a suffix present field 1050 and a series of zero or more suffix runs 1052. An example suffix run 1052 is identical in format to an example prefix run 1012 just described. Consistent with that description, note that a run position bit indicates whether the current suffix run 1052 is the last (rightmost) suffix run of A/N subsection 966, and thus any preceding suffix runs 1052 represented source characters to the left of this final suffix run 1052.

3.5.3 Infix Description

Previous definitions of an infix (e.g., in the '050 and 053 applications) include an encoded position indicator implemented as an offset from the start of the string or the end of the prefix, if present). The number of offset bits limits the positions that could be defined for that Infix (for example, an offset of 2, 4, 8 . . . 16 for a 3-bit offset), which precludes the use of an Infix within large strings. If more bits are used for the offset, then the extra overhead would have further limited the percentage of data sets that could benefit from an Infix.

Embodiments of the present invention define Infix in such a way that no offset is encoded. In embodiments, the use of multiple Infix Runs allows the Infix to be placed almost anywhere within the data string, with a minor restriction that the center point of the remaining data string (after encoding a prefix and suffix, if so selected) has at least three encoded infix characters (of the chosen base) to the left and to the right of the center point. The infix can be asymmetrically placed at any position between the start of an arbitrarily-long string (or after the string's prefix if present) and the end of the string (or before the Suffix if present), without needing to encode its position.

A run position bit may used to indicate a center infix run, whose encoded characters (a minimum of six) must be symmetrically placed about the center point of the data (excluding prefix and/or suffix, if present). Then, zero or more left infix runs and right infix runs may be encoded adjacent to the center infix run, allowing asymmetrical placement of the infix as a whole.

A decoder may establish the center point of the data as it existed prior to infix encoding, then locate the center infix run as also centered at that center point. After that, the left and right infix runs are placed adjacent to the center run, and thus can deterministically place the entire infix in its proper position relative to those remaining characters that were encoded using a dual-base character map.

In an embodiment, optional Infix 1075 includes an infix present bit 1020 and a series of one or more infix runs, each similar in format to an example prefix run 1012, with one format difference related to the run position bit. This difference is necessary because an infix is defined as a sequence (from left to right) of zero or more left infix runs 1022, one center infix run 1024, and zero or more right infix runs 1026. This infix definition, coupled with a decoding algorithm described below, eliminates the need to encode the position of an infix 1075 (which would require a large pointer in the case of a large data stream), in exchange for the minor restriction that at least some portion of the infix 1075 spans the midpoint of the Reduced Character Map.

A center infix run 1024 "anchors" the position of infix 1075. The center infix run is centered at the center of a Reduced Character Map. The Reduced Character Map is conceptually an intermediate encoding stage of a character map between a full character map and a character map remainder—it is the remaining dual-base character map after the prefix and suffix have been removed for run-length encoding, but before an infix has been defined. Although the center infix run is always centered about the center of the Reduced Character Map, the infix's additional runs (i.e., left and right infix runs) can "grow" asymmetrically to the right and to the left of that anchor, consuming more Reduced Map bits from one side than the other. When decoding an A/N subsection 966 (using the procedure described below), a decoder may count the number of non-bitmapped values in each base (as indicated by the various prefix, infix, and suffix runs), and then determines the number of explicitly-encoded character map bits. The decoder may reconstruct the infix's character map bits (from the run lengths), noting which particular subsequence of those infix character map bits was derived from the center infix run. The decoder also may reconstruct a Reduced Character Map (i.e., the theoretical character map that would have resulted if no Infix had been utilized when encoding), taking the potential extra shift characters in Base 13 (compared to the non-numeric bases' encoding of the same data characters) into account. The decoder will ultimately insert the Infix map bits at a position such that half of the source characters represented by the center infix run bits fall below the Reduced Map's center. The Reduced Map's center is defined as the number of Reduced Map bits divided by 2, rounded down. Where an odd number of source characters are encoded by the Center infix Run (for, example, where six Base 13 values indicate three uppercase letters), the odd source character is arbitrarily defined to be to the left of the Reduced Map's center point.

Since the position of infix 1075 is calculated by the decoder, rather than explicitly encoded, the format of an infix run does not include a position indicator as in the '050 and '053 applications, the infix run format is identical to that of a prefix run, except for the following difference (to distinguish between left, center, and right infix runs).

If the first-encoded infix run's run position bit 1040 is '0', this indicates a left infix run 1022. One or more additional left infix runs 1022 may follow (each with a run position bit of '0'). A center infix run 1024 is therefore the leftmost infix run whose run position bit is '1'. This run position bit 1040, for the center infix run 1022 only, is immediately followed by a second run position bit 1042. If this second bit 1042 is '0', one or more additional runs may follow (which by definition are right infix runs 1026). If instead, the second run position bit 1042 of center infix run 1024 is also a '1', this indicates that no right infix runs 1026 follow. Right infix runs 1026, if present, have only a single run position bit 1040, which may be defined identically to that of the run position bit of a prefix or suffix run (e.g., only the final right infix run 1026 has a run position bit 1040 of '1').

3.6 Binary Data Encoding: The Base 256 Values

After the last bit of the Character Map Remainder 1077, one or more binary numbers are encoded, each representing all of the characters that were encoded in a single base system. First, a base 13 bit sequence is encoded (if one or more Prefix, Infix, or Suffix Sequences called for base 13 encoding). If present, this bit sequence directly represents the binary number resulting from encoding the combined sequence of all Prefix, Infix, and Suffix characters (in that order) classified as Base 13 (ignoring any intervening characters not thus classified) as a single value, or in other words, applying a base 13 to base 256 conversion. The number of bits to encode in this sequence is directly determined from the number of base 13 values being represented, as called for by the sum of the Prefix, Infix, and Suffix run lengths for base 13 sequences. Next, an Extended-NonNumeric base bit sequence (either base 40, base 84, or extended base 118) is similarly optionally encoded (if any Prefix, Suffix, or Infix Sequence called for Extended-NonNumeric encoding). The number of bits to encode in this sequence is directly determined from the number of extended values being represented, as called for by the sum of the Prefix, Infix, and Suffix run lengths for Extended-NonNumeric sequences.

Next, an optional base 10 bit sequence is encoded that directly represents the binary number resulting from encoding the sequence of the digits (ignoring any intervening non-digit characters) as a single value, or in other words, applying a base 10 to base 256 conversion. The number of bits to encode in this sequence is directly determined from the number of digits being represented (e.g., see chart 1300) but note that this base 10 bit sequence might be absent entirely, if the A/N Header (Runs plus character map) indicates that no base 10 digits are in the data sequence).

Immediately after the last bit of the base 10 bit sequence (if any), a non-numeric (Base 30, Base 74, or Base 118) bit sequence is encoded (if the character map indicates at least one non-numeric character). This bit sequence represents the binary number resulting from a base 30 to base 256 conversion (or Base 74 or Base 118 to base 256 conversion) of the sequence of non-digit characters in the data (ignoring any intervening digits). Again, the number of encoded bits is directly determined from the number of non-numeric values being represented, as shown in FIG. 13.

Although the base 256 values are described in a specific sequence, alternate orderings of base 256 values can be used in the present invention 3.7 Methods 3.7.1 Decoding the A/N Subsection In an embodiment, within the A/N subsection 966 of a Packed Object 520 (see, e.g., FIG. 10), the total number of data characters, the bit length of the character map, and the bit lengths of the succeeding base 256 sections (representing the numeric and non-numeric base 256 values) are not encoded.

FIGS. 15A-F depicts a flowchart 1500 of an exemplary method for decoding an A/N subsection (as part of decoding a Packed Object, or separately) according to embodiments of the present invention. The steps may occur in any order unless noted otherwise. Flowchart 1500 is described with continued reference to the embodiments of FIGS. 4-13. However, flowchart 1500 is not limited to those embodiments. Note that not all of the steps in flowchart 1500 must occur in the order shown, and some steps are optional. Not all techniques that could be used to decode an A/N subsection are described in flowchart 1500.

Figure 15A:
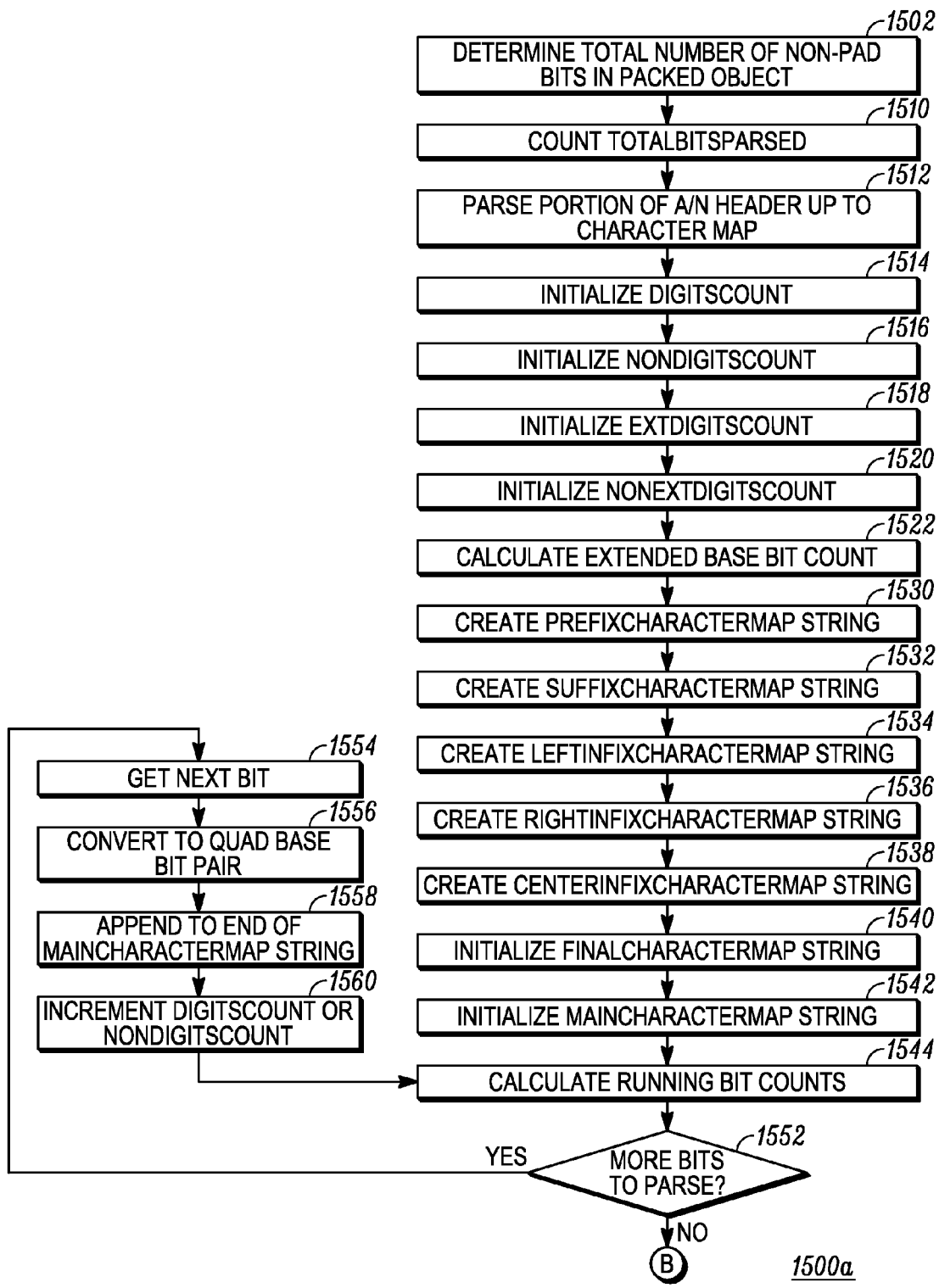
FIGS. 15A-15F show flowcharts illustrating exemplary methods for decoding an A/N subsection according to embodiments of the invention.

In step 1502 illustrated in FIG. 15A, the total number of non-pad bits in the Packed Object is determined. An exemplary method for determining the number of non-pad bits is described in steps 1504-1508 as illustrated in FIG. 15C.

Figure 15B:
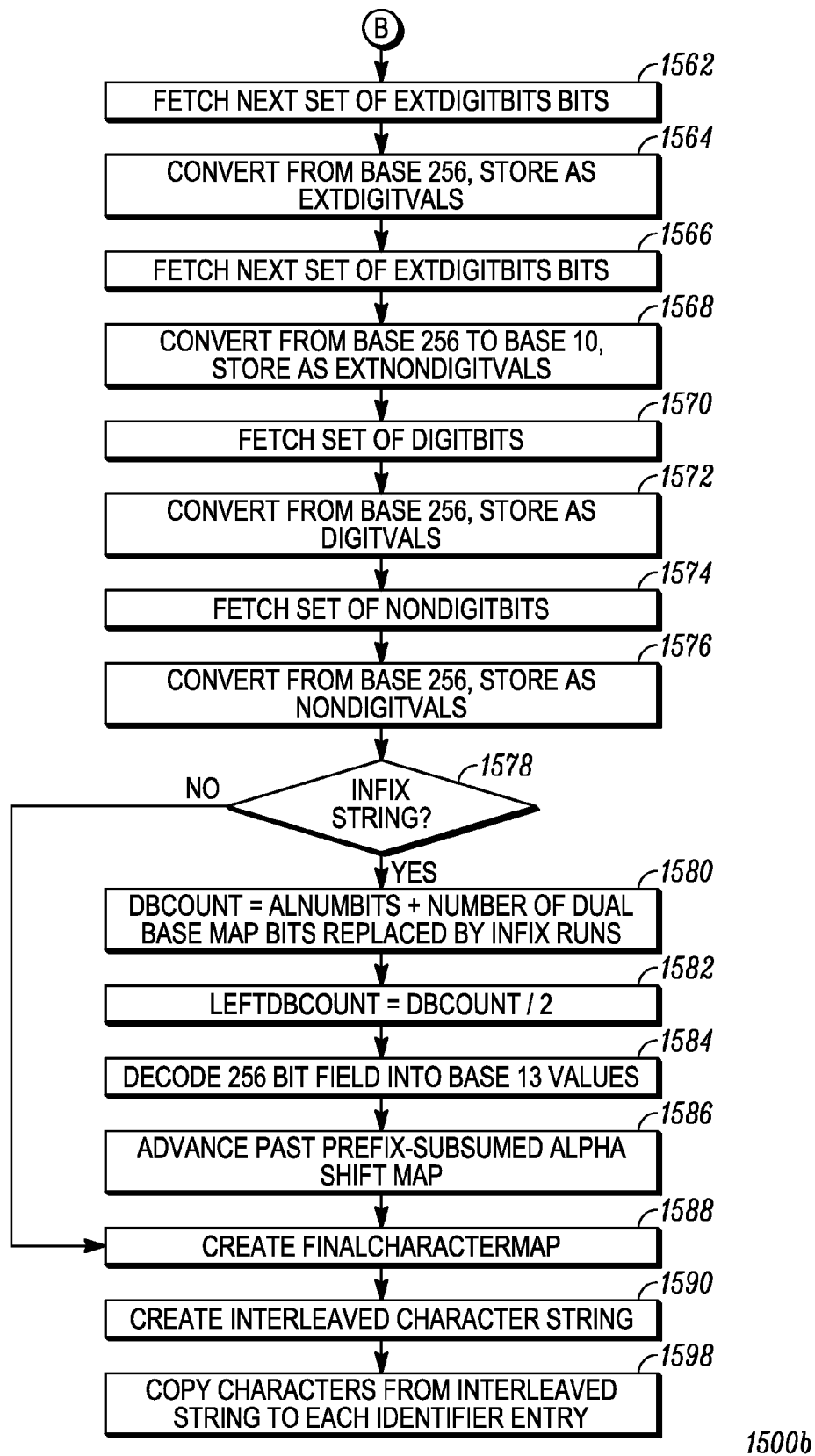
Figure 15C:
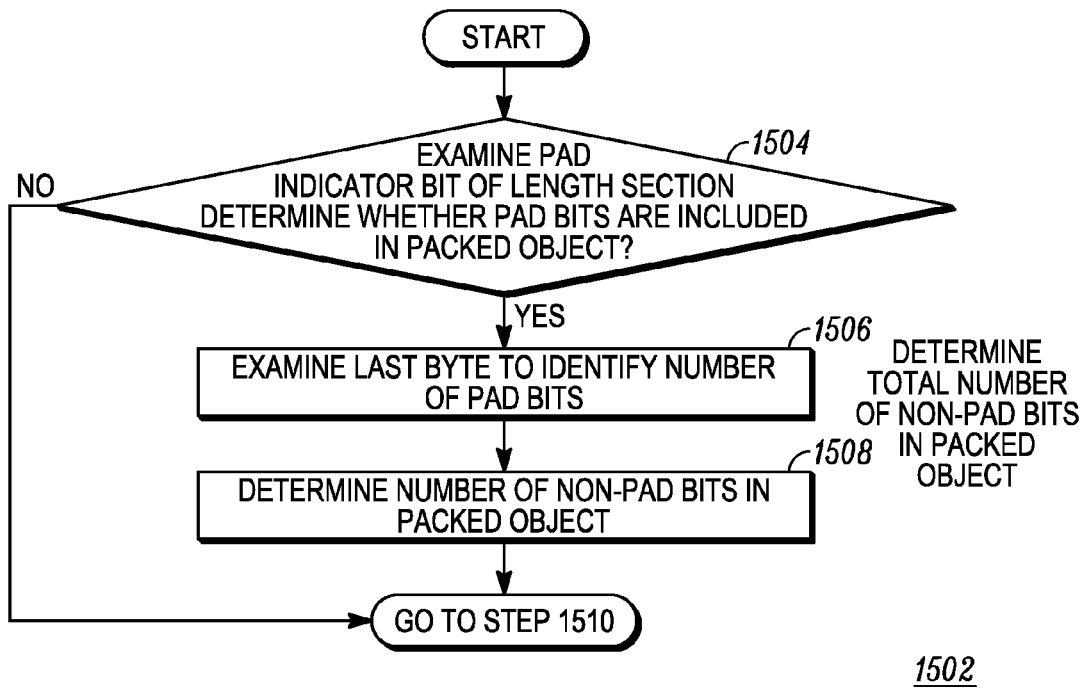

In step 1504 of FIG. 15C, the decoder examines the pad indicator bit 628 of length section 525 to determine whether the bit indicates the inclusion of pad bits (e.g., pad indicator bit value is '1'). If the pad indicator bit indicates pad bits, operation proceeds to step 1506. If the pad indicator bit indicates no pad bits, operation proceeds to step 1510 as illustrated in FIG. 15A. In this case, the number of non-pad bits is equivalent to the object length 627.

In step 1506 of FIG. 15C, the decoder examines the last byte to identify the number of pad bits. As described above in the description of the Base 256 values, in an embodiment, bitwise padding begins with the least-significant or rightmost '1' bit of the last data byte, and the padding consists of this '1' bit, plus any '0' bits to the right of that bit.

In step 1508 of FIG. 15C, the decoder determines the number of non-pad bits in the Packed Object 520. The number of non-pad bits is equivalent to the difference between the object length and the number of pad bits identified in step 1506.

Returning to FIG. 15A, in step 1510, a count is kept in TotalBitsParsed of the total number of bits parsed thus far, as each of the subsections prior to the Alphanumeric subsection is processed.

In step 1512, the initial Header bits of the Alphanumeric subsection (this number of bits depends on whether a Prefix, Infix, and/or a Suffix is encoded) are parsed, up to but not including the Character Map Remainder, and this number is added to the previous value of TotalBitsParsed.

In step 1514, a DigitsCount is initialized to the total number digits (e.g., base 10 values) indicated by the Prefix, Infix, and Suffix (which may be zero).

In step 1516, a NonDigitsCount is initialized to the total number non-digit (e.g., base 30, base 74, or base 118) values indicated by the Prefix, Infix, and Suffix (which may be zero).

In step 1518, an ExtDigitsCount is initialized to the total number of primarily digit, extended character set (e.g., base 13) values indicated by the Prefix, Infix, and Suffix (which may be zero).

In step 1520, an ExtNonDigitsCount is initialized to the total number of mostly non-digit, extended character set (e.g., base 40, base 84, or base 118) values indicated by the Prefix, Infix, and Suffix (which may be zero).

In step 1522, the Extended-base Bit Counts are calculated. In an embodiment this calculation is performed according to steps 1524-1528 as illustrated by flowchart 1522 illustrated in FIG. 15D.

Figure 15D:
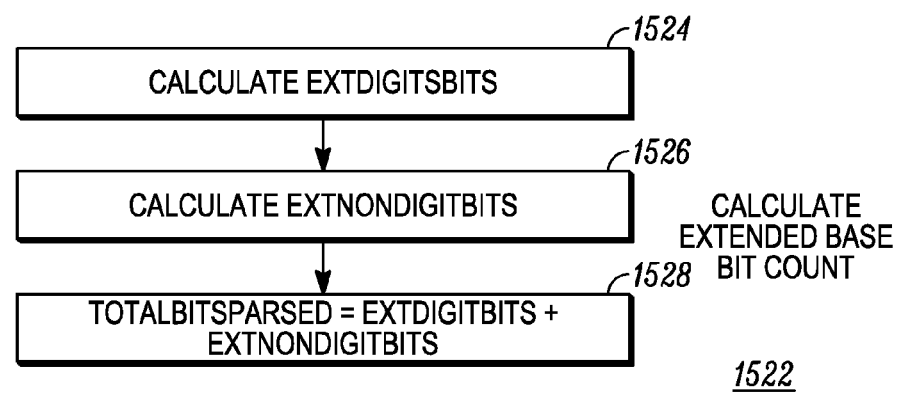

In step 1524 of FIG. 15D, the number of bits required encode the number of extended character set, mostly digit (e.g., base 13) values indicated by ExtDigitsCount. This number is referred to as ExtDigitBits. Predefined tables of character sets of different bases are used. In an exemplary embodiment, the tables in FIGS. 11-12 are used to calculate ExtDigitBits as the number of bits required to encode the number of base 13 values indicated by ExtDigitsCount.

In step 1526 of FIG. 15D, the number of bits required to encode the primarily non-digit, extended character set (e.g., base 40, 84, or 118) values indicated by ExtNonDigitsCount is calculated. This number is referred to as ExtNonDigitBits. In an exemplary embodiment, the tables in FIGS. 11-12 are used to calculate ExtNonDigitBits as the number of bits required to encode the number of base 40 (or base 84 or Base 118) values indicated by ExtNonDigitsCount.

In step 1528 of FIG. 15D, ExtDigitBits and ExtNonDigitBits are added to TotalBitsParsed.

Returning to FIG. 15A, in step 1530, a PrefixCharacterMap bit string is created. A PrefixCharacterMap bit string is a sequence of zero or more quad-base character-map pairs as indicated by the Prefix bits just parsed, using a unique quad-base bit pair for each base encoded. In an exemplary embodiment, quad-base bit pairs are defined as follows, '00' indicates a digit (e.g., base 10) value; '01' indicates a primarily digit, extended character set (e.g., base 13) encoded value; '10' indicates the non-numeric base (e.g., base 30, 74, or 118) that was selected earlier in the A/N header, and '11' indicates the extended version of the non-numeric base (e.g., base 40, 84, or 118) that was selected earlier.

In step 1532, a SuffixCharacterMap bit string is created. A SuffixCharacterMap bit string is a sequence of zero or more quad-base character-map pairs, as indicated by the Suffix bits just parsed, using the quad-base bit pairs used in Step 1530.

In step 1534, a Left infixCharacterMap bit string is created. A Left infixCharacterMap bit string is a sequence of quad-base character-map pairs, as indicated by the Infix bits just parsed using the quad-base bit pairs used in Step 1530.

In step 1538, a Center infixCharacterMap bit string is created. A center infixCharacterMap bit string is a sequence of quad-base character-map pairs, as indicated by the Infix bits just parsed, using the quad-base bit pairs used in Step 1530.

In step 1536, a Right infixCharacterMap bit string is created. A Right infixCharacterMap bit string is a sequence of quad-base character-map pairs, as indicated by the Infix bits just parsed, using the quad-base bit pairs used in Step 1530.

In step 1540, a FinalCharacterMap bit string is initialized to an empty string.

In step 1542, a MainCharacterMap bit string is initialized to an empty string In step 1544, running Bit Counts are calculated. In an embodiment, running bit counts are calculated according to steps 1546-1550 as shown in flowchart 1544 illustrated in FIG. 15E.

Figure 15E:
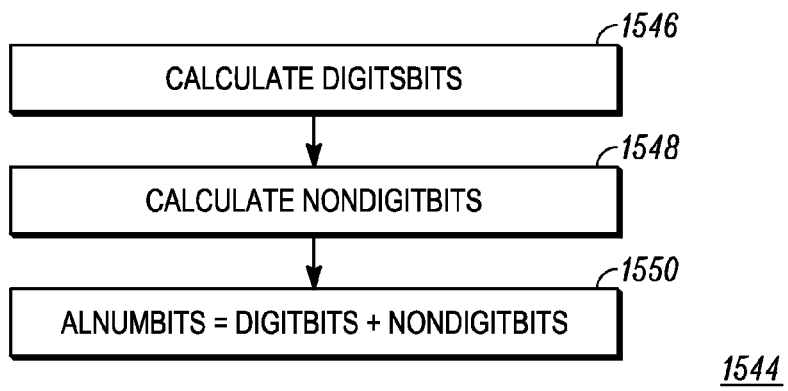

In step 1546 of FIG. 15E, the number of bits required to encode the number of digits (e.g., base 10) values currently indicated by DigitsCount. This number is referred to as DigitBits. In an exemplary embodiment, chart B-1 illustrated in FIG. 13 is used to determine this number.

In step 1548 of FIG. 15E, the number of bits required to encode the number of non-digit (e.g., base 30, 74 or 118) values currently indicated by NonDigitsCount is calculated. This number is referred to as NonDigitBits. In an exemplary embodiment, chart B-1 illustrated in FIG. 13 is used to determine this number.

In step 1550 of FIG. 15E, AlnumBits is set equal to the sum of DigitBits plus NonDigitBits Returning to FIG. 15A, In step 1552, a determination of whether additional bits are to be parsed is made. If the sum of TotalBitsParsed and AlnumBits equals the total number of non-pad bits in the Packed Object, then no more bits remain to be parsed from the character map remainder, and so the remaining bit patterns—representing base 256 values—are ready to be converted back to the appropriate base or extended base values (e.g., extended bases 13, 40, 84 or 118 and base values 10, 30, 74, and 118), and operation proceeds to step 1562. If bits remain to be parsed, operation proceeds to step 1554.

In step 1554, the next encoded bit is retrieved from the encoded Character map Remainder.

In step 1556, the bit from step 1554 is converted to a quad-base bit-pair according to the pre-defined convention. For example, if using the quad-base bit pair convention used in the example presented in step 1530, each '0' may be converted to '00' and each '1' may be converted to '10'.

In step 1558, the converted quad-base bit-pair from step 1556 is appended to the end of the MainCharacterMap bit string.

In step 1560, DigitsCount and NonDigitsCount are appropriately incremented. For example, if using the above convention of step 1556, if the encoded map bit from step 1554 was '0', DigitsCount is incremented. If the bit was '1', NonDigitsCount is incremented. Operation then returns to step 1544.

Moving to FIG. 15B, in step 1562, the next set of bits, whose length is indicated by ExtDigitBits, is retrieved.

In step 1564, the bits retrieved in step 1562 are converted to a series of extended character set, mostly digit (e.g., base 13) values from the stored binary format (e.g., base 256 values). The resulting array of values is stored as ExtDigitVals.

In step 1566, the next set of bits, whose length is indicated by ExtNonDigitBits, is retrieved.

In step 1568, the bits retrieved in step 1566 are converted to a series of extended character set, mostly non-digit (e.g., base 40, 84, or 118 depending on the selection in the A/N header) values from the stored binary format (e.g., base 256 values). The resulting array of values is stored as ExtNonDigitVals.

In step 1570, the next set of bits, whose length is indicated by DigitBits, is retrieved.

In step 1572, the bits retrieved in step 1570 are converted to a series of digit (e.g., base 10) values from the stored binary format (e.g., base 256 values). The resulting array of values is stored as DigitVals.

In step 1574, the final set of bits, whose length is indicated by NonDigitBits, is retrieved.

In step 1576, the bits retrieved in step 1574 are converted to a series of non-digit (e.g., base 30 or 118 depending on the selection in the A/N header) values from the stored binary format (e.g., base 256 values). The resulting array of values is stored as NonDigitVals.

In step 1578, If no Infix string resulted from the previous decoding steps, go to step 1588. Otherwise, go to step 1580 and proceed to determine the placement of the Infix string.

In step 1580, a count of "Reduced Map" bits is created and is referred to as a dual base count (DBCount). A Reduced Map conceptually corresponds to an intermediate encoding stage where the input string has been "reduced", that is, any identified Prefix Runs and Suffix Runs (constituting many sequential characters from the same base) have been identified and removed from the left and right ends of the input string, and the remaining input has been rendered as a dual-base character map. The DBcount is divided by two to indicate the location of the center of the Center infixCharacterMap bit string within the Reduced Map (i.e., within the substring not run-length encoded via a Prefix or Suffix). In an exemplary embodiment, the dividing by two is performed and then rounded down. In order to create DBcount, the decoder calculates the sum of AlnumBits (i.e., the number of bits actually encoded as the character map) plus the number of dual-base map bits that were ultimately replaced by the Infix Runs. In calculating this last quantity, there is one exception to the normal one-to-one correspondence between the number of original dual-base map bits that were ultimately subsumed in the Infix and the sum of the Infix Run Lengths. That is, when the extended base, mostly digit (e.g., Base 13) is invoked by an Infix Run, capital letters and Space require two of the (e.g., Base 13) values, but only required one dual-base map bit, not two. Thus, for example, a Base 13 value of 10 or 11, or a Base 13 value of 12 (if followed by a value of zero), constitutes an "Alpha Shift Value" that would not have been needed if encoding in a non-numeric (e.g., Base 30 or any higher) base. Therefore in this example, the decoder can calculate DBcount by summing AlnumBits with the number of values indicated by the three previously-stored Infix maps, but then subtracting one for each Base 13 "Alpha Shift Value" found in the ExtDigitVals array. This procedure will be detailed in the following steps 1582-1586.

In step 1582, the DBcount is divided by two to initialize the LeftDBcount. LeftDBCount corresponds to the center of the Reduced Map as counted from the left, and will eventually indicate the number of encoded dual-base map bits that correspond to characters to the left of the Infix. In an exemplary embodiment, the dividing by two is performed and then rounded down.

In step 1584, the extended-Numeric base 256 bit field is decoded into a series of extended character set, mostly digit (e.g., base 13) values. At this stage, a full decode is not necessary; instead a single-bit representation of each extended character set, mostly digit (e.g., base 13) value would suffice. For example, each '1' bit may indicate an Alpha Shift value (as defined above), and each '0' bit represents any other Base 13 value. The present description uses this Alpha Shift Map approach.

In step 1586, using the previously-calculated PrefixCharacterMap bit string, the portion of the Alpha Shift Map that was subsumed in a Prefix is advanced past. Then, the Left infixCharacterMap bit string and left half of the Center infixCharacterMap bit string is used to decrement LeftDBcount once for each left-of-center dual-base map bit that was ultimately subsumed into the Infix (and thus was not encoded as a character map remainder bit). When performing this step, each quad-base map bit pair of the left infix or left-half-of-center infix map causes one LeftDBcount decrement, except that when an infix bit is part of a mostly digit, extended character set (e.g., Base 13) run, only decrement LeftDBcount when appropriate (e.g., the Alpha Shift Map entry corresponding to the current infix map entry is a '0').

Once the Left Infix and the left half of the center infix have been processed as just described, the resulting value of LeftDBcount exactly equals the number of encoded dual-base character map bits that represent characters to the left of the Infix-encoded characters. All but these leftmost character map bits instead represent characters to the right of the Infix characters.

In step 1588, the FinalCharacterMap bit string is created by copying to it, in this order, the previously-created PrefixCharacterMap bit string, then the first (leftmost) LeftDBcount entries of the MainCharacterMap string, then the Left infixCharacterMap string, the Center infixCharacterMap string, and the Right infixCharacterMap string. Then the remaining entries from the MainCharacterMap string are copied, and finally the previously-created SuffixCharacterMap bit string is appended to the end of the FinalCharacterMap string. A complete quad-base Character Map of the encoded data has been reconstructed.

Figure 15F:
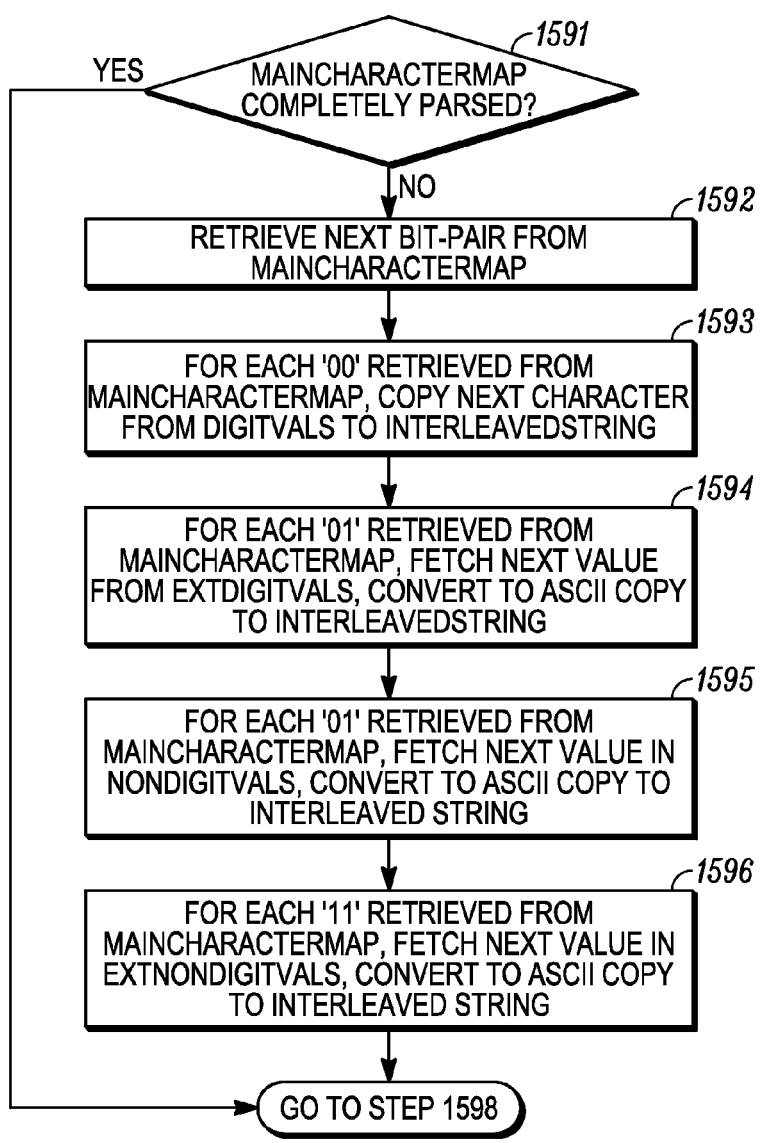

In step 1590, an interleaved character string is created. The interleaved character string represents the concatenated data strings from all of the non-numeric data strings of the Packed Object. The interleaved character string is created by parsing through the MainCharacterMap and applying the quad-base pair convention as used in step 1530. An exemplary embodiment of the process to perform this step is described in steps 1591-1596 as illustrated in FIG. 15F. This example embodiment assumes the quad-base pair convention of step 1530.

In step 1591 of FIG. 15F, a determination is made if the MainCharacterMap has been completely parsed. If so, then the interleaved character string has been completed and operation proceeds to step 1598. If not, then the interleaved character string is not yet complete and operation proceeds to step 1592.

In step 1592 of FIG. 15F, the next quad base bit-pair is retrieved from MainCharacterMap.

In step 1593 of FIG. 15F, if a '00' bit-pair was retrieved from MainCharacterMap, the next value from DigitVals is copied to InterleavedString. In an exemplary embodiment, 48 is added to each value to convert it to ASCII prior to copying it to InterleavedString.

In step 1594 of FIG. 15F, if a '01' bit-pair was retrieved from MainCharacterMap, the next value from ExtDigitVals is retrieved. That value is converted to ASCII. In an exemplary embodiment, a predefined table such as Table B-2 illustrated in FIG. 12 is used for the conversion. If the value is a shifted extended character set value as discussed above (e.g., a base 13 shift), then increment past the next '01' pair in the MainCharacterMap, and use that Base 13 shift value plus the next Base 13 value from ExtDigitVals to convert the pair of values to ASCII. The result is copied to InterleavedString.

In step 1595 of FIG. 15F, if a '10' bit-pair was retrieved from MainCharacterMap, the next character from NonDigitVals is retrieved. That value is converted to an ASCII value. In an embodiment, a predefined table such as Table B-1 of FIG. 11 is used for the conversion. The resulting ASCII value is copied to InterleavedString. Note that if '10' bits may represent a base with shift characters (e.g, base 30, but not Base 74 or non-extended Base 118 as described above). For example, some Base 30 values represent Shift characters. When one of these is encountered, the next '10' bit-pair in the MainCharacterMap is skipped, an additional Base 30 value from NonDigitVals is retrieved, and the retrieved pair of base 30 values is converted to a single ASCII value (for example, using a predefined table such as Table B-1 of FIG. 11).

In step 1596 of FIG. 15F, if a '11' bit-pair was retrieved from MainCharacterMap, the next character from ExtNonDigitVals is retrieved. That value is converted to an ASCII value. In an embodiment, a predefined table such as Table B-1 or Table B-2 of FIGS. 11 and 12 are used to perform this conversion. The resulting ASCII value is copied to InterleavedString. Some retrieved base values represent shift characters. If a retrieved base value represents a Shift character, the next '11' bit-pair in the MainCharacterMap is skipped, an additional value from ExtNonDigitVals is retrieved, and the pair of values is converted to a single ASCII value.

In step 1598, is reached once the full MainCharacterMap has been parsed and the InterleavedString is completely populated. In this step, starting from the first non-numeric ID (e.g., AI or DI) on the ID list, characters from the InterleavedString are copied to each such ID (e.g., AI or DI) entry, ending each copy operation at the next delimiter (e.g., space character if AI or GS if DI) in InterleavedString, or at the end of the InterleavedString, whichever comes first.

3.7.2 Encoding Data Items

Figure 16A:
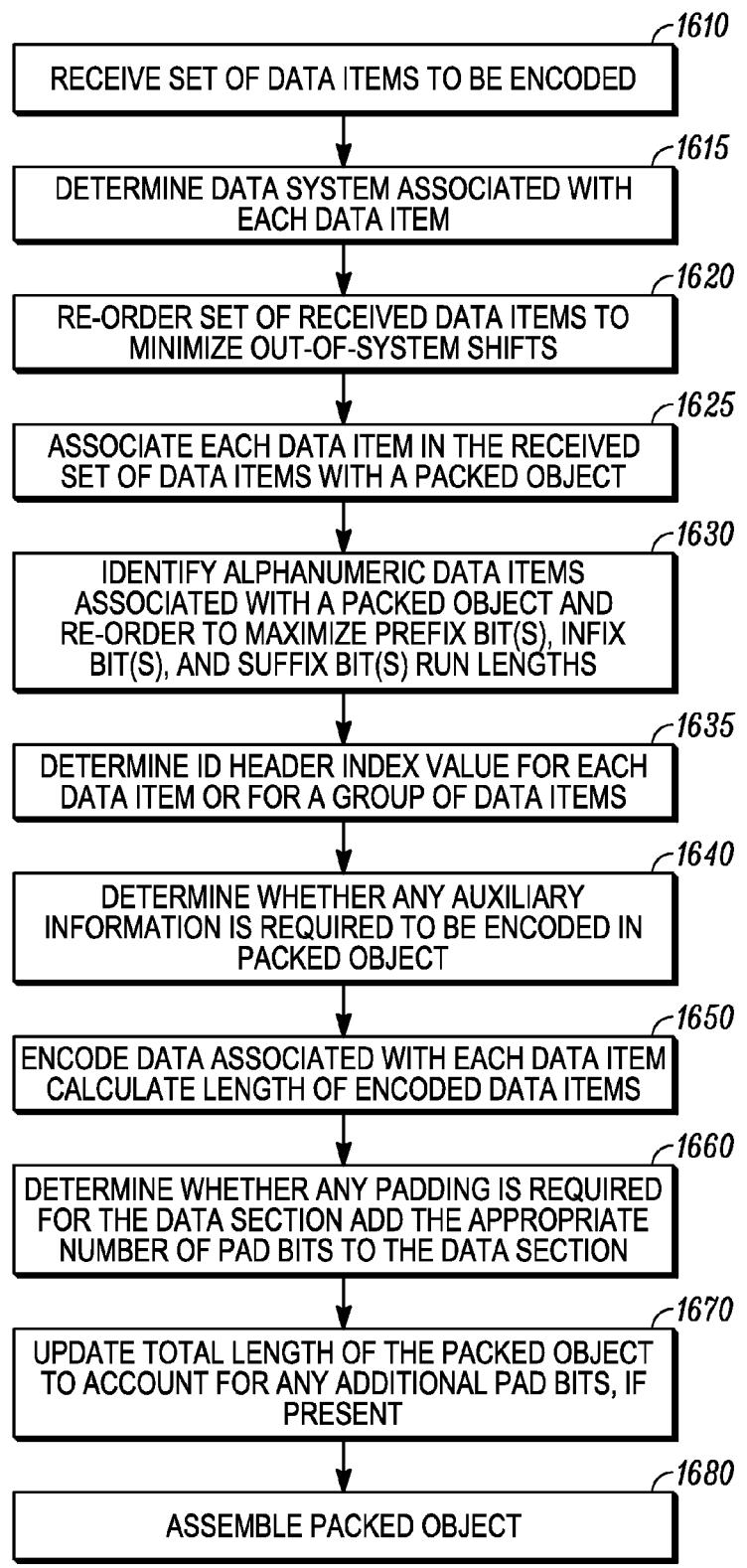
FIG. 16A shows a flowchart illustrating an exemplary method for encoding an A/N subsection and assembling a Packed Object according to embodiments of the invention.

The following section describes methods for encoding a Packed Object according to embodiments of the invention. Encoding may be performed by any suitable computing device, including but not limited to, an RFID reader. FIG. 16A depicts a flowchart 1600 of an exemplary high-level method for encoding a Packed Object according to embodiments of the present invention. Flowchart 1600 is described with continued reference to the embodiments of FIGS. 4-13. However, flowchart 1600 is not limited to those embodiments. Note that not all of the steps in flowchart 1600 must occur in the order shown. Not all techniques that could be used to encode a Packed Object are described in flowchart 1600. These additional techniques are described above or would be apparent from the description of user memory format 460.

In step 1610, a set of data items to be encoded is received.

In step 1615, a determination of the data system associated with each data item is made.

In step 1620, the set of received data items may be re-ordered to minimize out-of-system shifts. Step 1620 is optional. Since the first ID listed in a Packed Object 520 establishes the default data system within that Packed Object 520, an encoder can count the IDs from each data system, and employ either or both of two strategies. First, the "majority" data system may be placed first on the list. In addition or alternatively, the list may be split between two or more Packed Objects 520, of different default systems, to minimize the number of out-of-system "Shifts" within each of Packed Object 520.

In step 1625, each data item in the received set of data items is associated with a Packed Object 520. Step 1625 is optional. A subtle advantage of a Packed Object structure is that, at the source, the encoder can be instructed to group specific data items together, in order to ensure that they cannot be re-written separately or independently in the future. This can help ensure that data items with interdependencies stay synchronized. For example, a change in packaging is likely to change more than one of the Logistics Width, Length, and Height AI's stored for a given item. Thus, as an added safety measure, these should be stored in the same Packed Object 520.

In step 1630, the alphanumeric data items associated with a Packed Object are identified and re-ordered to maximize Prefix bit(s), Infix bit(s), and Suffix bit(s) run lengths. Step 1630 is also optional. Since the total encoded length of a series of Fixed and/or Known-Length Numeric subsection data items is the same, regardless of the order in which their IDs are listed, the encoder is free to reorder and group the A/N IDs without constraint.

In addition or alternatively, in step 1630 A/N data can be split using two or more A/N Headers. Splitting A/N data inherently increases overhead by requiring additional A/N Headers, and can further reduce efficiency by eliminating long same-base runs (such as those that can be created by the intelligent reordering of A/N IDs as just described). However, in some cases better runs can be created by separating the items. For example, two data items may each both begin and end with a numeric run. If combined, however, a maximum of only three runs can be specified, and one will be "lost." Furthermore, the encoder should examine the characteristics of each A/N data item independently, and if certain characteristics differ strongly, then it may be more efficient to split the A/N items. For example, if only one of two A/N items requires Base 118, then the non-numeric encoding efficiency of the other item will be impaired if they are grouped.

In step 1635, the ID index value for each data item or for a group of data items is determined. As described above, a set of IDs may be grouped together in the ID index. If two or more data items in the set are present, these data items will be assigned a single index in the Packed Object. The ID index values are then encoded in ID Values subsection 732 of ID Section 530.

In step 1640, a determination is made whether any auxiliary information is required to be encoded in Packed Object 520. For example, the ID table entry for the data item may include data which requires an Aux ID to be encoded in Aux ID section 540. Additionally, the formatting rules for a data item may indicate auxiliary information is required. The Aux ID information is then encoded in Aux ID section 540.

In step 1650, the data associated with each data item is encoded and the length of each encoded data item is calculated. The current length of the Packed Object may also be determined in this step. Note that for alphanumeric data items, the alphanumeric (A/N) header information is also encoded in this step. In an embodiment, step 1650 is performed according to the process illustrated by flowchart 1650 in FIG. 16B and described elsewhere herein.

In step 1660, the encoder determines whether any padding is required for the data section 560 and adds the appropriate number of pad bits to the data section.

In step 1670, the total length of the Packed Object is updated to account for any additional pad bits, if present. In addition, the pad bit indicator value is set to indicate whether any pad bits were added. The length section 525 is updated to include the object length and pad indicator value.

In step 1680, the Packed Object 520 is assembled as illustrated in FIG. 5.

3.7.2.1 Encoding Data Including the A/N Subsection

In an embodiment, an A/N subsection 966 is encoded into a Packed Object. However, the methods described herein for encoding data are applicable to any data structure which contains an A/N subsection structure.

Figure 16B:
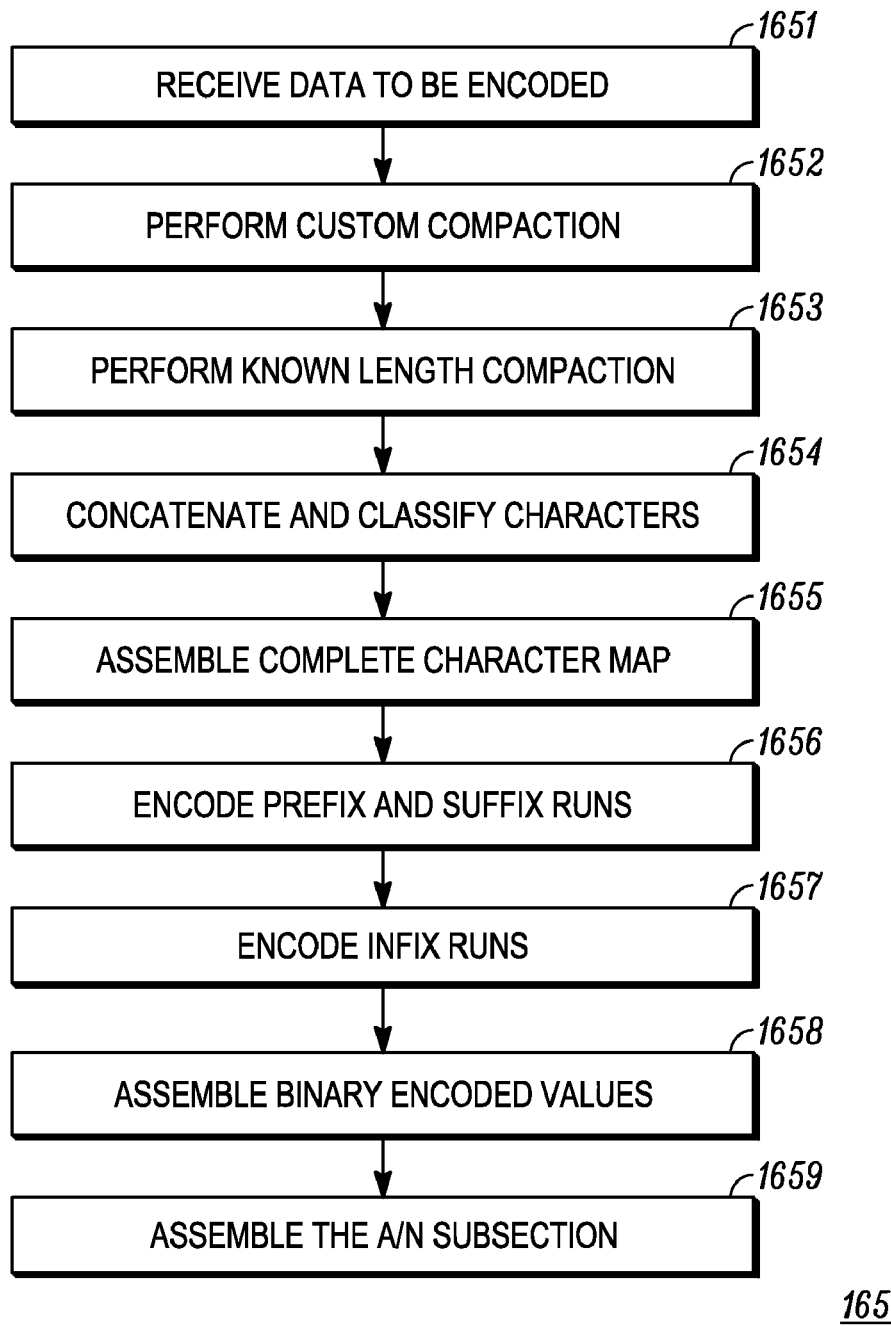
FIG. 16B shows a flowchart illustrating an exemplary method for encoding an alphanumeric string according to embodiments of the invention.

FIG. 16B depicts a flowchart 1650 of an exemplary embodiment of a method for encoding data into an A/N subsection (as part of encoding a Packed Object or separately) according to embodiments of the present invention. For example, flowchart 1650 describes a process which may be used in performing step 1650 of flowchart 1600. Note that not all of the steps in flowchart 1650 must occur in the order shown, and some steps are optional. Not all techniques that could be used to decode an A/N subsection are described in flowchart 1650. The details of each step, for some embodiments, are explained in greater detail elsewhere herein.

In step 1651, character string data to be encoded are received.

In step 1652, if any subset of the data is marked to for a custom compaction method (e.g., six digit date data), custom compaction is performed on that portion of the data. This step is optional.

In step 1653, if any of the data is known-length numeric (fixed or variable) strings of characters, known length compaction is performed on that portion of the data. This step is optional.

For any data remaining after steps 1652 and 1653, steps 1654 to 1659 are performed.

In step 1654, the (remaining) characters are concatenated and classified. In this step, characters which have not been compacted in previous steps (e.g., steps 1652 or step 1653 if performed) are assembled into a single data string. This includes trailing FNC1 and GS1 separators where appropriate. Each character is then classified into a representation base. For example, digits may be classified as base 10, uppercase into base 30, etc. as described above. The specific example character sets and base designations are merely exemplary. In an embodiment, this classification also includes the mixed non-numeric sets and extended sets as described above.

In step 1655, the complete character map is assembled. In this step, the sequence of numeric and non-numeric character classifications is encoded. In an embodiment, the encoding results in a string of bits, where each substring of one or more bits represents a digit or non-numeric symbol. For example, a map of single bits with '0' for digits and '1' for non-numerics is a simple character map. In an embodiment, a character map includes a map of quad-base bit pairs, for example as described above in step 1530 of flowchart 1500.

In step 1656, prefix and suffix runs are encoded and the runs are removed from the complete character map. A run is a substring within the input data of the same base classification. For example, if digits are classified as base 10 in step 1654, then a string of eight digits in a row is a run of eight base 10 characters. Thus, for example, where the data string includes runs of five or more character values from the same base, the run-length can be represented in either the prefix field, infix field, or suffix field depending on its location within the data string. In an embodiment, the prefix and suffix runs are formatted as described in FIG. 10 and accompanying text herein.

In step 1657, the left, right, and center infix runs are encoded. The center infix run is anchored at the center of the reduced map. The reduced map is the remaining character map after the prefix and suffix runs have been encoded and the runs removed from the character map. The complete character map was assembled in step 1655. In an embodiment, the infix runs are formatted as described in FIG. 10 and accompanying text herein.

In step 1658, the binary encoded values are assembled. According to the classification made in step 1654, the characters are assembled into separate substrings retaining the relative order (e.g., all base 10 characters in one substring in the same order relative to each other in the original string of characters). Thus, each substring corresponds to a set of single base system characters (with locations referenced by the complete character map). Each substring is then binary encoded. In an embodiment, the encoding is performed by converting each single base substring to a base 256 number. In a further embodiment, up to four binary encoded values (e.g., up to four base 256 values) are encoded as described elsewhere herein.

In step 1659, the A/N subsection is assembled, including the encoded character map and the binary encoded (e.g., base 256) values. Any prefix, infix, suffix, and character map remainder from the previous steps are concatenated to assemble the encoded character map. Each of prefix, infix, or suffix is optional. That is, a particular data set may not result in a prefix (or suffix or infix or any combination of the three). Conversely, another data set may be described completely by runs and leave no remainder. The binary encoded values are then concatenated to the encoded character map and any base select bits are inserted. In an embodiment, the A/N subsection is formatted as described in FIG. 10 and accompanying text herein.

4.0 Example Computer System

Various aspects of the present invention can be implemented by software, firmware, hardware, or a combination thereof. Calculations may be approximated using table lookups. Hardware implementations of individual components are not limited to digital implementations and may be analog electrical circuits. Additionally, embodiments may be realized in a centralized fashion in at least one communication system, or in a distributed fashion where different elements may be spread across several interconnected communication systems. Any kind of computer system or other apparatus adapted for carrying out the methods described herein may be suited.

Figure 19:
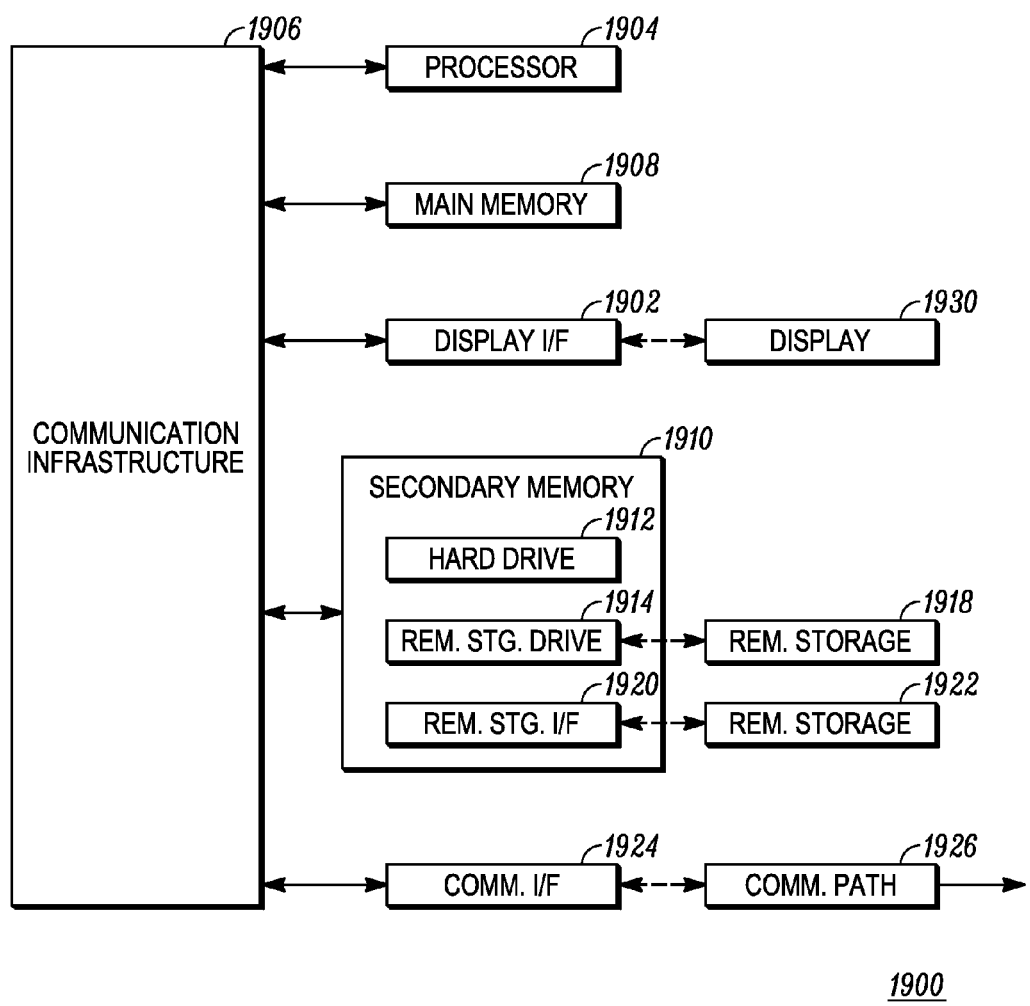
FIG. 19 shows an example computer system in which embodiments of the present invention may be implemented.

FIG. 19 illustrates an example computer system 1900 in which the present invention, or portions thereof, can be implemented as computer-readable code. For example, the methods described above and illustrated by the flow charts 1500, 1502, 1522, 1544, 1590, 1600, 1650, 1700, 1750, and 1800 as shown in FIGS. 15A-F, 16A, 16B, 17A, 17B, and 18 can be implemented in system 1900. Various embodiments of the invention are described in terms of this example computer system 1900. After reading this description, it will become apparent to a person skilled in the relevant art how to implement the invention using other computer systems and/or computer architectures.

Computer system 1900 includes one or more processors, such as processor 1904. Processor 1904 can be a special purpose or a general purpose processor. Processor 1904 is connected to a communication infrastructure 1906 (for example, a bus or network).

Computer system 1900 also includes a main memory 1908, preferably random access memory (RAM), and may also include a secondary memory 1910. Secondary memory 1910 may include, for example, a hard disk drive 1912, a removable storage drive 1914, any type of non-volatile memory, and/or a memory stick. Removable storage drive 1914 may comprise a floppy disk drive, a magnetic tape drive, an optical disk drive, a flash memory, or the like. The removable storage drive 1914 reads from and/or writes to a removable storage unit 1918 in a well known manner. Removable storage unit 1918 may comprise a floppy disk, magnetic tape, optical disk, etc. which is read by and written to by removable storage drive 1914. As will be appreciated by persons skilled in the relevant art(s), removable storage unit 1918 includes a computer usable storage medium having stored therein computer software and/or data.

In alternative implementations, secondary memory 1910 may include other similar means for allowing computer programs or other instructions to be loaded into computer system 1900. Such means may include, for example, a removable storage unit 1922 and an interface 1920. Examples of such means may include a program cartridge and cartridge interface (such as that found in video game devices), a removable memory chip (such as an EPROM, or PROM) and associated socket, and other removable storage units 1922 and interfaces 1920 which allow software and data to be transferred from the removable storage unit 1922 to computer system 1900.

Computer system 1900 may also include a communications interface 1924. Communications interface 1924 allows software and data to be transferred between computer system 1900 and external devices. Communications interface 1924 may include a modem, a network interface (such as an Ethernet card), a communications port, a PCMCIA slot and card, or the like. Software and data transferred via communications interface 1924 are in the form of signals which may be electronic, electromagnetic, optical, or other signals capable of being received by communications interface 1924. These signals are provided to communications interface 1924 via a communications path 1926. In an embodiment, communications path 1924 includes the U interface, as illustrated by FIG. 1, and communications interface includes at least on component of a VTU-O 102 or a VTU-R 152. Communications path 1926 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 1918, removable storage unit 1922, and a hard disk installed in hard disk drive 1912. Computer program medium and computer usable medium can also refer to memories, such as main memory 1908 and secondary memory 1910, which can be memory semiconductors (e.g. DRAMs, etc.). These computer program products are means for providing software to computer system 1900.

Computer programs (also called computer control logic) are stored in main memory 1908 and/or secondary memory 1910. Computer programs may also be received via communications interface 1924. Such computer programs, when executed, enable computer system 1900 to implement the present invention as discussed herein. In particular, the computer programs, when executed, enable processor 1904 to implement the processes of the present invention, such as the steps in the methods described above and illustrated by the flow charts 1500, 1502, 1522, 1544, 1590, 1600, 1650, 1700, 1750, and 1800 as shown in FIGS. 15A-F, 16A, 16B, 17A, 17B, and 18. Accordingly, such computer programs represent controllers of the computer system 1900. Where the invention is implemented using software, the software may be stored in a computer program product and loaded into computer system 1900 using removable storage drive 1914, interface 1920, hard drive 1912 or communications interface 1924.

The invention is also directed to computer program products comprising software stored on any computer useable medium. Computer programs or software in the present context means any expression, in any language, code or notation, of a set of instructions intended to cause a system having an information processing capability to perform a particular function either directly or after either or both of the following: a) conversion to another language, code or notation; b) reproduction in a different material form. Such software, when executed in one or more data processing device, causes a data processing device(s) to operate as described herein. Embodiments of the invention employ any computer useable or readable medium, known now or in the future. Examples of computer useable mediums include, but are not limited to, primary storage devices (e.g., any type of random access memory), secondary storage devices (e.g., hard drives, floppy disks, CD ROMs, ZIP disks, tapes, magnetic storage devices, optical storage devices, MEMS, nanotechnological storage device, etc.), and communication mediums (e.g., wired and wireless communications networks, local area networks, wide area networks, intranets, etc.).

5.0 Conclusion

The above described embodiments may be realized in hardware, software, or most commonly a combination thereof. Additionally, embodiments may be realized in a centralized fashion in at least one communication system, or in a distributed fashion where different elements may be spread across several interconnected communication systems. Any kind of computer system or other apparatus adapted for carrying out the methods described herein may be suited. A typical combination of hardware and software may be a general-purpose computer system with a computer program that, when being loaded and executed, may control the computer system such that it carries out the methods described herein.

Alternatively, the above described embodiments may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner. Likewise, particular bit values of "0" or "1" (and representative voltage values) are used in illustrative examples provided herein to represent data for purposes of illustration only. Data described herein can be represented by either bit value (and by alternative voltage values), and embodiments described herein can be configured to operate on either bit value (and any representative voltage value), as would be understood by persons skilled in the relevant art(s).

What is claimed is:

1. A method for encoding alphanumeric data onto a tangible computer readable medium comprising:
   (a) receiving an alphanumeric character string having a plurality of characters;
   (b) generating a character map having a string of character type symbols, wherein generating the character map includes:
      for each of the plurality of characters in the alphanumeric character string, assigning a character type value to a symbol in the string of character type symbols;
   (c) generating a character map remainder, wherein the character map remainder is a variable-length bit pattern and generating the character map remainder includes:
      (i) identifying one or more runs of character type symbols in sequential positions in the character map having the same character type value, and
      (ii) removing the one or more identified runs of character type symbols from the character map;
   (d) for each identified run, generating a run field, wherein generating the run field includes encoding base data and run length data;
   (e) encoding the characters of each character type into binary encoded substrings, wherein encoding includes:
      (i) assembling characters into separate substrings by character type, and
      (ii) encoding each character type substring into binary;
   (f) generating an encoded data string including one or more run fields, the character map remainder, and the binary encoded substrings; and
   (g) writing the encoded data string to the tangible computer readable medium.

2. The method of claim 1, wherein step (c)(i) further comprises:
   determining the location of each run of the one or more runs in the alphanumeric character string.

3. The method of claim 2, wherein step (c)(i) further comprises:
   if the run begins at a first position of the alphanumeric character string, characterizing the run as a prefix run,
   if the run begins at a position immediately after an end of a prefix run, characterizing the run as a prefix run, if the run ends at a last position of the alphanumeric character string, characterizing the run as a suffix run, and if the run ends at a position immediately prior to a start of a suffix run, characterizing the run as a suffix run.

4. The method of claim 1, wherein step (c)(i) comprises: determining whether the run includes more than a predetermined number of characters.

5. A method for decoding a data structure read from a tangible computer readable medium, the data structure having a binary encoded string having a plurality of encoded substrings and an alphanumeric header having one or more run fields and a character map remainder, comprising:

(a) parsing the one or more run fields in the alphanumeric header to determine a number of characters of each type of a plurality of character types represented in the binary encoded string, wherein each run field includes an encoded base type, a run length, and an indication of a run type;

(b) generating a character map having a string of character type symbols representing the binary encoded string, including:

(i) for each run, adding one or more character type symbols to the character map at a position in the character map determined by the type of the run, wherein the number of character type symbols added is based on the length of the run; and (ii) merging the character map remainder into the character map generated in step (b)(i), the character map remainder being a variable-length bit pattern;

(c) decoding each substring in the binary encoded string to generate a substring of characters; and (d) positioning the decoded characters in a final character string according to the generated character map.

6. The method of claim 5, wherein step (b) further comprises:

if a run has a run type of prefix run,
positioning the character type symbols for the prefix run such that the character type symbols start at the first position of the character map.

7. The method of claim 5, wherein step (b) further comprises:

if a run has a run type of suffix run,
positioning the character type symbols for the suffix run such that a last position for the character type symbols corresponds to a last position of the character map.

8. The method of claim 1, wherein step (c) further comprises, wherein if the run is an infix run, determining the center for a center infix run, comprising:
removing any identified prefix and suffix runs from the character map to generate a reduced character map,
determining the center of the reduced character map, and
centering the center infix run about the center of the reduced character map.

9. The method of claim 8, wherein step (c)(i) further comprises:

determining the location of each run of the one or more runs in the alphanumeric character string.

10. The method of claim 9, wherein step (c)(i) further comprises:

if the run begins at a first position of the alphanumeric character string, characterizing the run as a prefix run, if the run begins at a position immediately after an end of a prefix run, characterizing the run as a prefix run, if the run ends at a last position of the alphanumeric character string, characterizing the run as a suffix run, if the run ends at a position immediately prior to a start of a suffix run, characterizing the run as a suffix run, and if the run occurs in the interior of the alphanumeric character string, characterizing the run as a infix run.

11. The method of claim 8, further comprising:

identifying whether a run exists immediately adjacent to a left most position of the center infix run, and identifying whether a run exists immediately adjacent to a right most position of the center infix run.

12. The method of claim 11, further comprising:

if a run exists immediately adjacent to the left most position of the center infix run, characterizing the run as a left infix run, and if a run exists immediately adjacent to the right most position of the center infix run, characterizing the run as a right infix run.

13. The method of claim 8, wherein step (c)(i) comprises:

determining whether the run includes more than a predetermined number of characters.

14. A method for decoding a data structure read from a tangible computer readable medium, the data structure having a binary encoded string having a plurality of encoded substrings and an alphanumeric header having one or more run fields and a character map remainder, comprising:

(a) parsing the one or more run fields in the alphanumeric header to determine a number of characters of each type of a plurality of character types represented in the binary encoded string, wherein each run field includes an encoded base type, a run length, and an indication of a run type;

(b) generating a character map having a string of character type symbols representing the binary encoded string, including:

(i) for each run, adding one or more character type symbols to the character map at a position in the character map determined by the type of the run, wherein the number of character type symbols added is based on the length of the run;

(ii) if one or more runs has a run type of infix run,
determining a reduced character map length equal to a length of the character map remainder plus a number of bits equal to the total length of the one or more infix runs,
determining a center position of the reduced character map, and
centering the character type symbols for a center infix run about the center of the center of the reduced character map, and (iii) merging the character map remainder into the character map generated in step (b)(i), the character map remainder being a variable-length bit pattern;

(c) decoding each substring in the binary encoded string to generate a substring of characters; and (d) positioning the decoded characters in a final character string according to the generated character map.

15. The method of claim 14, wherein if a run has a run type of left infix run,
    positioning the character type symbols of the left infix run immediately to the left of a left most position of the center infix run.

16. The method of claim 14, wherein if a run has a run type of right infix run,
    positioning the character type symbols of the right infix run immediately to the right of a right most position of the center infix run.

17. The method of claim 14, wherein step (b) further comprises:
    if a run has a run type of prefix run,
        positioning the character type symbols for the prefix run such that the character type symbols start at the first position of the character map.

18. The method of claim 14, wherein step (b) further comprises:
    if a run has a run type of suffix run,
        positioning the character type symbols for the suffix run such that a last position for the character type symbols corresponds to a last position of the character map.

* * * * *

UNITED STATES PATENT AND TRADEMARK OFFICE
CERTIFICATE OF CORRECTION

PATENT NO. : 8,063,800 B2
APPLICATION NO. : 12/740522
DATED : November 22, 2011
INVENTOR(S) : Schuessler It is certified that error appears in the above-identified patent and that said Letters Patent is hereby corrected as shown below:

In Column 22, Line 42, delete "above" and insert -- above. --, therefor.

In Column 27, Line 36, delete "mm}"" and insert -- nnn}" --, therefor.

In Column 31, Line 40, delete ""urmoid." and insert -- "urn:oid. --, therefor.

In Column 31, Line 41, delete ""urmoid." and insert -- "urn:oid. --, therefor.

In Column 35, Line 26, delete "1076" and insert -- 1076. --, therefor.

In Column 41, Line 38, delete "NonDigitBits" and insert -- NonDigitBits. --, therefor.

In Column 52, Line 58, in Claim 14, delete "the center of the center of" and insert -- the center of --, therefor.

Signed and Sealed this
First Day of January, 2013

David J. Kappos
*Director of the United States Patent and Trademark Office*